(12) United States Patent
Hagiwara

(10) Patent No.: US 8,808,970 B2
(45) Date of Patent: Aug. 19, 2014

(54) MANUFACTURING METHOD OF SEMICONDUCTOR DEVICE

(75) Inventor: Takuya Hagiwara, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 70 days.

(21) Appl. No.: 13/591,214

(22) Filed: Aug. 21, 2012

(65) Prior Publication Data

US 2013/0052824 A1 Feb. 28, 2013

(30) Foreign Application Priority Data

Aug. 26, 2011 (JP) ................................. 2011-184550

(51) Int. Cl.
*G03F 7/26* (2006.01)

(52) U.S. Cl.
USPC ............................ 430/311; 430/331; 430/313

(58) Field of Classification Search
CPC ..... G03F 7/2041; G03F 7/11; G03F 7/70341; G03F 7/40; G03F 7/004; G03F 7/38; G03F 7/30; G03F 7/168; H01L 21/0338; H01L 21/0273; H01L 21/32139; H01L 21/3081; H01L 21/0276; H01L 21/31138; H01L 21/31116; H01L 21/02282; H01L 21/0274; H01L 21/67028; H01L 21/67034; H01L 21/6704
USPC .................................................. 430/311, 331
See application file for complete search history.

(56) References Cited

U.S. PATENT DOCUMENTS

| 8,119,313 | B2 | 2/2012 | Kobayashi et al. |
| 8,163,469 | B2 | 4/2012 | Hontake et al. |
| 2004/0063003 | A1* | 4/2004 | Montgomery et al. ............ 430/5 |
| 2006/0154188 | A1* | 7/2006 | Hirayama et al. ............. 430/338 |
| 2008/0241489 | A1* | 10/2008 | Ishibashi et al. .............. 428/199 |
| 2008/0318166 | A1 | 12/2008 | Azuma |
| 2010/0129758 | A1 | 5/2010 | Maemori et al. |

FOREIGN PATENT DOCUMENTS

| JP | 2005-183709 | 7/2005 |
| JP | 2009-4478 | 1/2009 |
| JP | 2010-128056 | 6/2010 |
| JP | 2010-212270 | 9/2010 |
| JP | 2010-219150 | 9/2010 |

* cited by examiner

*Primary Examiner* — Caleen Sullivan
(74) *Attorney, Agent, or Firm* — Miles & Stockbridge P.C.

(57) ABSTRACT

To improve the manufacturing yield of semiconductor devices. Over a semiconductor wafer, a film to be processed is formed; over that film, an antireflection film is formed; and, over the antireflection film, a resist layer is formed. Then, the resist layer is subjected to liquid immersion exposure, and a development and rinsing process to form a resist pattern. After that, the antireflection film and the film to be processed are etched sequentially using the resist pattern as an etching mask. In the development process of the resist layer, the antireflection film is exposed from parts from which the resist layer has been removed by the development process. When performing a rinsing process after the development, the water repellent property of the surface of the antireflection film exposed from the resist layer is not lower than the water repellent property of the surface of the resist layer.

12 Claims, 41 Drawing Sheets

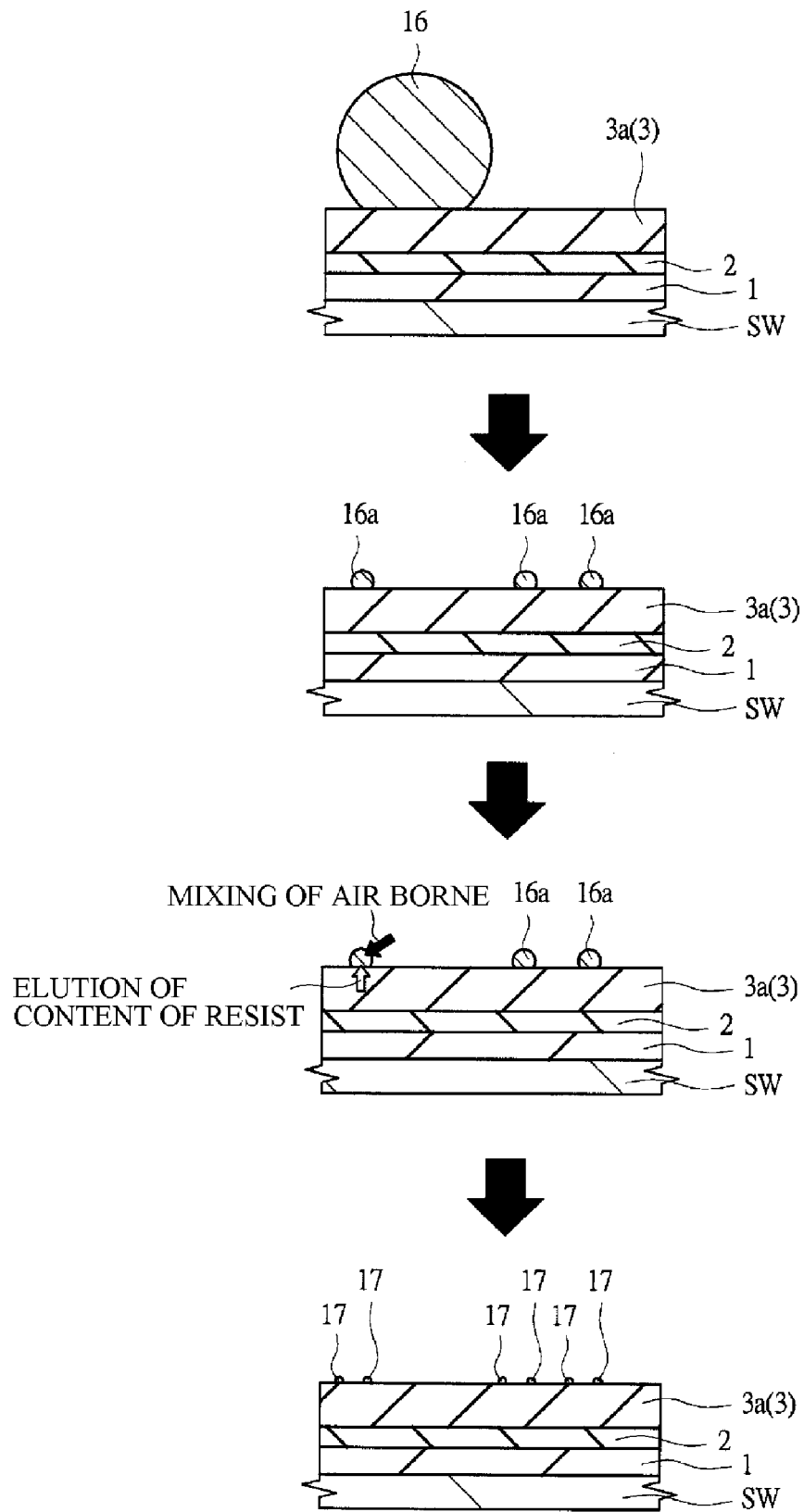

FIG. 13

$CH_2=\underset{\underset{H}{|}}{C}-\underset{\underset{}{\|}}{\overset{O}{C}}-O-CH_2CH_2-R_f$   ⋯(FORMULA 2)

$CH_2=\underset{\underset{F}{|}}{C}-\underset{\underset{}{\|}}{\overset{O}{C}}-O-CH_2CH_2-R_f$   ⋯(FORMULA 3)

$CH_2=\underset{\underset{CH_3}{|}}{C}-\underset{\underset{}{\|}}{\overset{O}{C}}-O-CH_2CH_2-R_f$   ⋯(FORMULA 4)

$CH_2=\underset{\underset{CF_3}{|}}{C}-\underset{\underset{}{\|}}{\overset{O}{C}}-O-CH_2CH_2-R_f$   ⋯(FORMULA 5)

$CH_2=\underset{\underset{CFH_2}{\diagdown}}{C}-\underset{\underset{}{\|}}{\overset{O}{C}}-O-CH_2CH_2-R_f$   ⋯(FORMULA 6)

$CH_2=\underset{\underset{H}{|}}{C}-\underset{\underset{}{\|}}{\overset{O}{C}}-O-R_f$   ⋯(FORMULA 7)

$CH_2=\underset{\underset{H}{|}}{C}-\underset{\underset{}{\|}}{\overset{O}{C}}-O-CH_2-R_f$   ⋯(FORMULA 8)

$CH_2=\underset{\underset{H}{|}}{C}-\underset{\underset{}{\|}}{\overset{O}{C}}-O-(CH_2)_3-R_f$   ⋯(FORMULA 9)

$CH_2=\underset{\underset{H}{|}}{C}-\underset{\underset{}{\|}}{\overset{O}{C}}-O-(CH_2)_4-R_f$   ⋯(FORMULA 10)

$CH_2=\underset{\underset{H}{|}}{C}-\underset{\underset{}{\|}}{\overset{O}{C}}-O-(CH_2)_5-R_f$   ⋯(FORMULA 11)

FIG. 14
     ···(FORMULA 12)
     ···(FORMULA 13)
     ···(FORMULA 14)
     ···(FORMULA 15)
     ···(FORMULA 16)
     ···(FORMULA 17)
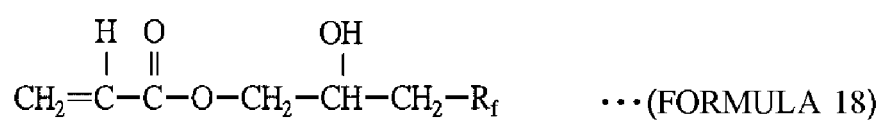     ···(FORMULA 18)
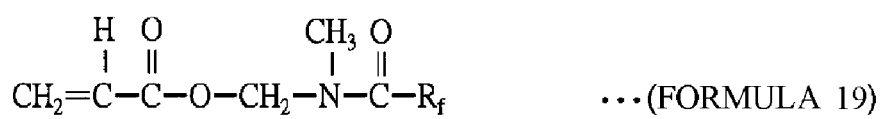     ···(FORMULA 19)
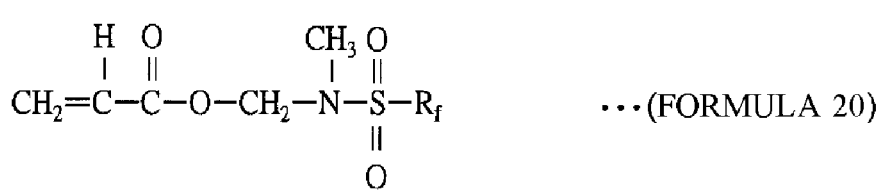     ···(FORMULA 20)

FIG. 16
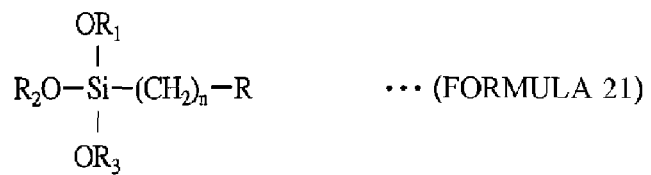
... (FORMULA 21)
... (FORMULA 22)
FIG. 17
| CONTACT ANGLE OF FILM DIRECTLY BELOW RESIST | ArF RESIST A | ArF RESIST B | ArF RESIST C |
|---|---|---|---|
| 46.8° | OK | OK | OK |
| 66.2° | OK | OK | OK |
| 74.0° | OK | OK | OK |
| 78.7° | OK | OK | OK |
| 83.4° | OK | NG | OK |
| 87.0° | NG | NG | NG |

$$CH_2=\underset{\underset{CH_3}{|}}{C}-\underset{\underset{O}{||}}{C}-O-CH_2CH_2-R_f \quad \cdots \text{(FORMULA 23)}$$

FIG. 39

| BEFORE LIQUID IMMERSION EXPOSURE | AFTER DEVELOPMENT PROCESS | CORRESPONDING EXAMPLE |
|---|---|---|
| $\theta_2 \geq \theta_3$ | $\theta_2 \geq \theta_1$ | EXAMPLE 2 |
| $\theta_2 < \theta_3$ | $\theta_2 \geq \theta_1$ | EXAMPLES 1, 3, 4, 5 |

MANUFACTURING METHOD OF SEMICONDUCTOR DEVICE

CROSS-REFERENCE TO RELATED APPLICATION

The disclosure of Japanese Patent Application No. 2011-184550 filed on Aug. 26, 2011 including the specification, drawings and abstract is incorporated herein by reference in its entirety.

BACKGROUND

The present invention relates to a manufacturing method of a semiconductor device, in particular, to a technology that is effective when applied to a manufacturing method of a semiconductor device using liquid immersion exposure.

Liquid immersion exposure is an exposure system, in which a water film (a meniscus) is formed in a minute gap between a lens and a semiconductor wafer using the surface tension of water to make the refractive index between the lens and the surface to be irradiated (the semiconductor wafer) higher. The technology makes it possible to increase an effective lens numerical aperture (NA), as compared with usual dry exposures. The increased lens numerical aperture can resolve a finer pattern, and, therefore, the liquid immersion exposure has been practically applied in industries.

Japanese Patent Laid-Open No. 2009-4478 (Patent Document 1) describes a technology of improving a pattern dimension controllability in a development process by removing a water repellent film over the surface of a resist film.

Japanese Patent Laid-Open No. 2005-183709 (Patent Document 2) describes a technology concerning a development apparatus for developing a substrate having been subjected to liquid immersion exposure, and paragraphs [0005], [0006] and [0021] describe such a technology that a resist is applied, subsequently a water repellent film is formed, liquid immersion exposure is performed, the water repellent film is dissolved and removed, and, after that, the resist is developed.

Japanese Patent Laid-Open No. 2010-212270 (Patent Document 3) describes a technology concerning a manufacturing method of a semiconductor device capable of dealing with the change of a resist film and film thickness without varying the contact angle of the surface of the resist film. Japanese Patent Laid-Open No. 2010-212270, paragraphs [0045] to [0049] describe such a technology that has a process of supplying a prewet thinner to the surface of a semiconductor wafer prior to supplying a liquid resist to the surface of a semiconductor wafer in order to make the surface of the semiconductor wafer more wettable, and that a water repellent additive is added to the prewet thinner.

Japanese Patent Laid-Open No. 2010-219150 (Patent Document 4) describes a technology concerning an application and development apparatus for forming a resist pattern over a substrate continuously a plurality of times, and a technology of subjecting the substrate, at least the side parts thereof to a water repellent treatment.

Japanese Patent Laid-Open No. 2010-128056 (Patent Document 5) describes a technology concerning a resist surface-modifying liquid used as a surface treatment liquid prior to a post exposure bake of a resist film, the resist surface-modifying liquid being capable of lowering a water repellent property of the resist film to suppress the generation of defects.

SUMMARY

Studies of the present inventor revealed the following.

In liquid immersion exposure, a meniscus (a water film) is formed in a minute gap between a lens and a semiconductor wafer. In order to form the meniscus, a surface to be irradiated (a surface to be exposed) of a semiconductor wafer requires a water repellent property. This is because a meniscus can not successfully be formed between the lens and the semiconductor wafer, if a surface to be irradiated (a surface to be exposed) of a semiconductor wafer has a low water repellent property. In order to secure a water repellent property of a surface to be irradiated of a semiconductor wafer, for example, there are a method of applying a topcoat film having a water repellent property over a surface to be irradiated of a semiconductor wafer, and a method of using a topcoat-less resist having a water repellent surface by making a water repellent additive segregate over the surface.

As described above, in liquid immersion exposure, a surface to be irradiated of a semiconductor wafer requires a water repellent property, but, if the resist surface has a high water repellent property in a development process after the liquid immersion exposure, there occurs such a problem as generation of many defects that are referred to as a re-deposition defect or a blob defect (a dry spot). This may lower the manufacturing yield of semiconductor devices.

It has been generally considered as the causes of these defects that the resist surface has a high water repellent property and a low surface free energy becomes dominant rather than a cohesive energy of water, and that, in spin drying in pure water rinse after development, only water is first discharged outside the semiconductor wafer to leave a development hardly-soluble substance contained in the rinse liquid over the semiconductor wafer, or the pure rinse liquid disperses finely in the spin drying and is dried to form blobs. However, as the result of research on the causes of the defect by the present inventor, it was revealed that, in addition to the above-mentioned causes, a great generation factor of defects is that a water repellent property of an antireflection film lying below an upper layer resist is lower than a water repellent property of the upper layer resist.

The present invention has been made in view of the above circumstances and provides a technology capable of improving a manufacturing yield of a semiconductor device.

The other purposes and the new feature of the present invention will become clear from the description of the present specification and the accompanying drawings.

The following explains briefly the outline of a typical invention among the inventions disclosed in the present application.

A manufacturing method of a semiconductor device according to a representative embodiment makes, when developing the resist layer and performing a rinsing process after subjecting a resist layer to liquid immersion exposure, a water repellent property of the surface of a foundation layer of the resist layer, which has been exposed by the development process, not less than the water repellent property of the surface of the resist layer in the rinsing process.

The following explains briefly the effect acquired by the typical invention among the inventions disclosed in the present application.

The representative embodiment can improve the performance of a semiconductor device.

BRIEF DESCRIPTION OF THE DRAWINGS

FIG. 7 is an explanatory drawing of a defect-generating factor;

FIG. 13 is an explanatory drawing showing examples of a monomer for use in the first technique;

FIG. 14 is an explanatory drawing showing examples of a monomer for use in the first technique;

FIG. 16 is an explanatory drawing showing examples of fluorine-based water-repellent agents, silicone-based water-repellent agents and fluorine-silicone-based water-repellent agents;

FIG. 17 is an explanatory drawing showing applied states of three kinds of ArF resists when the contact angle of the material film directly below the resist is changed;

FIG. 39 is a table showing the relation of contact angles in Examples 1 to 5;

DETAILED DESCRIPTION

Figure 1:
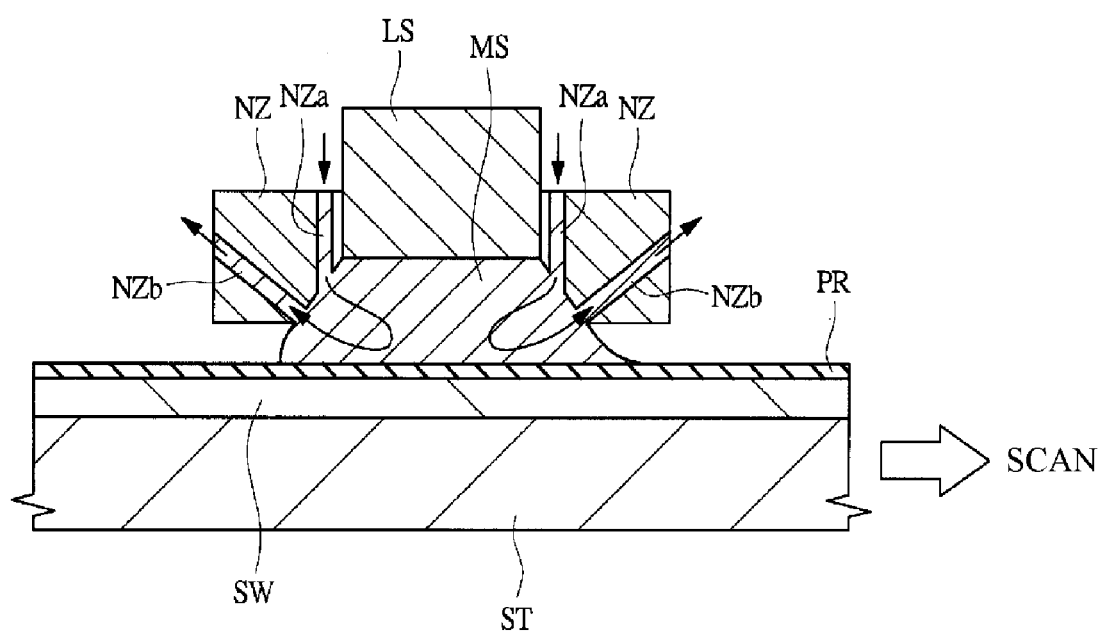
FIG. 1 is an explanatory drawing of liquid immersion exposure.

The following embodiments will be explained, divided into plural sections or embodiments, if necessary for convenience. Except for the case where it shows clearly in particular, they are not mutually unrelated and one has relationships such as a modification, details, and supplementary explanation of some or entire of another. In the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically. Further, in the following embodiments, it is needless to say that an element (including an element step etc.) is not necessarily indispensable, except for the case where it is clearly specified in particular and where it is considered to be clearly indispensable from a theoretical point of view, etc. Similarly, in the following embodiments, when referring to a shape, position relationship, etc. of an element etc., what substantially resembles or is similar to the shape shall be included, except for the case where it is clearly specified in particular and where it is considered to be clearly not right from a theoretical point of view. This statement also applies to the numeric value and range described above.

Hereinafter, embodiments of the present invention will be described in detail on the basis of the drawings. In all the drawings for explaining embodiments, the same symbol is attached to members having the same function, and repeated explanation thereof is omitted. Further, in following embodiments, explanation of the same or similar parts is not repeated as a principle, except for cases of particular necessity.

In a drawing used in an embodiment, in order to make the drawing intelligible, hatching may be omitted even if it is a cross-sectional view. Moreover, in order to make the drawing intelligible, hatching may be attached even if it is a plan view.

First, the situation of studies through which the present inventor reached the invention will be explained.

FIG. 1 is an explanatory drawing of liquid immersion exposure.

For the liquid immersion exposure, for example, a device of a structure as shown in FIG. 1 is used. In the liquid immersion exposure device in FIG. 1, a semiconductor wafer SW is arranged below a lens LS, and the semiconductor wafer SW is arranged and supported over a wafer stage ST. Pure water enters the gap between the lens LS and the surface to be irradiated (the surface to be exposed) of the semiconductor wafer SW from an inflow port NZa of a nozzle NZ, so as to fill the gap, and is discharged from a suction port NZb. The pure water forms a meniscus (a water film) MS in a minute gap between the lens LS and the surface to be irradiated of the semiconductor wafer SW. In order to form the meniscus MS, a water repellent property is required for the surface to be irradiated of the semiconductor wafer SW. For the surface to be irradiated of the semiconductor wafer SW, a resist layer (a resist film, photoresist layer, photosensitive resist layer) PR for fine processing is formed as a single layer resist film or a multiple layer resist film.

In liquid immersion exposure (liquid immersion lithography), immersion water is used to form the film-shaped meniscus MS over the resist layer PR over a main surface of the semiconductor wafer SW, and, while the resist layer PR over the semiconductor wafer SW is irradiated with light having passed through the lens LS through the meniscus MS, the semiconductor wafer SW is scanned to perform scanning exposure. On this occasion, in order to prevent a low molecular compound etc. such as a photo acid generator or a base in the chemically amplified resist from eluting into the immersion water and to make it possible to move the meniscus at a high speed smoothly without leaving a droplet, such a technology is introduced that makes the surface of the resist layer PR be in a hard-to-elute state and have a water repellent property.

Figure 2:
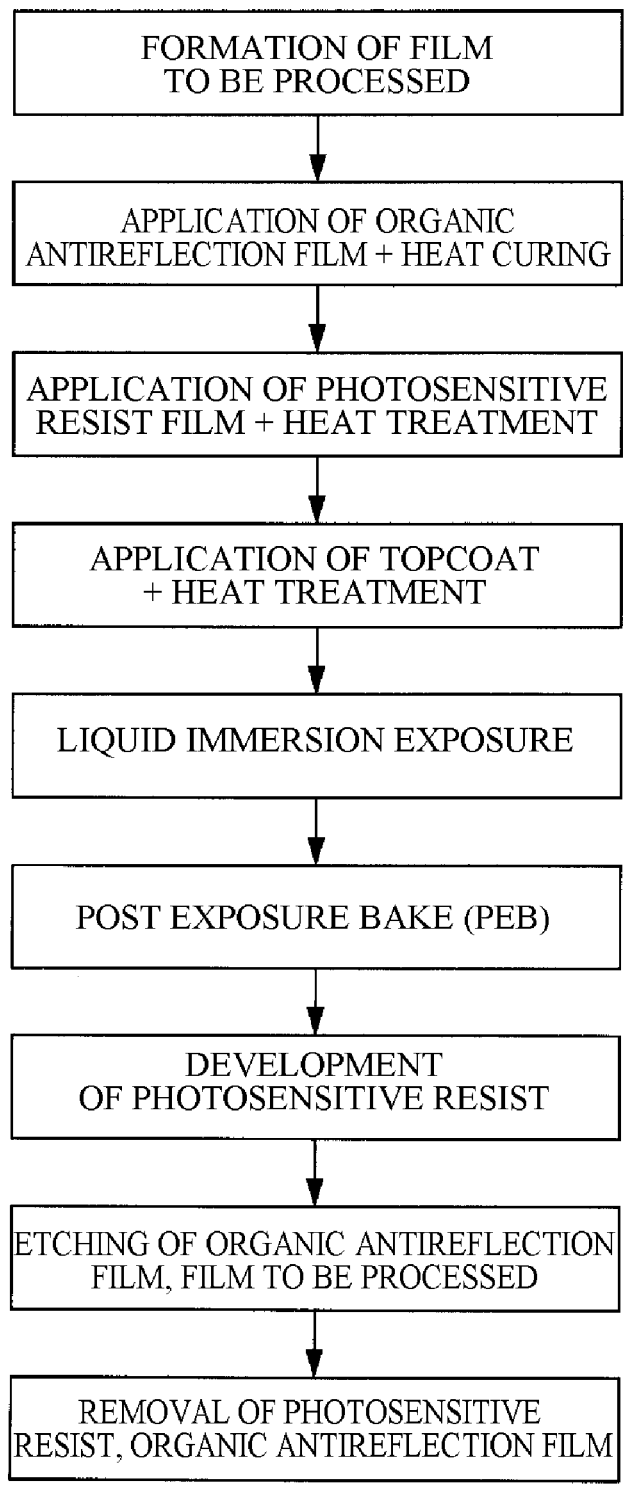
FIG. 2 is a process flow chart of a topcoat process.

One of these technologies is a topcoat process of configuring the resist layer PR by two-layer films formed by two-time application processes to apply a resist upper layer protective film (a topcoat) over a usual resist. In order to make the topcoat be a film that is soluble in an alkaline development solution and automatically exfoliated in the development, and be a film of a high water repellent property, it is frequently configured by a fluorine-containing polymer containing an alkaline soluble part. FIG. 2 shows the process flow of the topcoat process.

In the topcoat process in FIG. 2, a film to be processed is formed over a semiconductor wafer, an organic antireflection film is applied over the film to be processed and is heat-cured, a photosensitive resist film is applied over the organic antireflection film and is heat-cured, and a topcoat is applied over the photosensitive resist film and is heat-cured. Then, liquid immersion exposure is performed, a heat treatment after the exposure is performed, and then a development process of the photosensitive resist film is performed to pattern the photosensitive resist film, thereby forming a resist pattern. Then, while using the photosensitive resist film (the resist pattern) as an etching mask, the organic antireflection film and the film to be processed are etched sequentially, and, after that, the photosensitive resist film (the resist pattern) and the organic antireflection film are removed. The film to be processed is etched using the photosensitive resist film (the resist pattern) as an etching mask, and, thereby, the pattern is transferred and is processed into an intended pattern.

In the topcoat process, however, there are such problems that it is redundant in terms of process because two-time application processes are required, and that the cost of materials are high because two chemical solutions, i.e., the resist and topcoat are used. Further, since a developing soluble group being contained and a high water repellent property are in trade-off relation, there may occur such a case that a sufficient water repellent property can not be given for the purpose of preventing the generation of a hardly-soluble substance in development.

On the other hand, as another technology, such a topcoat-less resist is being developed and marketed that a small amount of a polymer having a low surface free energy (a fluorine-containing polymer) is mixed as a water repellent agent in a resist liquid, and the water repellent agent is made to concentrate only on the surface while using a surface segregation effect of the water repellent agent in forming a coating film to enable the two layers of the resist and the topcoat to be formed spontaneously as a single applied film by a one-time application process. The material can suppress the redundancy of the topcoat process, and the increase in the cost of a device and the cost of materials. Further, when compared with a topcoat formed as an applied film, since the amount of a water repellent agent added to the topcoat-less resist may be smaller, development hardly-soluble substances are hardly generated. Accordingly, there is such an advantage that the use of a more hydrophobic material becomes possible to realize a highly repellent surface.

Figure 3:
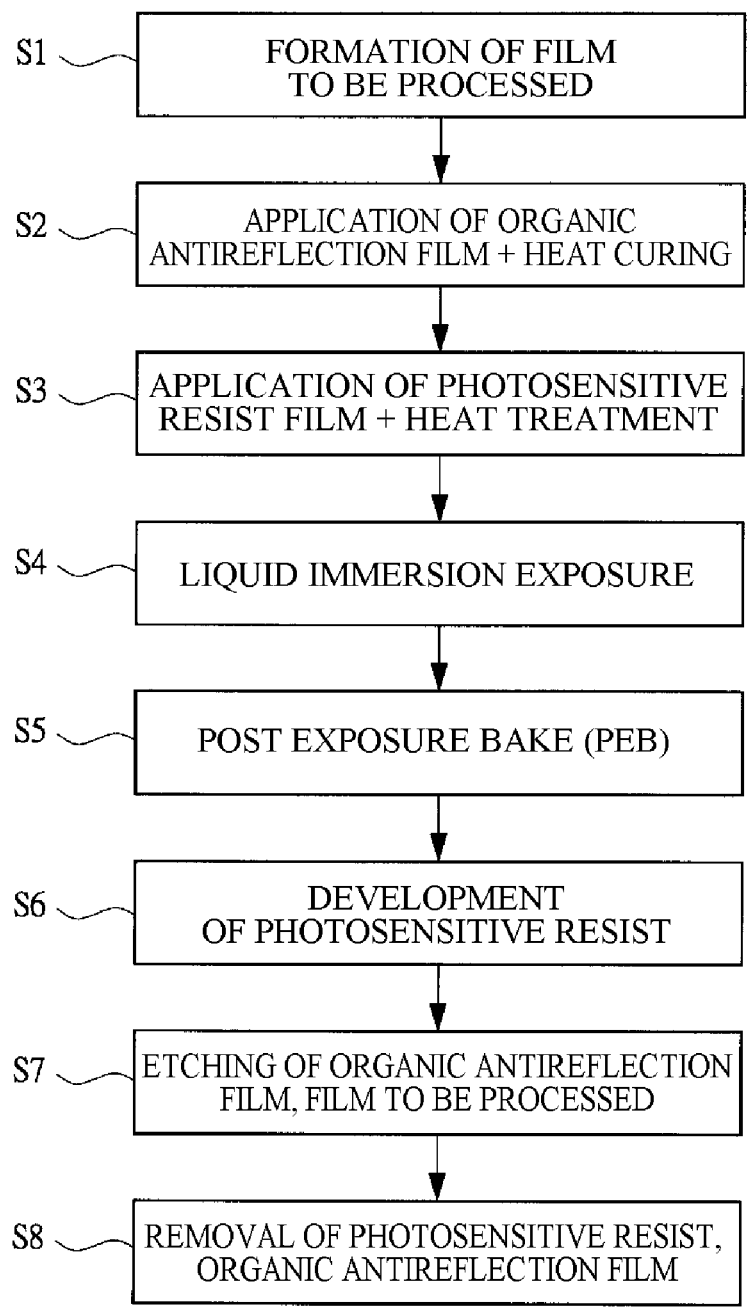
FIG. 3 is a process flow chart showing a process flow of liquid immersion exposure when a topcoat-less resist is used.
Figure 4:
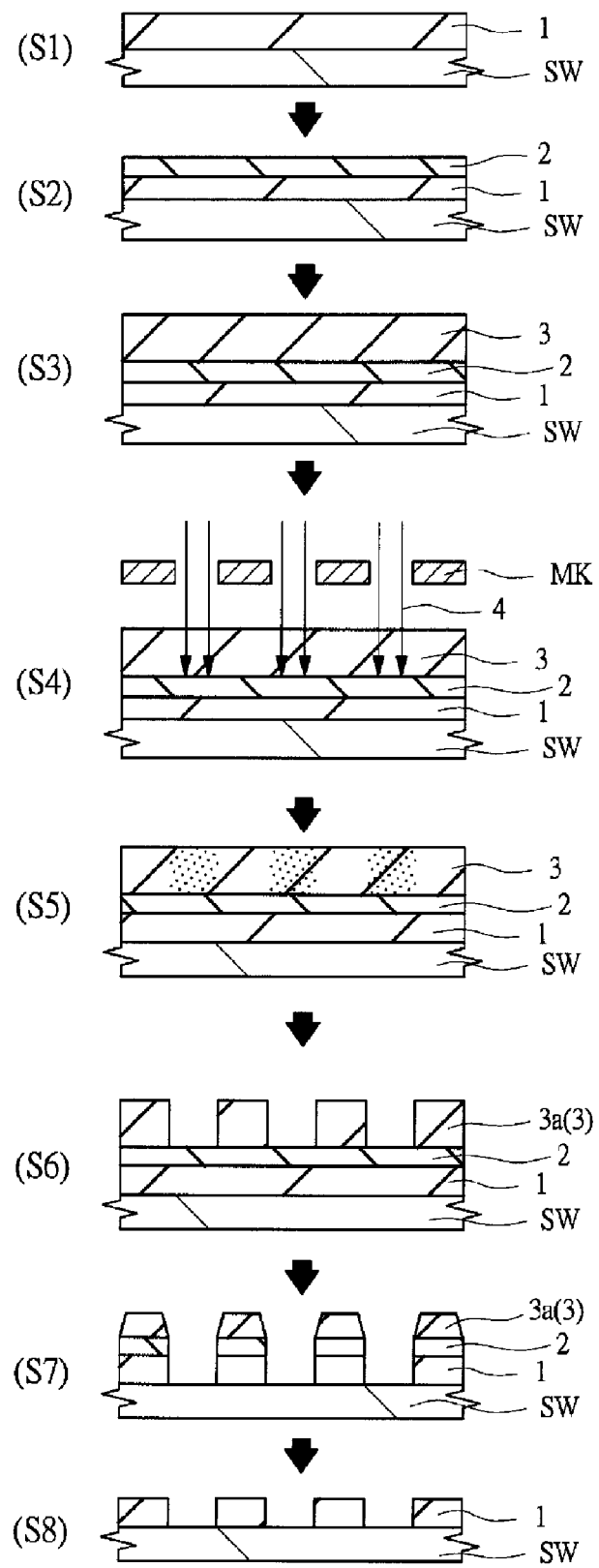
FIG. 4 is a principal part cross-sectional view showing the process flow of liquid immersion exposure when a topcoat-less resist is used.

As described above, by making the surface have a water repellent property, a liquid immersion exposure process becomes possible. Almost all early processes used a topcoat, but, recently, the use of a topcoat-less resist has become mainstream for the purpose of reduction of material cost and simplification of process. FIGS. 3 and 4 show process flows of liquid immersion exposure when a topcoat-less resist is used. FIG. 3 is a process flow chart showing a process flow of liquid immersion exposure when a topcoat-less resist is used, and FIG. 4 is a principal part cross-sectional view showing a process flow of liquid immersion exposure when a topcoat-less resist is used.

First, a film to be processed (a layer to be processed) 1 is formed over a semiconductor wafer (a semiconductor substrate) SW (Step S1 in FIGS. 3 and 4). After that, over the film to be processed 1, an antireflection film 2 is formed (Step S2 in FIGS. 3 and 4). As the antireflection film 2, a BARL (Bottom Antireflective Layer) that uses an inorganic film, or a BARC (Bottom Antireflective Coating) that uses an organic film, is used. In a case where an image is formed using light having a large incidence angle, two layers (a layer of BARL and a layer of BARC) are occasionally used to prevent reflection. For forming a BARC, application and heat curing are performed. Next, over the antireflection film 2, a topcoat-less resist is spin-applied to form a resist layer (a photosensitive resist layer, topcoat-less resist layer) 3 (Step S3 in FIGS. 3 and 4). After the application, heat curing is performed. Next, using a liquid immersion exposure apparatus, the resist layer 3 is subjected to an exposure (liquid immersion exposure) process (Step S4 in FIGS. 3 and 4). In Step S4 in FIG. 4, exposure light 4 that passes through a photomask MK and is irradiated to the resist layer 3 is schematically shown by arrows. Then, after a post exposure bake (PEB) is performed (Step S5 in FIGS. 3 and 4), TMAH: 2.38 mass % is used as a development solution to perform alkaline development (Step S6 in FIGS. 3 and 4), thus completing a resist pattern 3a. Incidentally, after the development process, a rinsing process and a drying process are performed.

The resist pattern 3a is obtained by patterning the resist layer 3 through the exposure and development. Using the resist pattern 3a as an etching mask, the antireflection film 2 and the film to be processed 1 are etched sequentially to transfer the pattern to the film to be processed 1 (Step S7 in FIGS. 3 and 4). That is, to the film to be processed 1, the pattern of the resist pattern 3a is transferred by the etching using the resist pattern 3a as an etching mask, and the film 1 is fabricated into the same pattern as the pattern of the resist pattern 3a. Finally, the resist pattern 3a and the antireflection film 2 are removed (Step S8 in FIGS. 3 and 4) to complete the pattern formation of the film to be processed 1.

Figure 5A:
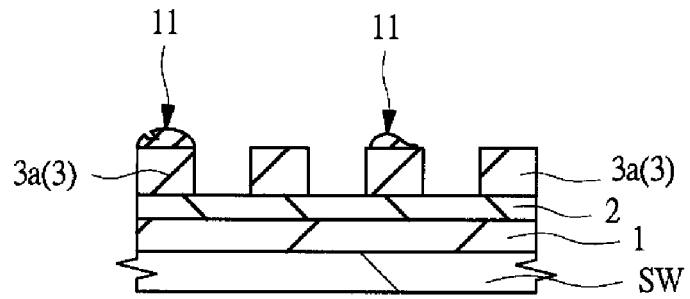
FIGS. 5A to 5C are explanatory drawings of a residue defect, a microbridge defect, and a blob defect (a dry spot), respectively.
Figure 5B:
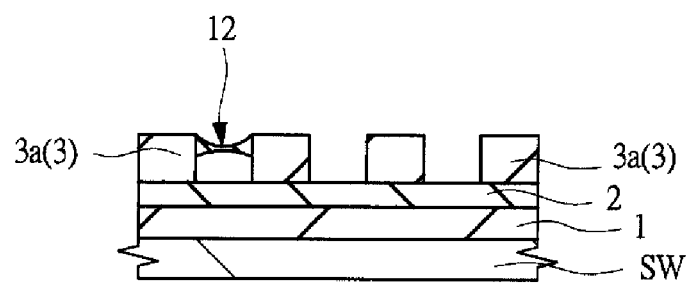
Figure 5C:
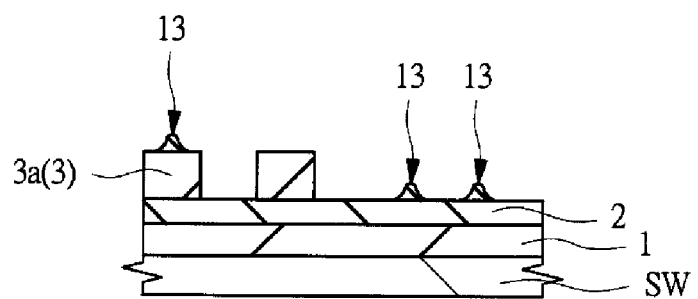

The topcoat-less resist is a material having an enhanced surface water repellent property in order to enable liquid immersion exposure. If the topcoat-less resist is not subjected to a special process, the resist keeps a high surface water repellent property also after the exposure, and the development process thereof is also performed while keeping a high surface water repellent property. However, it is known that such defects as a residue defect, a microbridge defect and a blob defect (a dry spot) are likely to generate when a resist having a high surface water repellent property is developed (see FIGS. 5A to 5C). FIGS. 5A to 5C are explanatory drawings of a residue defect, a microbridge defect, and a blob defect (a dry spot), respectively. FIG. 5A shows a state where a residue (a residual material) 11 occurs (a principal part cross-sectional view thereof), FIG. 5B shows a state where a microbridge defect 12 being a bridge-shaped defect occurs between resist patterns 3a (a principal part cross-sectional view thereof), and FIG. 5C shows a state where a blob defect (a dry spot) 13 occurs (a principal part cross-sectional view thereof). These defects may be linked to a defect in etching using the resist pattern 3a as an etching mask. Accordingly, for a topcoat-less resist, a measure against these defects has been indispensable.

Figure 6:
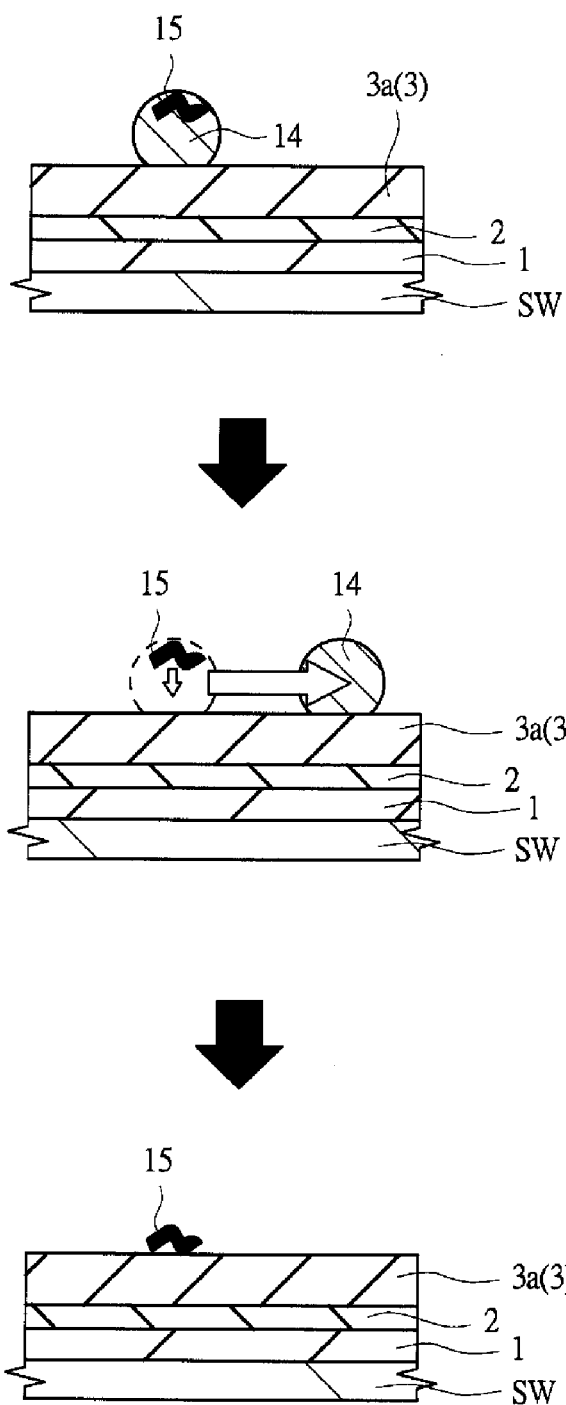
FIG. 6 is an explanatory drawing of a defect-generating factor.

Since the resist surface has a high water repellent property, a low surface free energy becomes dominant rather than a cohesive energy of water, and thus it has been generally considered as the causes of these defects that in spin drying in pure water rinse after development, only water is first discharged outside the semiconductor wafer to leave a development hardly-soluble substance contained in the rinse liquid over the semiconductor wafer (FIG. 6), and that the pure water rinse liquid disperses finely in the spin drying and is dried to form blobs (FIG. 7). Here, FIGS. 6 and 7 are explanatory drawings of defect-generating factors (principal part cross-sectional views for explaining defect-generating factors). FIG. 6 shows how a development hardly-soluble substance 15 contained in a droplet 14 in a rinsing process after development is left over the semiconductor wafer SW (that is, over the resist pattern 3a). FIG. 7 shows how a droplet 16 in a rinsing process after development is finely dispersed to form minute droplets 16a, into which (droplets 16a) an impurity from air or an eluted substance from a resist (the resist layer 3) is mixed, and it (the droplet 16a) is dried to form dry spots 17.

The present inventor found, however, as the result of detailed investigations of causes of defect generation, that, in addition to the above defect-generating factor, a water repellent property of an antireflection film lying below a resist layer (an upper layer resist) being lower than a water repellent property of the resist layer (the upper layer resist) induces the defect. In particular, when a topcoat-less resist is used, the water repellent property of the resist surface becomes high, and, therefore, the water repellent property of the film directly below the resist layer (the upper layer resist) becomes necessarily lower than the water repellent property of the surface of the resist layer (the upper layer resist). When a positive resist is subjected to an exposure process and, further, to a development process, light-exposed parts dissolve in a development solution to form a space (a space between resist patterns), thereby exposing a film directly below the resist. Water is likely to be stable in places having high hydrophilicity (large surface tension), and is likely to move from a place having a high water repellent property to a place having high hydrophilicity (a low water repellent property). Needless to say, water becomes more stable physically at a trench or a hole having an increased contact area. As described above, when the water repellent property of a film directly below the resist is lower than that of the resist surface, a rinse liquid (pure water) in the rinsing process after the development lies stable at a space part (the light-exposed part, the space part between resist patterns) and becomes hard to move.

Figure 8A:
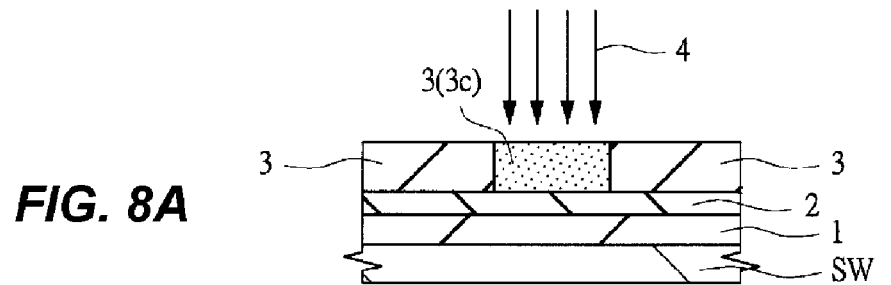
FIGS. 8A to 8E are explanatory drawings of a defect-generating factor found by the present inventor.

The phenomenon of the defect generation will be explained in more detail with reference to FIGS. 8 and 9. FIGS. 8 and 9 are explanatory drawings of defect-generating factors found by the present inventor (principal part cross-sectional views for explaining defect-generating factors). As shown in FIG. 8A, over the semiconductor wafer SW, the film to be processed 1, the antireflection film 2 and the resist layer (the photosensitive resist layer, topcoat-less resist layer) 3 are formed from bottom in order, and, after that, the resist layer 3 is subjected to liquid immersion exposure. In FIG. 8A, the exposure light 4 to be irradiated is shown schematically by arrows. Further, in FIG. 8A, a light-exposed region (an exposed region) in the resist layer 3 is shown with a symbol 3c attached.

Figure 8B:
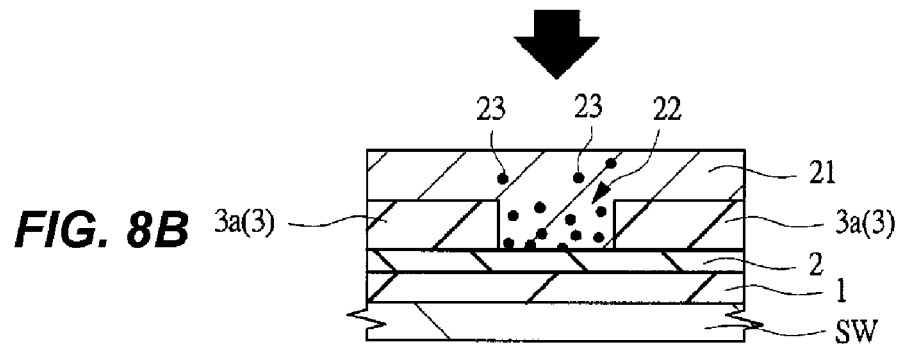

Next, as shown in FIG. 8B, a development process by a development solution 21 is performed. Here, as a resist material for the resist layer 3, a topcoat-less positive resist is used, and the surface of the resist layer 3 after the development shall have a water repellent property higher than that of the film directly below the resist layer 3 (here, the antireflection film 2).

The light-exposed region of the positive resist (the resist layer 3) (corresponding to the light-exposed region 3c) is changed in polarity to show solubility in the development solution 21. In a space part 22 formed by the dissolution of the resist (the light-exposed region 3c) by the development process, a large amount of resist dissolved materials 23 lies in the development solution 21. Incidentally, in the resist layer 3, the light-exposed region 3c is dissolved and removed by the development process to form the resist pattern 3a. The part from which the resist layer 3 is dissolved and removed is the space part 22 between the resist patterns 3a.

Figure 8C:
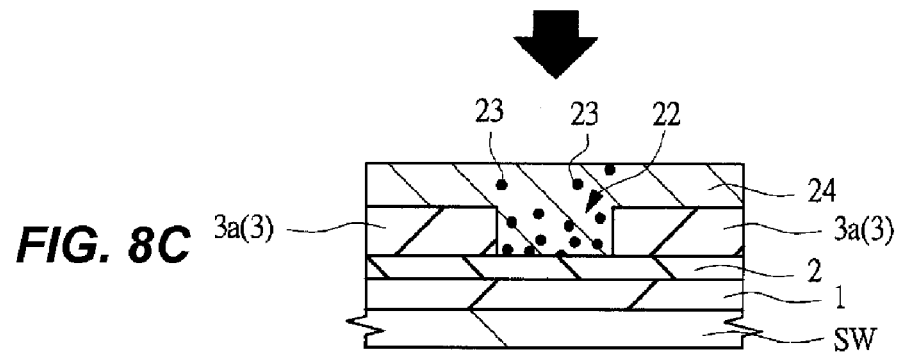

Next, as shown in FIG. 8C, a pure water rinsing process after the development is performed. Since the resist dissolved material 23 dissolves in the development solution 21 but does not dissolve in water, the resist dissolved material 23 deposits in the step where the development solution 21 is replaced by the rinse liquid (pure water) 24. The water (the rinse liquid 24) lies stable in the space part 22 having higher hydrophilicity.

Figure 8D:
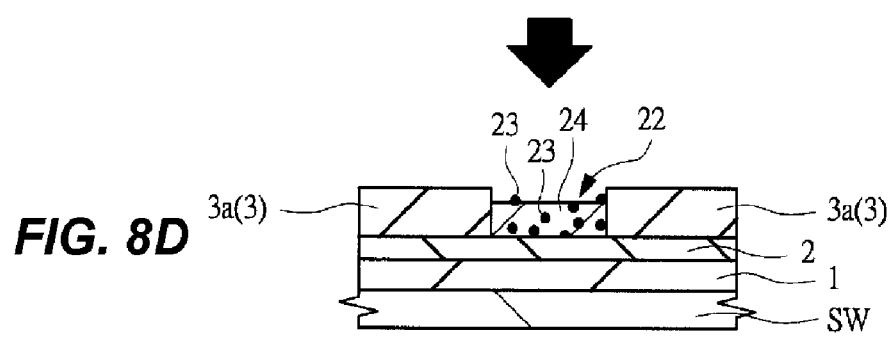
Figure 8E:
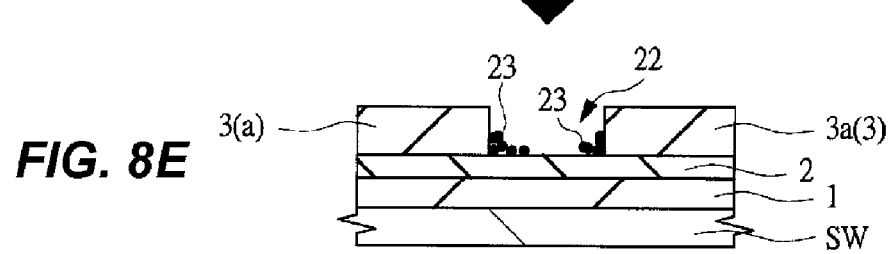

After the rinsing process, spin drying (a process of spinning and drying the semiconductor wafer SW) is performed. As shown in FIG. 8D, the water (the rinse liquid 24) lying stable in the space part 22 is not discharged outside the semiconductor wafer SW but is directly dried over the semiconductor wafer SW. As a result, as shown in FIG. 8E, the resist dissolved material 23 having deposited remains as a residue in the space part 22 to induce a defect.

Figure 9A:
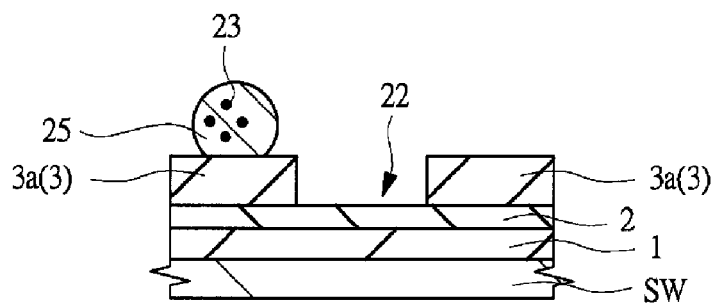
FIGS. 9A to 9D are explanatory drawings of a defect-generating factor found by the present inventor.
Figure 9B:
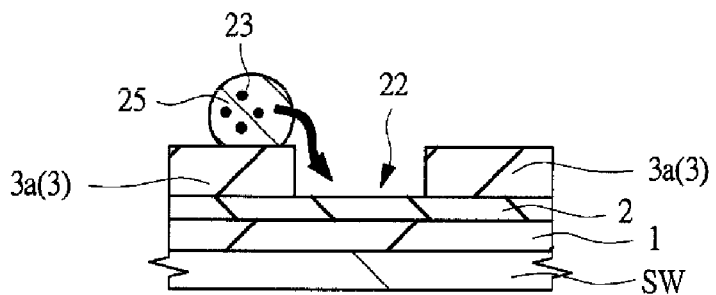
Figure 9C:
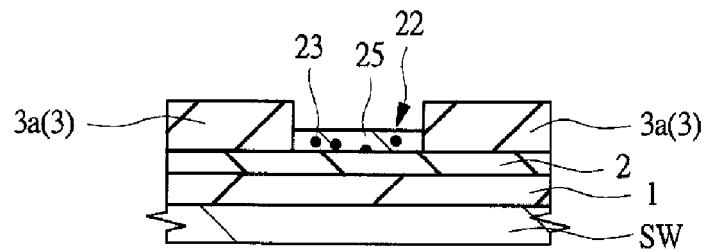
Figure 9D:
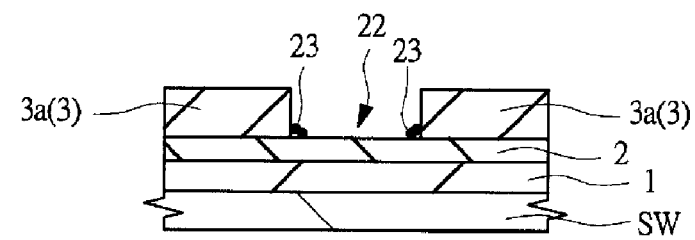

As shown in FIG. 9A, in a case where a droplet 25 of the rinse liquid lies over the surface of the resist layer 3 in the rinsing process after the development and a deposited material of the resist dissolved material 23 or a development hardly-soluble substance lies in the droplet 25, the droplet 25 becomes hard to move. Such droplet 25 is not instantly spun off outside the semiconductor wafer SW in the spin drying after the rinsing process, but moves over the surface of the semiconductor wafer SW toward the periphery of the semiconductor wafer SW. Since water moves easily from a position of a high water repellent property to a position of high hydrophilicity (a low water repellent property), as shown in FIG. 9B, in a case where the space part 22 having higher hydrophilicity lies when the droplet moves over the surface of the semiconductor wafer SW in the direction of the periphery of the semiconductor wafer SW, as shown in FIG. 9C, the droplet 25 enters the space part 22 and is trapped. When the droplet 25 is directly dried, as shown in FIG. 9D, a deposit of the resist dissolved material 23 or a development hardly-soluble substance contained in the droplet 25 remains in the space part 22 to induce a defect. The defect caused by the development as described based on FIGS. 8 and 9 may be linked to a defect in etching using the resist pattern 3a as an etching mask.

Miniaturization of a pattern leads to lower optical contrast of an image formed by an exposure machine (an exposure apparatus). As a result, the deposition of a development hardly-soluble substance and a resist dissolved material has been more likely to occur. Since the line width of a resist pattern to be formed has become thinner, defects that occur due to the influence of these directly affect the manufacturing yield to lead to the lowering of manufacturing yield. In order to improve the manufacturing yield, a measure against these defects is required.

Figure 10:
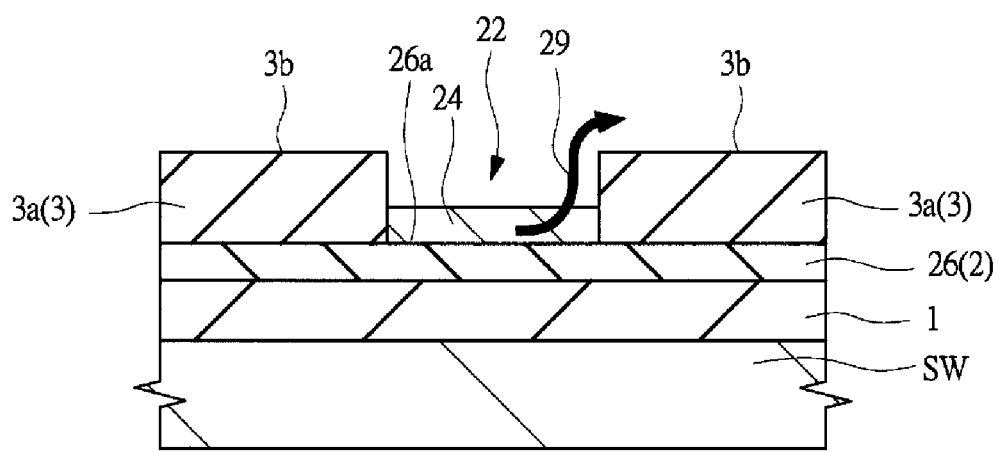
FIG. 10 is an explanatory drawing of a state where a rinse liquid is not likely to lie stable in a space part of a resist pattern.

When the generation of deposition of a development hardly-soluble substance or the resist dissolved material 23 is unavoidable, in order not to allow these to form defects, it is sufficient to discharge these (the deposit of a development hardly-soluble substance or the resist dissolved material 23) outside the semiconductor wafer SW with the rinse liquid 24 in the rinsing process after the development. In order to make the rinse liquid 24 be easily discharged outside the semiconductor wafer SW, it is important not to allow the rinse liquid 24 to lie stable in the space part 22 of the resist pattern 3a. This will be explained with reference to FIG. 10. FIG. 10 is an explanatory drawing (a principal part cross-sectional view) of a state where the rinse liquid 24 hardly lies stable in the space part 22 of the resist pattern 3a.

FIG. 10 shows such a state that the rinse liquid 24 remains in the space part 22 of the resist pattern 3a as FIGS. 8D and 9C. When the rinse liquid 24 lies stable in this state in the space part (the space) 22 and is directly dried, defects as shown in FIGS. 8E and 9D are generated. Therefore, it is important that, even if the rinse liquid 24 enters the space part 22 of the resist pattern 3a, the rinse liquid 24 does not lie stable in the space part 22 but moves easily outside the space part 22.

In order not to allow the rinse liquid 24 to lie stable in the space part 22 of the resist pattern 3a, it is effective to set the water repellent property of a material film 26 (here, the antireflection film 2 corresponds to the material film 26) lying directly below the resist layer 3 (an upper layer resist film) to be equal to the water repellent property of the surface of the resist layer 3 or higher than the water repellent property of the surface of the resist layer 3 in the rinsing process after the development. The level of a water repellent property is represented by the contact angle of a water droplet (a droplet) with the surface of a solid, and the higher the water repellent property the greater the contact angle. Representation of the above-mentioned relation by the contact angle gives Expression 1 below.

$$\theta_2 \geq \theta_1 \quad \text{(Expression 1)}$$

where $\theta_1$ represents the contact angle of the rinse liquid 24 with a surface 3b of the resist layer 3 (the upper layer resist), and $\theta_2$ represents the contact angle of the rinse liquid 24 with a surface 26a of the material film 26 lying directly below the resist layer 3. The surface 3b corresponds to the surface (the surface of the uppermost layer) of the resist layer 3 (the resist pattern 3a) in the rinsing process after the development. The surface 26a corresponds to the surface (an exposed surface) of the material film 26 exposed from the space part 22 of the resist pattern 3a in the rinsing process after the development. $\theta_1$ may also be called the contact angle with the surface 3b of the resist layer 3, and $\theta_2$ may also be called the contact angle with the surface 26a of the material film 26. Expression 1 may also be represented as $\theta_2 - \theta_1 \geq 0$.

Figure 11:
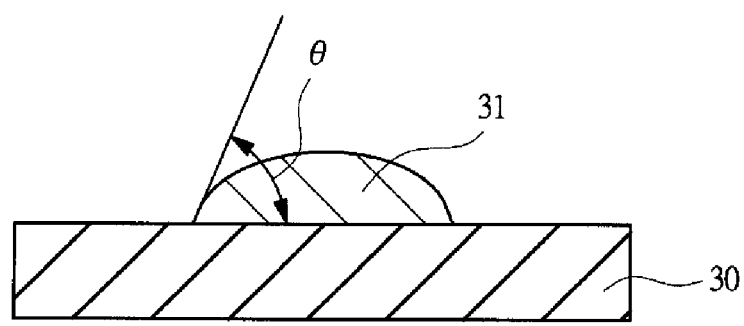
FIG. 11 is an explanatory drawing of a contact angle.

FIG. 11 is an explanatory drawing of the contact angle, showing a state where a droplet (a water droplet) 31 is arranged (disposed at rest) on a base layer 30. The contact angle means an angle formed, at a place where the surface of a liquid at rest (the droplet 31) contacts with a solid (the base layer 30), between the liquid surface (the surface of the droplet 31) and the solid surface (the surface of the base layer 30), and an angle θ shown in FIG. 11 is the contact angle. When the base layer 30 is the resist layer 3 (the resist pattern 3a) and the droplet 31 is the rinse liquid 24, the contact angle θ is above θ₁. When the base layer 30 is the material film 26 and the droplet 31 is the rinse liquid 24, the contact angle θ is above θ₂.

When Expression 1 is satisfied, even if the rinse liquid 24 lies in the space part 22 of the resist pattern 3a as shown in FIG. 10, the rinse liquid 24 is not stable (not supported) in the space part 22 and is likely to move outside the space part 22. For example, the rinse liquid 24 moves from the inside of the space part 22 toward the outside of the space part 22 in the direction shown by arrows to which a symbol 29 is attached in FIG. 10. Further, even when the space part 22 lies on the way when the droplet 25 moves over the surface of the semiconductor wafer SW toward the periphery of the semiconductor wafer SW, as shown in FIG. 9B, the droplet 25 is hardly trapped by the space part 22. Consequently, it is possible to suppress or prevent the generation of defects caused by the drying of the rinse liquid 24 in the space part 22 of the resist pattern 3a (such defects that are shown in FIGS. 8E and 9D). Accordingly, the manufacturing yield of the semiconductor device can be improved.

By previously selecting the resist layer 3 and the material film 26 directly below the resist layer 3 that have surface states satisfying the relation of Expression 1 in the rinsing process after the development, it is possible to reduce such defects caused by the development as described in FIGS. 8 and 9. However, materials satisfying the relation of Expression 1 limit alternatives of materials. As means for broadening alternatives of materials, two methods are considered, that is, a method of controlling the water repellent property of the surface of the resist layer 3 (the upper layer resist), and a method of controlling the water repellent property of the surface of the material film 26 directly below the resist layer 3. However, the resist layer 3 is required to have a lithographic performance sufficient for forming a low-defective and fine pattern, and a surface water repellent property for enabling the liquid immersion exposure. Therefore, when trying to give an additional performance to the resist layer 3, the aforementioned two performances may deteriorate. Consequently, in order to satisfy the Expression 1 without changing the resist layer 3, a more preferable measure is to enhance a water repellent property of the surface of the material film 26 directly below the resist layer 3.

Figure 12A:
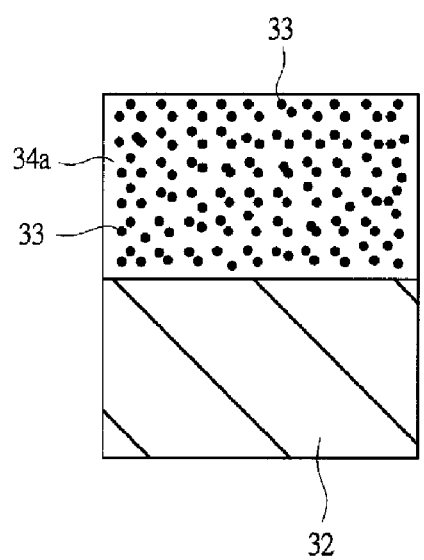
FIGS. 12A and 12B are explanatory drawings of a first technique of controlling a water repellent property of a material film directly below a resist layer.
Figure 12B:
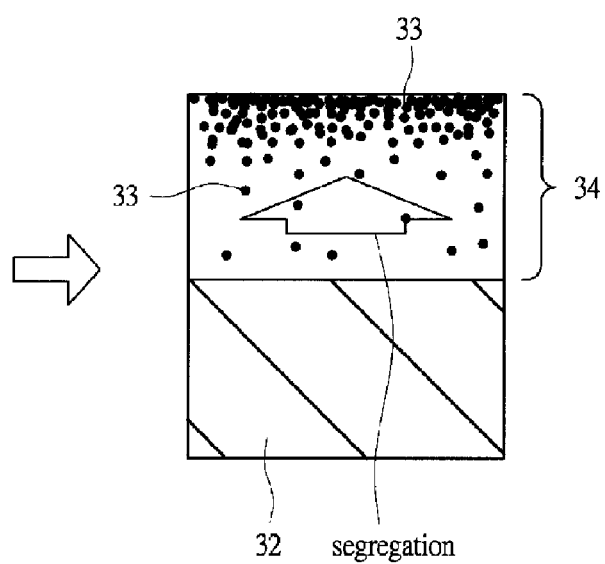
Figure 15:
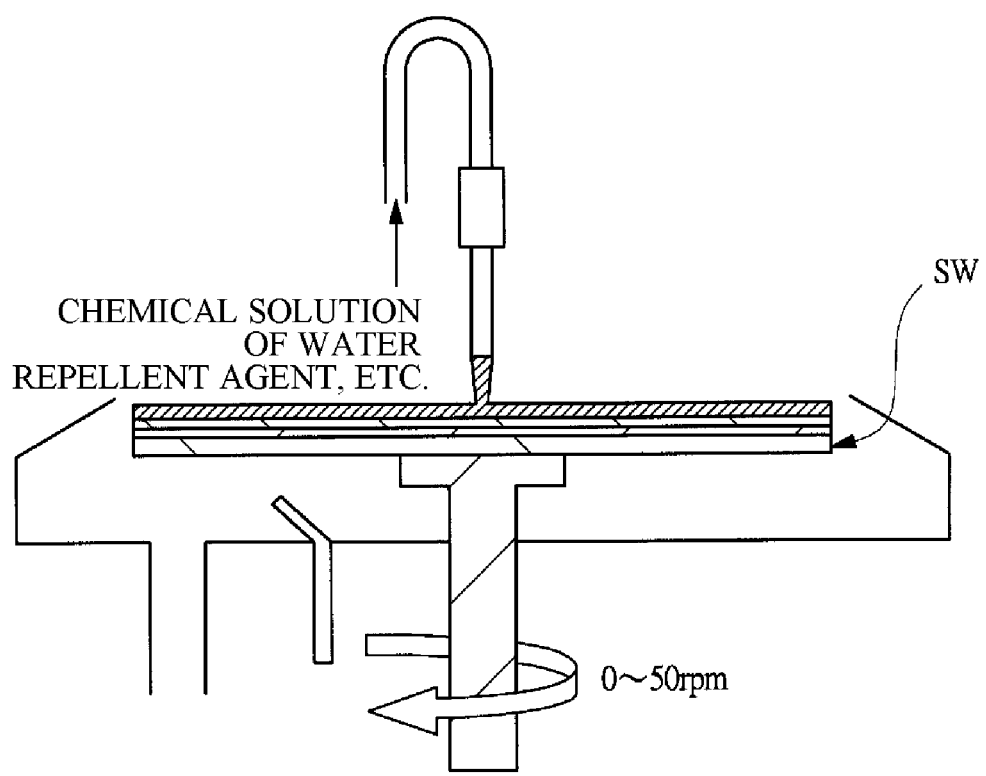
FIG. 15 is an explanatory drawing of a second technique of controlling a water repellent property of a material film directly below a resist layer.

There are shown below two techniques (a first technique and a second technique) of controlling the water repellent property of the material film 26 directly below the resist layer 3. FIGS. 12A and 12B are explanatory drawings of the first technique of controlling the water repellent property of the material film 26 directly below the resist layer 3. FIGS. 13 and 14 are explanatory drawings showing examples of monomers for use in the first technique. FIG. 15 is an explanatory drawing of the second technique of controlling the water repellent property of the material film 26 directly below the resist layer 3.

First, the first technique of controlling the water repellent property of the material film 26 directly below the resist layer 3 is explained using FIGS. 12 to 14.

In the first technique, as the material film 26 directly below the resist layer 3, an organic film containing carbon (C) as a main component, or an organic film containing carbon (C) and silicon (Si) as main components is used. In order to improve the water repellent property of the surface of the organic film, a fluororesin is mixed to an application chemical solution for organic film (the chemical solution for forming the organic film by application). The fluororesin (corresponding to a fluorine compound 33 shown in FIGS. 12A and 12B) mixed in the chemical solution for an organic film (corresponding to a material 34a for organic film shown in FIG. 12A) segregates over the surface of the organic film (corresponding to an organic film 34 as BARC shown in FIG. 12B) as shown in FIG. 12B, in application by a spin coat method (in forming the organic film by applying the chemical solution for organic film) over the base layer 32 by such a driving force which belongs to the fluororesin and tries to minimize the surface energy. Incidentally, the base layer 32 is a film to be the foundation of the organic film 34, and is formed over the main surface of a semiconductor wafer. As shown in FIG. 12B, the segregation of the fluororesin (a fluorine compound 33) having a high water repellent property over the surface of the organic film 34 can improve the water repellent property of the surface of the organic film 34. As described above, the use of the organic film 34 with the fluororesin (the fluorine compound 33) having a high water repellent property segregated over the surface thereof as the material film 26 can enhance the water repellent property of the material film 26.

As the fluororesin (the fluorine compound 33), the use of a material having the structure below is effective.

The fluororesin (the fluorine compound 33) to be mixed to the organic film (34) is formed by polymerizing a monomer derived from a monomer represented by a chemical formula below:

$$CH_2=C(X)COOYR_f \quad \text{(Formula 1)}$$

where X in Formula 1 is a hydrogen (H) atom, a fluorine (F) atom, a C1-20 linear or branched alkyl group, a C1-20 linear or branched fluoroalkyl group, or a $CFX_1X_2$ group ($X_1$ and $X_2$ represent a hydrogen atom or a fluorine atom). Y in Formula 1 represents a direct bond, or a C1-10 bivalent organic group not containing a fluorine atom. $R_f$ in the Formula 1 is a C4-6 linear or branched fluoroalkyl group. FIGS. 13 and 14 show examples of monomers (Formulae 2 to 20) formed from the monomer represented by Formula 1, but monomers are not limited to these.

One kind or several kinds of monomers shown in FIGS. 13 and 14 (monomers in Formulae 2 to 20) are polymerized to prepare the fluororesin (the fluorine compound 33). The fluororesin has a molecular weight of preferably 300 to 200000, more preferably 500 to 100000. By mixing the fluororesin in a chemical solution for forming the material film 26 (a chemical solution for an organic film) and applying the chemical solution (the chemical solution for an organic film in which the fluororesin has been mixed) over the semiconductor wafer (the semiconductor substrate) SW by a spin coat method, the material film 26 can be formed. Upon the application, the fluororesin segregates over the surface of the applied film (the material film 26) to improve the water repellent property of the surface thereof. A high surface water repellent property must be maintained until the rinsing process after the development, and, therefore, as the fluororesin, preferably one insoluble in a development solution (a development solution used for the development process after the liquid immersion exposure) is selected.

The first technique is applied to Examples 2, 3 and 5 to be described later.

Next, the second technique of controlling the water repellent property of the material film 26 directly below the resist layer 3 will be explained using FIG. 15.

In the second technique, the material of the material film 26 directly below the resist layer 3 is not limited, but may be an applied film, a CVD film, an organic film, or an inorganic film. After film-forming (forming) the material film 26, the material film 26 is subjected to a water repellent treatment with a chemical solution of a water repellent agent containing at least a water repellent agent and a solvent. The water repellent treatment can be performed, for example, using a device as shown in FIG. 15, by paddling a treatment chemical solution including a chemical solution of a water repellent agent containing at least one water repellent agent to form a liquid film over the semiconductor wafer SW (that is, over the material film 26). As the water repellent agent, a fluorine-based water repellent agent, a silicone-based water repellent agent, a fluorine-silicone-based water repellent agent, a silane coupling agent, a silylating agent, an alkylating agent or an acylating agent can be used. These may be used in one kind or in two or more kinds in combination. In every case, water repellent agents are each diluted and used in 0.5 mass % to 5.0 mass % in a solvent suitable for it. Further, addition of at least any of water, an acid and an alkali to the chemical solution of a water repellent agent can sufficiently give a water repellent property to the liquid. The water repellent agent used for the water repellent treatment is preferably selected on the basis of reactivity with the substrate (the material film 26) at ordinary temperature. In a case of a water repellent agent having a poor reactivity, it is also possible to make the chemical solution of a water repellent agent contact with the surface, and to provide a heat treatment at a temperature of 60° C. to 120° C. for about 1 minute, preferably at about 110° C. to about 150° C. with a hot plate etc.

FIG. 16 (Formulae 21 and 22) shows examples of the fluorine-based water repellent agents, the silicone-based water repellent agents, and the fluorine-silicone-based water repellent agents. In Formula 21 shown in FIG. 16, $R_1$, $R_2$ and $R_3$ each are $CH_3$, $C_2H_5$ or $C_3H_7$, n is an integer of 0 to 5, R is $C_mF_{2m+1}$ or $C_mH_{2m+1}$, where m is an integer of 1 to 10. In Formula 22 shown in FIG. 16, $R_1$, $R_2$ and $R_3$ each are $(CH_2)_n$—$C_mF_{2m+1}$, where n is an integer of 0 to 5, $R_0$ is H, $C_kH_{2k+1}$, $Si(OCH_3)_3$, $Si(OC_2H_5)_3$, $Si(OC_3H_7)_3$, or the same structure as the structure on the right side of NH bond in Formula 22 in FIG. 16 ($SiR_1R_2R_3$), where m is an integer of 1 to 10, and k is an integer of 1 to 3.

When a silylating agent is used as a water repellent agent, for example, BSA (N,O-bis(trimethylsilyl)acetamide), BSTFA (N,O-bis(trimethylsilyl)trifluoroacetamide), HMDS (hexamethyldisilazane), MSTFA (N-meyhyl-N-trimethylsilyl-trifluoroacetamide), TMCS (trimethylchlorosilane), TMSI (N-trimethylsilylimidazole), DMSDMA (dimethylsilyldimethylamine), or the like can be used.

The second technique is applied to Example 4 to be described later.

When the condition of water repellent properties satisfies Expression 1 by using such a control method of the water repellent property as the first technique or the second technique, defects caused by the development as explained based on FIGS. 8 and 9 can be reduced.

But, if a water repellent property of the material film 26 directly below the resist layer 3 becomes too high, when a resist is to be applied over the material film 26, the resist is repelled and can not be applied uniformly. FIG. 17 shows applied states of three kinds of ArF resists when the contact angle of the material film 26 directly below the resist 3 is changed. The contact angle shown in FIG. 17 corresponds to the contact angle of pure water with the surface of the material film 26. In a table (an explanatory drawing) in FIG. 17, cases where application properties are good are shown as "OK," and cases where application properties are poor are shown as "NG." As can be known from FIG. 17, in order not to deteriorate application properties of the resist (the resist layer 3), the contact angle of the material film 26 directly below the resist layer 3 (the contact angle of pure water with the surface of the material film 26) is preferably set to be 800 or less, and more preferably set to be 78° or less. That is, by setting the contact angle of the material film 26 (the contact angle of pure water with the surface of the material film 26) being the foundation to be preferably 800 or less, more preferably 780 or less when applying the resist (the resist layer 3), application properties of the resist can be enhanced to form the resist layer 3 more adequately.

In order to satisfy Expression 1, the contact angle $\theta_1$ of the surface 3b of the resist layer 3 must be set to be equal to or lower than the contact angle $\theta_2$ of the material film 26 directly below the resist layer 3. However, when liquid immersion exposure is performed, the contact angle $\theta_1$ of the surface 3b of the resist layer 3 is preferably large to some degree, and there is such a case that the surface of the resist layer 3 requires a contact angle of 800 or more (that is, $\theta_1 \geq 800$ is required upon liquid immersion exposure). In that case, it is sufficient to use a development-soluble type topcoat (corresponding to Example 1 to be described later), or to use a topcoat-less resist using a development-soluble type water repellent additive or a polarity change type water repellent additive (corresponding to Examples 3 to 5 to be described later).

When a development-soluble type topcoat is used, it is sufficient to use a highly water repellent material as the topcoat, and a material having a surface water repellent property lower than that of a film directly below the resist as the resist. Consequently, it is possible to make the resist surface be highly water repellent in exposure by the topcoat, and, after the development, to lower a water repellent property of the resist surface because the topcoat dissolves in the development solution, thereby satisfying above Expression 1.

When a topcoat-less resist is used, for example, by using a development-soluble type water repellent additive, it is possible to make the surface be highly water repellent in exposure, and to allow the water repellent additive segregated over the surface to be dissolved in a development solution in development, thereby lowering a water repellent property of the resist surface in a rinsing process after the development. Further, by the use of a water repellent additive that changes the polarity thereof from a water repellent property to a hydrophilic property, for example, by the reaction with an alkaline development solution, since the surface is highly water repellent in exposure and, in development, the water repellent additive segregated over the surface changes to be hydrophilic, a water repellent property of the resist surface can be lowered. When Expression 1 is satisfied in the rinsing process (the rinsing process after the development) that is performed in a state where a water repellent property of the resist surface is lowered, the generation of defects can be suppressed.

Hereinafter, Examples of the present invention will be shown, while taking a formation method of a trench type element isolation structure (STI) of a CMOS-SOC (Complementary Metal Oxide Semiconductor-System On Chip) device of a 45 nm technology node as an example. Needless to say, the present invention can also be applied to other processes (processes other than the formation process of a trench type element isolation structure), and to SOC products of other technology nodes and products of other categories, etc. in the same manner.

Example 1

FIGS. 18A to 18D and 19E to 19G are cross-sectional views showing the manufacturing process of the semiconductor device in Example 1, and show principal part cross-sectional views in the formation process of a trench type element isolation structure.

Figure 18A:
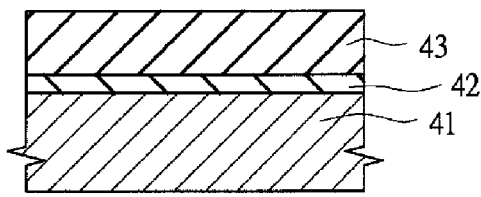
FIGS. 18A to 18D are cross-sectional views showing the manufacturing process of a semiconductor device in Example 1.

In the formation process of the trench type element isolation structure, first, as shown in FIG. 18A, over a semiconductor substrate (a semiconductor wafer) 41 including a single crystalline silicon etc., a silicon oxide film 42 and a silicon nitride film 43 are formed and stacked in order from the bottom. After that, using a photolithographic technique, a resist pattern is formed over the silicon nitride film 43 as follows. For forming the resist pattern, a BARC process was used.

Figure 18B:
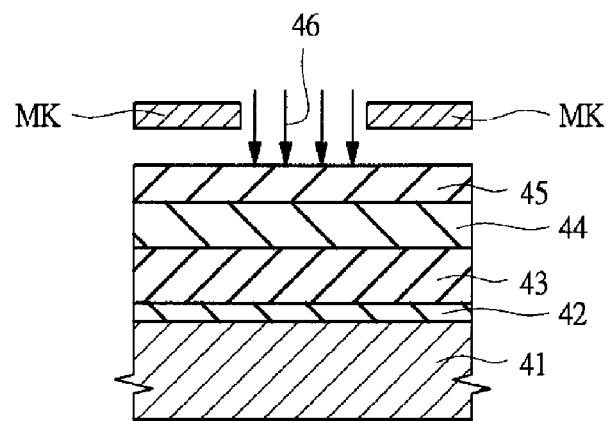
Figure 18C:
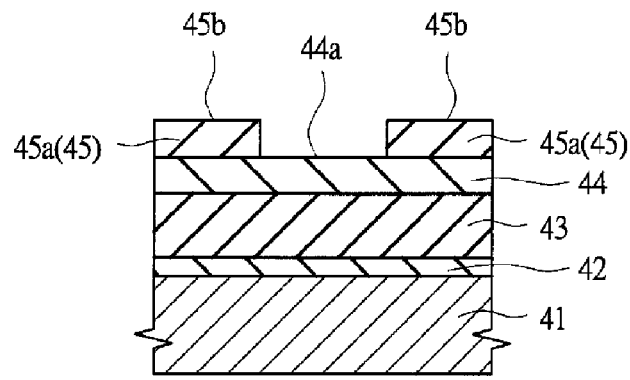
Figure 18D:
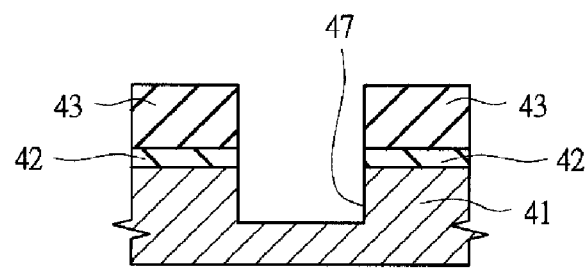

First, as shown in FIG. 18B, over the silicon nitride film 43, an antireflection film (BARC) 44 is formed. On this occasion, as a chemical solution for forming the antireflection film 44, ARC29A (manufactured by Nissan Chemical Industries, Ltd.) was used, and the chemical solution was applied by a spin coat method in a thickness of 80 nm. After that, polymer was crosslinked by a heat treatment to form the antireflection film 44. The contact angle of surface of the formed antireflection film 44 (corresponding to above θ) was 64.50. The antireflection film 44 corresponds to the material film 26 (the film directly below the resist).

As the resist, a resist A being a positive resist was selected as a material having a surface contact angle lower than that of the antireflection film 44 (incidentally, the resist A is an expediential name given to the resist used here).

As a base polymer, the resist A used a methacrylate resin (addition amount: 7.0 mass % relative to the total mass) to which a methoxymethyl group that was detachable while responding to an acid was bonded. Moreover, the resist A used triphenylphosphonium nonaflate (addition amount: 5.0 mass % relative to the mass of the base polymer) as a PAG (Photo Acid Generator), and triethanolamine (addition amount: 5.0 mass % relative to the mass of the base polymer) as a quencher. The resist A is a material prepared by dissolving these materials (the base polymer, PAG, quencher) in PGMEA (propylene glycol monomethyl ether acetate) used as a solvent. The surface of the resist layer 45 formed from the resist A showed a contact angle of 62.20 (the angle corresponding to above). The resist layer 45 was formed by applying the resist A over the antireflection film 44 in a thickness of 150 nm by a spin coat method, and subjecting the same to pre bake at 100° C. for 60 seconds.

Next, as a topcoat layer, a development-soluble topcoat TCX041 (manufactured by JSR) was applied over the surface of the resist layer 45 in a thickness of 90 nm. The contact angle of the surface of the topcoat layer formed over the surface of the resist layer 45 (the angle corresponding to above θ) was 78.9°, which meant that the surface had a water repellent property sufficiently high for performing liquid immersion exposure at a scan speed of 400 mm/sec.

Next, using a reticle and a reduced projection ArF liquid immersion exposure apparatus, a real image of an integrated circuit pattern over the main surface of the reticle was formed over the resist layer 45 to subject the resist layer 45 to liquid immersion exposure (for example, exposure by ArF light 46 having passed through a photomask MK), thereby transferring the integrated circuit pattern to the resist layer 45 (corresponding to FIG. 18B). Subsequently, the resist layer 45 was subjected to a post exposure bake process at 100° C. for 60 seconds.

Subsequently, an alkaline development solution of a tetramethyl ammonium hydroxide (an abbreviated name: TMAH) aqueous solution (TMAH concentration: 2.38 mass %) was used to perform a development process of the resist layer 45 for seconds. As the result of the development process, in non-light-exposed parts of the resist layer 45, the topcoat layer dissolved in the development and the resist was exposed from the surface, and in light-exposed parts of the resist layer 45, the resist dissolved in the development solution and the surface of the antireflection film 44 was exposed (corresponding to FIG. 18C). In the resist layer 45, light-exposed parts are removed by the development process to form a resist pattern 45a.

After the development process, the contact angle of the surface of non-light-exposed parts of the resist layer 45 (that is, a surface 45b of the resist pattern 45a) was 61.8° (which corresponds to above $\theta_1$), and the contact angle of a surface (an exposed surface) 44a of the antireflection film 44 exposed by the removal of light-exposed parts of the resist layer 45 (removed by dissolving in the development solution) was 64.50 (which corresponds to above $\theta_2$), thereby resulting in a state satisfying Expression 1 (that is, the relation of $\theta_2 \geq \theta_1$).

After the development process, for the semiconductor wafer (the semiconductor substrate 41) having such a surface state (the surface state satisfying the relation of $\theta_2 \geq \theta_1$), a rinsing process was provided by pure water for 30 seconds and spin drying was performed, and defects were checked. Then, any defect that was estimated to be caused by development as explained based on FIGS. 8 and 9 was not detected. Further, a dimension check and appearance check were performed to complete the formation process of the resist pattern 45a.

After that, using the resist pattern 45a as an etching mask, the antireflection film 44 was dry-etched by a mixed gas of $O_2$, $N_2$ and HBr and, further, using the pattern including the resist pattern 45a and the antireflection film 44 as an etching mask, the silicon nitride film 43, the silicon oxide film 42, and the semiconductor substrate (the silicon substrate) 41 were dry-etched by a mixed gas of Cl, HBr, $SF_6$ and $O_2$. Consequently, in the device region of the semiconductor substrate 41, a trench (an element isolation trench) 47 for performing element isolation of a circuit was formed (corresponding to FIG. 18D).

Figure 19E:
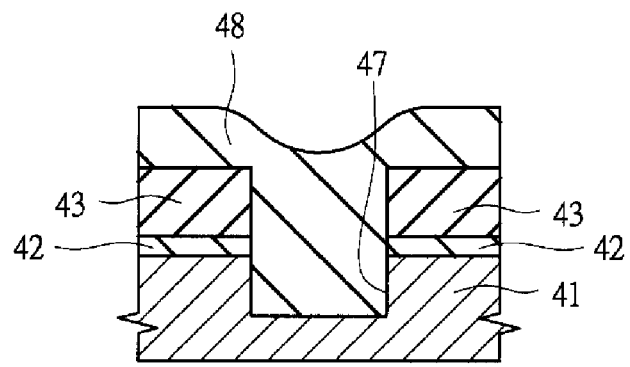
FIGS. 19E to 19G are cross-sectional views showing the manufacturing process of the semiconductor device in Example 1.

Then, the remaining resist pattern 45a and the antireflection film 44 were removed by $O_2$ ashing, then a thin thermally-oxidized film was formed on the inside wall of the trench 47 by thermal oxidation, and, after that, over the whole main surface of the semiconductor substrate 41, a silicon oxide film for element isolation 48 being an insulating film was formed so as to be embedded in the trench 47 by a CVD (Chemical Vapor Deposition) method (corresponding to FIG. 19E).

Figure 19F:
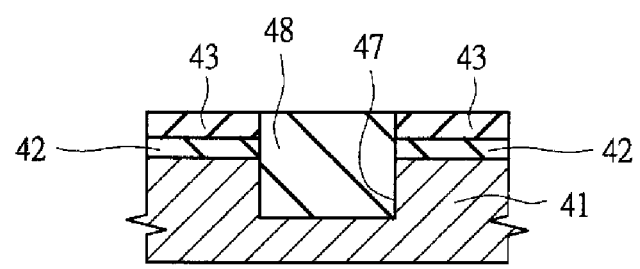
Figure 19G:
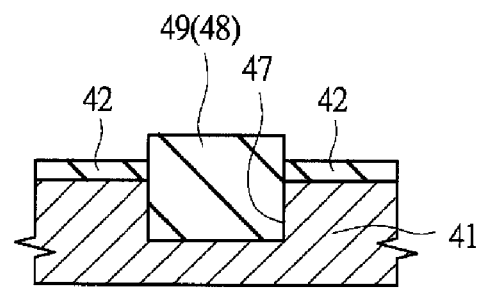

After forming the silicon oxide film for element isolation 48, the silicon oxide film for element isolation 48 was polished by a CMP (Chemical Mechanical Polishing) method using the silicon nitride film 43 as a polishing stopper to remove the silicon oxide film for element isolation 48 outside the trench 47, so that the silicon oxide film for element isolation 48 was left only inside the trench 47 (corresponding to FIG. 19F). After the CMP process, the silicon nitride film 43 was removed by hot phosphoric acid, to complete the formation of a trench type element isolation structure (an element isolation region 49) (corresponding to FIG. 19G). The element isolation region 49 is formed from the silicon oxide film for element isolation 48 remaining inside the trench 47.

Example 2

FIGS. 20A to 22I are cross-sectional views showing the manufacturing process of the semiconductor device in Example 2, and show principal part cross-sectional views in a formation process of a trench type element isolation structure.

Figure 20A:
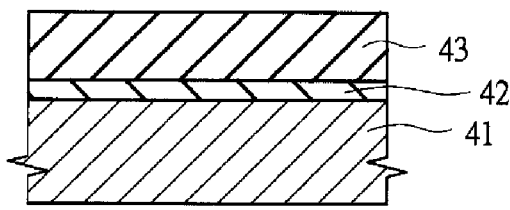
FIGS. 20A to 20C are cross-sectional views showing the manufacturing process of a semiconductor device in Example 2.

In the formation process of a trench type element isolation structure, first, as shown in FIG. 20A, over the semiconductor substrate (the semiconductor wafer) 41, the silicon oxide film 42 and the silicon nitride film 43 are formed and stacked in order from the bottom. After that, a photolithographic technique was used to form a resist pattern over the silicon nitride film 43 as follows. In forming the resist pattern, for the purpose of preventing reflection and improving processability, a three-layer resist process was used.

Figure 20B:
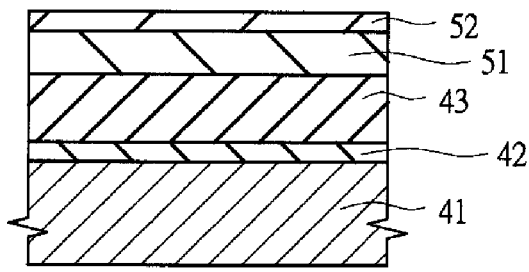

First, as shown in FIG. 20B, over the silicon nitride film 43, a lower layer film 51 containing carbon as a main component was formed. On this occasion, as a chemical solution for forming the lower layer film 51, HM8005 (manufactured by JSR) was used. The chemical solution was applied in a thickness of 200 nm by a spin coat method, which was subjected to a heat treatment to cross-link the polymer, thereby forming the lower layer film 51.

Figure 23:
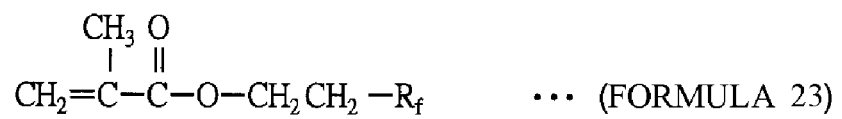
FIG. 23 is an explanatory drawing showing the monomer structure of a fluororesin to be added to an intermediate layer.

Next, over the lower layer film 51, an intermediate layer (an intermediate layer film) 52 containing carbon (C) and silicon (Si) as main components was formed. The intermediate layer 52 corresponds to the material film 26 (the film directly below the resist). The intermediate layer 52 used SHB-A759 (manufactured by Shin-Etsu Chemical Co., Ltd.) as a base material (a base resin). As a fluororesin to be mixed in the chemical solution for forming the intermediate layer 52, a homopolymer having a molecular weight of 35,000 obtained by polymerizing a monomer of the structure in FIG. 23 was used. FIG. 23 is an explanatory drawing showing the monomer structure of the fluororesin to be added to the intermediate layer 52. In FIG. 23, $R_f$ in Formula 23 is a C4-6 linear or branched fluoroalkyl group.

The fluororesin in an amount corresponding to 5.0 mass % of the base resin was mixed in the chemical solution for forming the intermediate layer 52, the mixed liquid was applied in a thickness of 80 nm by a spin coat method, and, after that, the base polymer of the intermediate layer 52 was cross-linked by a heat treatment, thereby forming the intermediate layer 52. The fluororesin added to the chemical solution for forming the intermediate layer 52 segregated over the surface (the surface of the applied film, that is, the surface of the intermediate layer 52) in the spin coat, and, as a result, the contact angle of the surface of the formed intermediate layer 52 (corresponding to above θ) was 78.0°, that is, the surface of the intermediate layer 52 showed a high water repellent property.

Figure 20C:
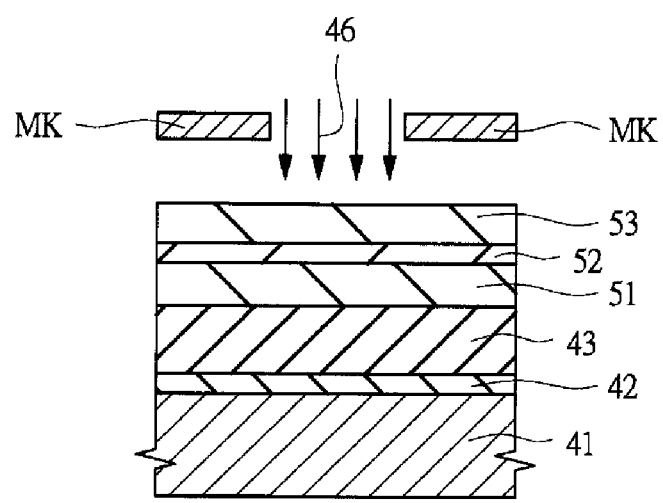
Figure 21D:
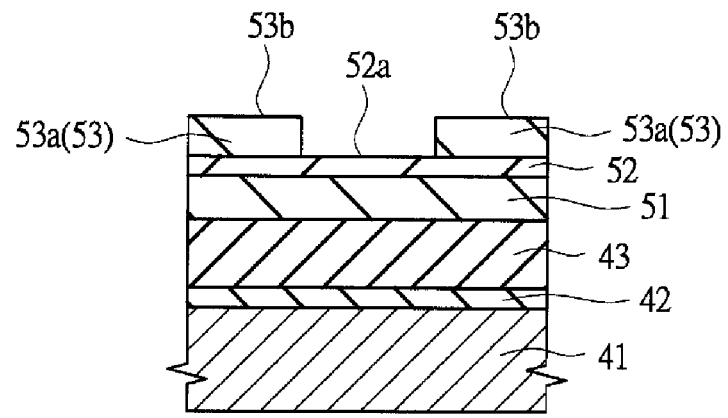
FIGS. 21D to 21F are cross-sectional views showing the manufacturing process of the semiconductor device in Example 2.
Figure 21E:
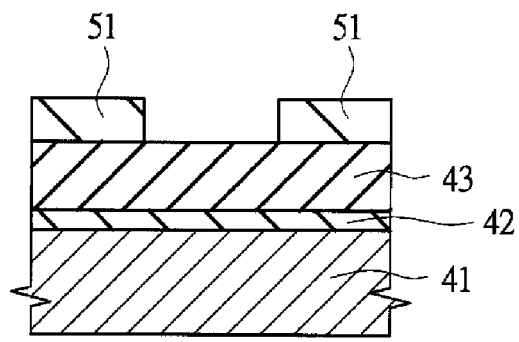
Figure 21F:
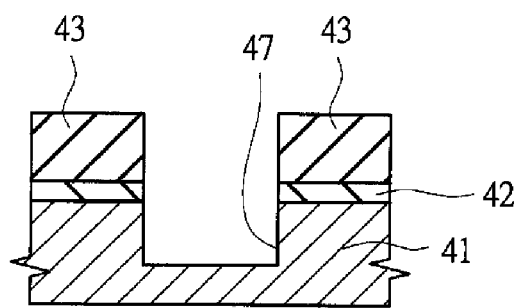

Next, as shown in FIG. 20C, over the intermediate layer 52, a resist B being a topcoat-less positive resist was applied in a thickness of 150 nm, thereby forming a resist layer 53 (the resist B is an expediential name given to a resist used here).

The resist B used, as a base polymer, a methacrylate resin to which a 2-methyladamantyl group that was detachable while responding to an acid was bonded (addition amount: 7.0 mass % relative to the total mass), and, as PAG, triphenylphosphonium nonaflate (addition amount: 5.0 mass % relative to the mass of the base polymer). Moreover, the resist B used, as a quencher, triethanolamine (addition amount: 5.0 mass % relative to the mass of the base polymer), and, as a water repellent additive, a fluorine compound insoluble in an alkaline development solution (addition amount: 4.0 mass % relative to the mass of the base polymer). The resist B is a material prepared by dissolving these materials (the base polymer, PAG, quencher and water repellent additive) in PGMEA (propylene glycol monomethyl ether acetate) used as a solvent. The water repellent additive added to the resist B segregated over the surface (the surface of an applied film, that is, the surface of the resist layer 53) in spin coat (in application by spin coat). As a result, the surface contact angle of the resist layer 53 formed from the resist B (corresponding to above θ) was 77.2°, and the surface of the resist layer 53 showed a high water repellent property. This is a water repellent property sufficiently high for performing liquid immersion exposure at a scan speed of 400 mm/sec.

Next, using a reticle and a reduced projection ArF liquid immersion exposure apparatus, a real image of an integrated circuit pattern over the main surface of the reticle was formed over the resist layer 53 to subject the resist layer 53 to liquid immersion exposure (for example, exposure by ArF light 46 having passed through a photomask MK), thereby transferring the integrated circuit pattern to the resist layer 53 (corresponding to FIG. 20C). Subsequently, the resist layer 53 was subjected to a post exposure bake process at 100° C. for 60 seconds.

Subsequently, an alkaline development solution of a tetramethyl ammonium hydroxide (TMAH) aqueous solution (TMAH concentration: 2.38 mass %) was used to perform a development process of the resist layer 53 for 30 seconds. As the result of the development process, in light-exposed parts of the resist layer 53, the resist dissolved in the development solution and the surface of the intermediate layer 52 was exposed (corresponding to FIG. 21D). In the resist layer 53, light-exposed parts are removed by the development process to form a resist pattern 53a.

After the development process, the contact angle of the surface of non-light-exposed parts of the resist layer 53 (that is, a surface 53b of the resist pattern 53a) was 77.00 (which corresponds to above $\theta_1$), and the contact angle of a surface (an exposed surface) 52a of the intermediate layer 52 exposed by the removal of light-exposed parts of the resist layer 53 (removed by dissolving in the development solution) was 78.00 (which corresponds to above $\theta_2$), thereby resulting in a state satisfying Expression 1 (that is, the relation of $\theta_2 \geq \theta_1$).

After the development process, for the semiconductor wafer (the semiconductor substrate 41) having such a surface state (the surface state satisfying the relation of $\theta_2 \geq \theta_1$), a rinsing process was provided by pure water for 30 seconds and spin drying was performed, and defects were checked. Then, any defect that was estimated to be caused by development as explained based on FIGS. 8 and 9 was not detected. Further, a dimension check and appearance check were performed to complete the formation process of the resist pattern 53a.

After that, using the resist pattern 53a as an etching mask, the intermediate layer 52 was dry-etched by a mixed gas of $CHF_3$, $CF_4$ and $O_2$ to transfer the pattern of the resist pattern 53a to the intermediate layer 52. Further, using the pattern including the resist pattern 53a and the intermediate layer 52 as an etching mask, the lower layer film 51 was dry-etched by a mixed gas of $O_2$, $N_2$ and HBr to transfer the pattern of the resist pattern 53a to the lower layer film 51 (corresponding to FIG. 21E). In the dry etching of the lower layer film 51, the resist pattern 53a and the intermediate layer 52 are removed to be absent. Further, using the pattern of lower layer film 51 (the patterned lower layer film 51) as an etching mask, the silicon nitride film 43, the silicon oxide film 42, and the semiconductor substrate (the silicon substrate) 41 were dry-etched by a mixed gas of Cl, HBr, $SF_6$ and $O_2$. Consequently, in the device region of the semiconductor substrate 41, the trench (the element isolation trench) 47 for performing element isolation of a circuit was formed (corresponding to FIG. 21F).

Figure 22G:
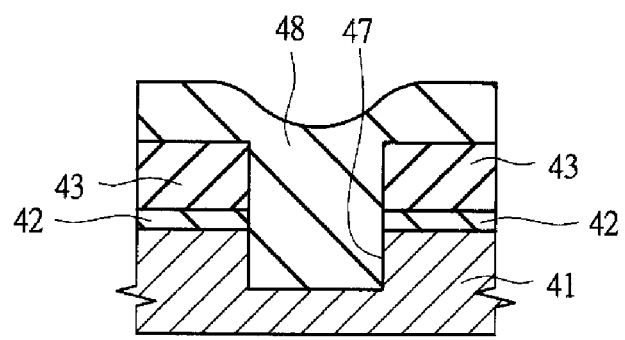
FIGS. 22G to 22I are cross-sectional views showing the manufacturing process of the semiconductor device in Example 2.

Then, the remaining lower layer film 51 was removed by $O_2$ ashing, a thin thermally-oxidized film was formed on the inside wall of the trench 47 by thermal oxidation, and, after that, over the whole main surface of the semiconductor substrate 41, a silicon oxide film for element isolation 48 being an insulating film was formed so as to be embedded in the trench 47 by a CVD method (corresponding to FIG. 22G).

Figure 22H:
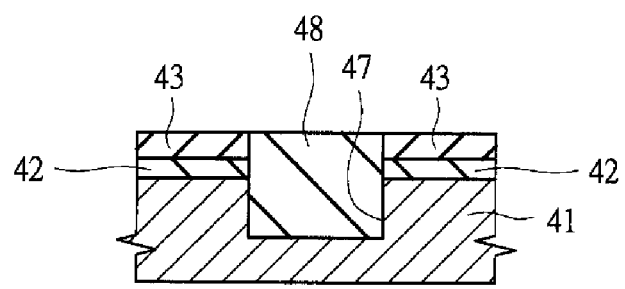
Figure 22I:
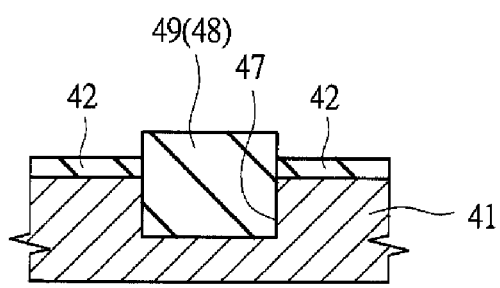

After forming the silicon oxide film for element isolation 48, the silicon oxide film for element isolation 48 was polished by a CMP method using the silicon nitride film 43 as a polishing stopper to remove the silicon oxide film for element isolation 48 outside the trench 47, so that the silicon oxide film for element isolation 48 was left only inside the trench 47 (corresponding to FIG. 22H). After the CMP process, the silicon nitride film 43 was removed by hot phosphoric acid, to complete the formation of a trench type element isolation structure (the element isolation region 49) (corresponding to FIG. 22I). The element isolation region 49 is formed from the silicon oxide film for element isolation 48 remaining inside the trench 47.

Example 3

FIGS. 24 to 26 are cross-sectional views showing the manufacturing process of the semiconductor device in Example 3, and show principal part cross-sectional views in a formation process of a trench type element isolation structure.

Figure 24A:
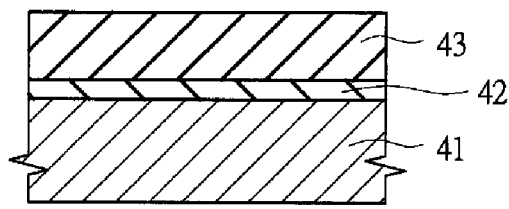
FIGS. 24A to 24C are cross-sectional views showing the manufacturing process of a semiconductor device in Example 3.
Figure 25D:
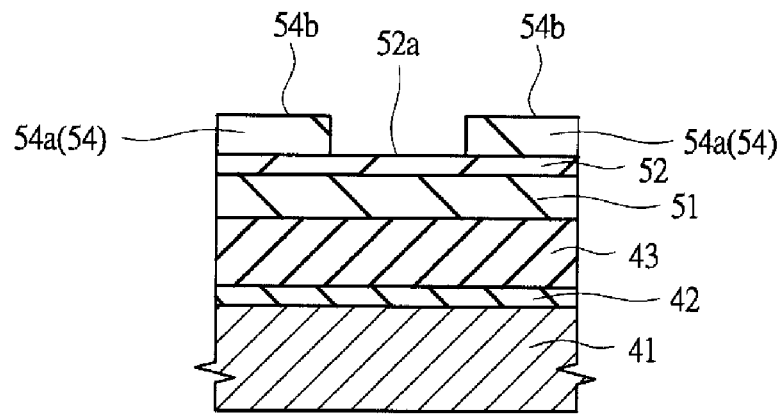
FIGS. 25D to 25F are cross-sectional views showing the manufacturing process of the semiconductor device in Example 3.
Figure 25E:
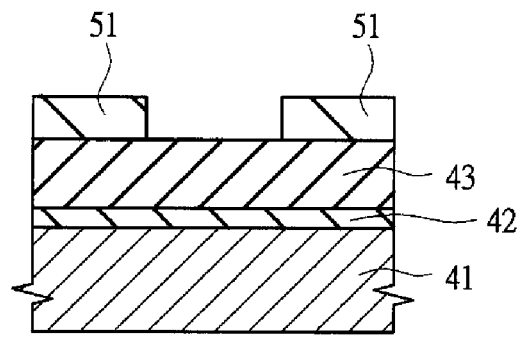
Figure 25F:
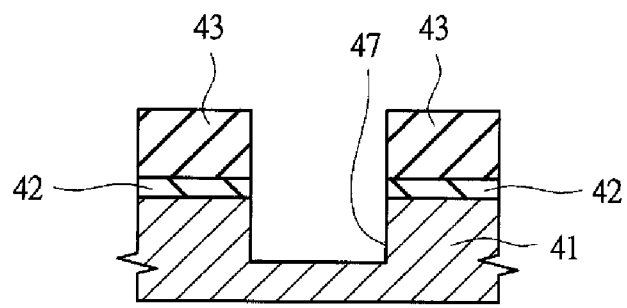

In the formation process of a trench type element isolation structure, first, as shown in FIG. 24A, over the semiconductor substrate (the semiconductor wafer) 41, the silicon oxide film 42 and the silicon nitride film 43 are formed and stacked in order from the bottom. After that, a photolithographic technique was used to form a resist pattern over the silicon nitride film 43 as follows. In forming the resist pattern, for the purpose of preventing reflection and improving processability, a three-layer resist process was used.

Figure 24B:
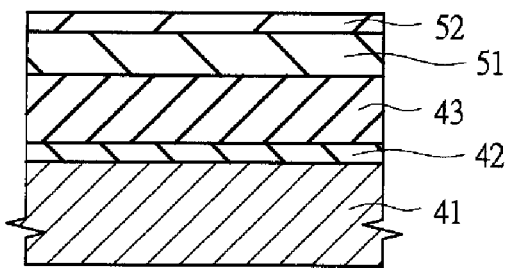

First, as shown in FIG. 24B, over the silicon nitride film 43, a lower layer film 51 containing carbon as a main component was formed. On this occasion, as a chemical solution for forming the lower layer film 51, HM8005 (manufactured by JSR) was used. The chemical solution was applied in a thickness of 200 nm by a spin coat method, which was subjected to a heat treatment to cross-link the polymer, thereby forming the lower layer film 51.

Next, over the lower layer film 51, the intermediate layer (an intermediate layer film) 52 containing carbon (C) and silicon (Si) as main components was formed. The intermediate layer 52 corresponds to the material film 26 (the film directly below the resist). The intermediate layer 52 used SHB-A759 (manufactured by Shin-Etsu Chemical Co., Ltd.) as a base material (a base resin). As a fluororesin to be mixed in the chemical solution for forming the intermediate layer 52, a homopolymer having a molecular weight of 35,000 obtained by polymerizing a monomer of the structure in FIG. 23 was used. The fluororesin in an amount corresponding to 5.0 mass % of the base resin was mixed in the chemical solution for forming the intermediate layer 52, the mixed liquid was applied in a thickness of 80 nm by a spin coat method, and, after that, the base polymer of the intermediate layer 52 was cross-linked by a heat treatment, thereby forming the intermediate layer 52. The fluororesin added to the chemical solution for forming the intermediate layer 52 segregated over the surface (the surface of the applied film, that is, the surface of the intermediate layer 52) in the spin coat, and, as a result, the contact angle of the surface of the intermediate layer 52 formed was 78.0° (corresponding to above θ), that is, the surface of the intermediate layer 52 showed a high water repellent property.

Figure 24C:
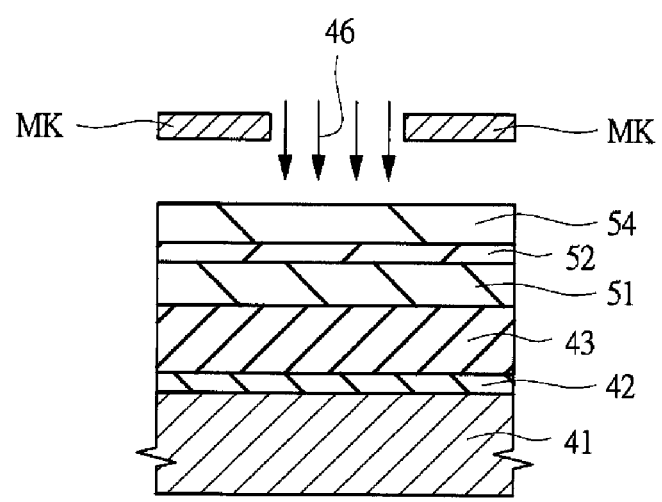

Next, as shown in FIG. 24C, over the intermediate layer 52, a resist C being a topcoat-less positive resist was applied in a thickness of 150 nm, thereby forming a resist layer 54 (the resist C is an expediential name given to a resist used here).

The resist C used, as a base polymer, a methacrylate resin to which a 2-methyladamantyl group that was detachable while responding to an acid was bonded (addition amount: 7.0 mass % relative to the total mass), and, as PAG, triphenylphosphonium nonaflate (addition amount: 5.0 mass % relative to the mass of the base polymer). Moreover, the resist C used, as a quencher, triethanolamine (addition amount: 5.0 mass % relative to the mass of the base polymer), and, as a water repellent additive, a fluorine compound that changes the polarity thereof caused by the contact with an alkaline development solution (addition amount: 8.0 mass % relative to the mass of the base polymer). The resist C is a material produced by dissolving these materials (the base polymer, PAG, quencher and water repellent additive) in PGMEA (propylene glycol monomethyl ether acetate) used as a solvent. The water repellent additive added to the resist C segregated over the surface (the surface of an applied film, that is, the surface of the resist layer 54) in spin coat (in application by spin coat). As a result, the surface contact angle of the resist layer 54 formed from the resist C (corresponding to above θ) was 85°, that is, the surface of the resist layer 54 showed a high water repellent property. This is a water repellent property sufficiently high for performing liquid immersion exposure at a scan speed of 500 mm/sec.

Next, using a reticle and a reduced projection ArF liquid immersion exposure apparatus, a real image of an integrated circuit pattern over the main surface of the reticle was formed over the resist layer 54 to subject the resist layer 54 to liquid immersion exposure (for example, exposure by ArF light 46 having passed through a photomask MK), thereby transferring the integrated circuit pattern to the resist layer 54 (corresponding to FIG. 24C). Subsequently, the resist layer 54 was subjected to a post exposure bake at 100° C. for 60 seconds.

Subsequently, an alkaline development solution of a tetramethyl ammonium hydroxide (TMAH) aqueous solution (TMAH concentration: 2.38 mass %) was used to perform a development process of the resist layer 54 for 30 seconds. As the result of the development process, in light-exposed parts of the resist layer 54, the resist dissolved in the development solution and the surface of the intermediate layer 52 was exposed and, in non-light-exposed parts of the resist layer 54, the water repellent additive having segregated over the resist surface changed the polarity thereof to make the resist surface (the surface of the resist layer 54) hydrophilic (corresponding to FIG. 25D). In the resist layer 54, light-exposed parts are removed by the development process to form a resist pattern 54a.

After the development process, the contact angle of the surface of non-light-exposed parts of the resist layer 54 (that is, a surface 54b of the resist pattern 54a) (which corresponds to above $\theta_1$) was 76.7°, and the contact angle of the surface (the exposed surface) 52a of the intermediate layer 52 exposed by the removal of light-exposed parts of the resist layer 54 (removed by dissolving in the development solution) (which corresponds to above $\theta_2$) was 78.0°, thereby resulting in a state satisfying Expression 1 (that is, the relation of $\theta_2 \geq \theta_1$).

After the development process, for the semiconductor wafer (the semiconductor substrate 41) having such a surface state (the surface state satisfying the relation of $\theta_2 \geq \theta_1$), a rinsing process was provided by pure water for 30 seconds and spin drying was performed, and defects were checked. Then, any defect that was estimated to be caused by development as explained based on FIGS. 8 and 9 was not detected. Further, a dimension check and appearance check were performed to complete the formation process of the resist pattern 54a.

After that, using the resist pattern 54a as an etching mask, the intermediate layer 52 was dry-etched by a mixed gas of $CHF_3$, $CF_4$ and $O_2$ to transfer the pattern of the resist pattern 54a to the intermediate layer 52. Further, using the pattern including the resist pattern 54a and the intermediate layer 52 as an etching mask, the lower layer film 51 was dry-etched by a mixed gas of $O_2$, $N_2$ and HBr to transfer the pattern of the resist pattern 54a to the lower layer film 51 (corresponding to FIG. 25E). In the dry etching of the lower layer film 51, the resist pattern 54a and the intermediate layer 52 are removed to be absent. Further, using the pattern of lower layer film 51 (the patterned lower layer film 51) as an etching mask, the silicon nitride film 43, the silicon oxide film 42, and the semiconductor substrate (the silicon substrate) 41 were dry-etched by a mixed gas of Cl, HBr, $SF_6$ and $O_2$. Consequently, in the device region of the semiconductor substrate 41, the trench (the element isolation trench) 47 for performing element isolation of a circuit was formed (corresponding to FIG. 25F).

Figure 26G:
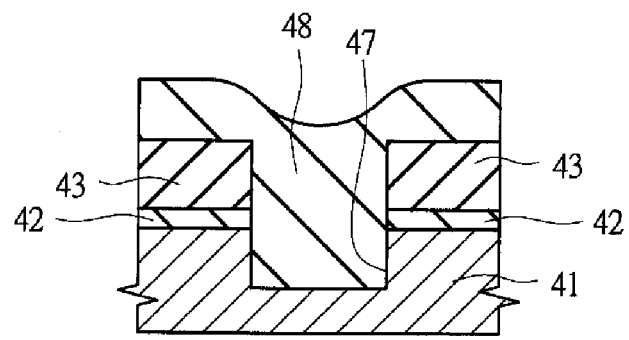
FIGS. 26G to 26I are cross-sectional views showing the manufacturing process of the semiconductor device in Example 3.

Then, the remaining lower layer film 51 was removed by $O_2$ ashing, a thin thermally-oxidized film was formed over the inside wall of the trench 47 by thermal oxidation, and, after that, over the whole main surface of the semiconductor substrate 41, a silicon oxide film for element isolation 48 being an insulating film was formed so as to be embedded in the trench 47 by a CVD method (corresponding to FIG. 26G).

Figure 26H:
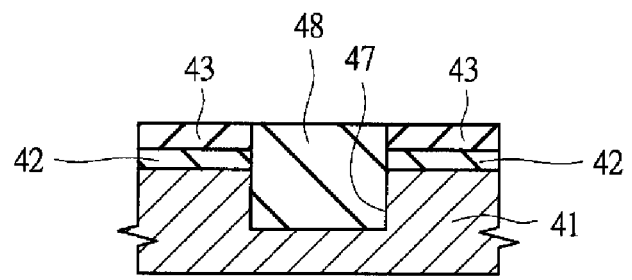
Figure 26I:
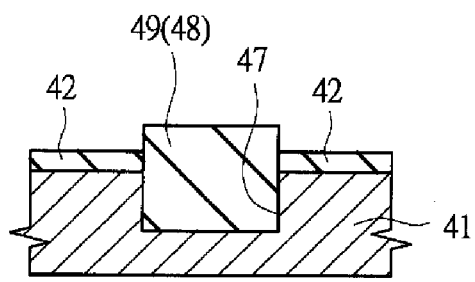

After forming the silicon oxide film for element isolation 48, the silicon oxide film for element isolation 48 was polished by a CMP method using the silicon nitride film 43 as a polishing stopper to remove the silicon oxide film for element isolation 48 outside the trench 47, so that the silicon oxide film for element isolation 48 was left only inside the trench 47 (corresponding to FIG. 26H). After the CMP process, the silicon nitride film 43 was removed by hot phosphoric acid, to complete the formation of a trench type element isolation structure (the element isolation region 49) (corresponding to FIG. 26I). The element isolation region 49 is formed from the silicon oxide film for element isolation 48 remaining inside the trench 47.

Example 4

Figure 27A:
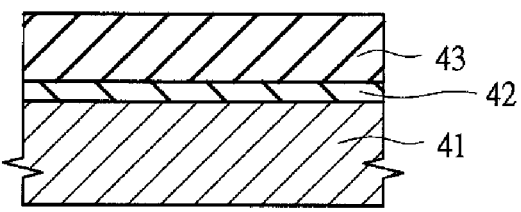
FIGS. 27A to 27C are cross-sectional views showing the manufacturing process of a semiconductor device in Example 4.
Figure 27B:
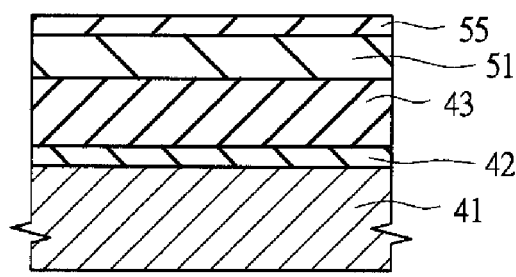
Figure 27C:
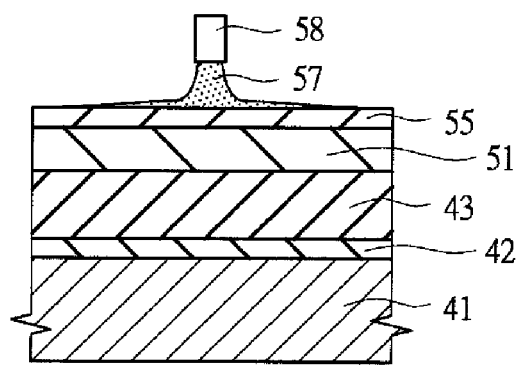

FIGS. 27 to 29 are cross-sectional views showing the manufacturing process of the semiconductor device in Example 4, and show principal part cross-sectional views in a formation process of a trench type element isolation structure.

In the formation process of a trench type element isolation structure, first, as shown in FIG. 27A, over the semiconductor substrate (the semiconductor wafer) 41, the silicon oxide film 42 and the silicon nitride film 43 are formed and stacked in order from the bottom. After that, a photolithographic technique was used to form a resist pattern over the silicon nitride film 43 as follows. In forming the resist pattern, for the purpose of preventing reflection and improving processability, a three-layer resist process was used.

First, as shown in FIG. 27B, over the silicon nitride film 43, a lower layer film 51 containing carbon as a main component was formed. On this occasion, as a chemical solution for forming the lower layer film 51, HM8005 (manufactured by JSR) was used. The chemical solution was applied in a thickness of 200 nm by a spin coat method, which was subjected to a heat treatment to cross-link the polymer, thereby forming the lower layer film 51.

Next, over the lower layer film 51, an intermediate layer (an intermediate layer film) 55 containing carbon (C) and silicon (Si) as main components was formed. The intermediate layer 55 corresponds to the material film 26 (the film directly below the resist). The intermediate layer 55 used SHB-A759 (manufactured by Shin-Etsu Chemical Co., Ltd.), which was applied in a thickness of 80 nm by a spin coat method and, after that, the polymer was cross-linked by a heat treatment, thereby forming the intermediate layer 55.

Next, over the intermediate layer 55, a chemical solution of a water repellent agent 57 was ejected (supplied) to perform a water repellent treatment of the surface of the intermediate layer 55. As the chemical solution of a water repellent agent 57, a liquid obtained by dissolving 3,3,3-trifluoropropyltrimethoxysilane (KBM7103, manufactured by Shin-Etsu Chemical Co., Ltd.) as a silane coupling agent in diisoamyl ether in a concentration of 3.0 mass % was used. For the water repellent treatment of the surface of the intermediate layer 55, the device (the application cup) as shown in FIG. 15 was used, and the chemical solution of a water repellent agent 57 was supplied from a nozzle (a straight nozzle) 58 to the main surface of the semiconductor wafer (that is, the surface of the intermediate layer 55) to be applied, while rotating the semiconductor wafer (the semiconductor substrate 41) at 1000 rpm, thereby forming a water repellent-treated layer over the top surface (the upper surface) of the semiconductor wafer, side surfaces of the semiconductor wafer and the rim parts of the bottom of the semiconductor wafer. Consequently, over the surface (the upper surface) of the intermediate layer 55, a water repellent-treated layer (for example, a water repellent agent-adsorbed layer of about one molecular layer) was formed, and, as a result, the contact angle of the surface of the intermediate layer 55 (corresponding to above θ) was 79.3°, that is, the surface of the intermediate layer 55 showed a high water repellent property.

Figure 28D:
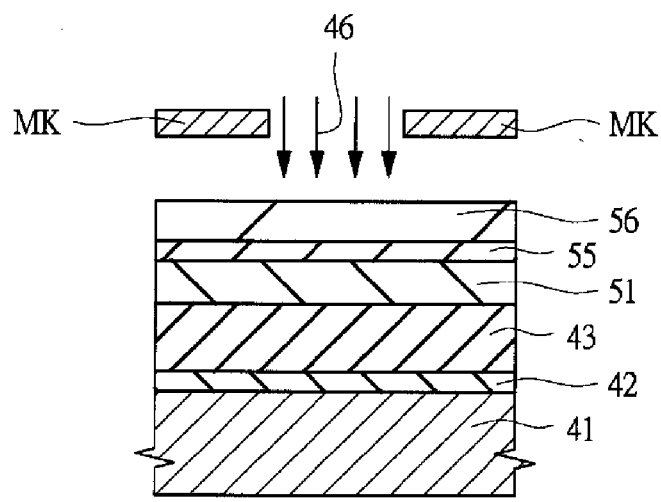
FIGS. 28D to 28F are cross-sectional views showing the manufacturing process of the semiconductor device in Example 4.
Figure 28E:
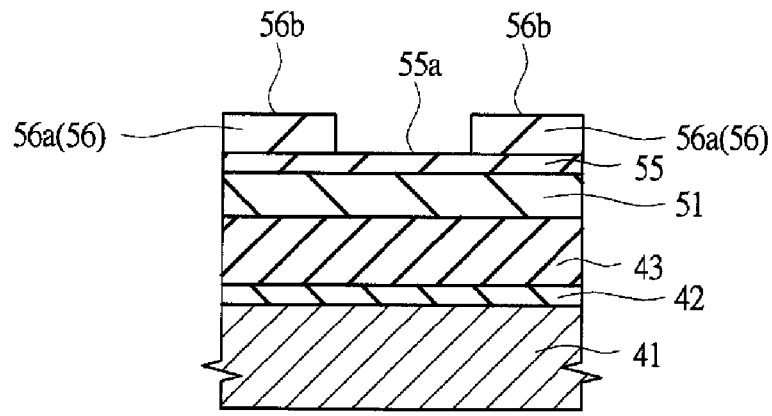
Figure 28F:
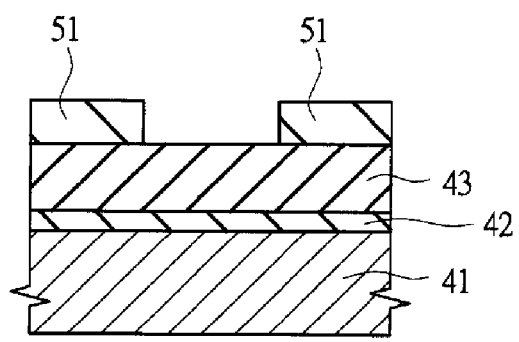

Next, as shown in FIG. 28D, over the intermediate layer 52, the resist C being a topcoat-less positive resist was applied in a thickness of 150 nm to form a resist layer 56. The resist C used here is the same as the resist C used in Example 3, and a repeated explanation is omitted here. The water repellent additive added to the resist C segregated over the surface (the surface of the applied film, that is, the surface of the resist layer 56) in spin coat (in application by spin coat). As a result, the surface contact angle of the resist layer 56 formed from the resist C (corresponding to above θ) was 850, and the surface of the resist layer 56 showed a high water repellent property. This is a water repellent property sufficiently high for performing liquid immersion exposure at a scan speed of 500 mm/sec.

Next, using a reticle and a reduced projection ArF liquid immersion exposure apparatus, a real image of an integrated circuit pattern over the main surface of the reticle was formed over the resist layer 56 to subject the resist layer 56 to liquid immersion exposure (for example, exposure by ArF light 46 having passed through a photomask MK), thereby transferring the integrated circuit pattern to the resist layer 56 (corresponding to FIG. 28D). Subsequently, the resist layer 56 was subjected to a post exposure bake at 100° C. for 60 seconds.

Subsequently, an alkaline development solution of a tetramethyl ammonium hydroxide (TMAH) aqueous solution (TMAH concentration: 2.38 mass %) was used to perform a development process of the resist layer 56 for 30 seconds. As the result of the development process, in light-exposed parts of the resist layer 56, the resist dissolved in the development solution and the surface of the intermediate layer 55 was exposed, and, in non-light-exposed parts of the resist layer 56, the water repellent additive having segregated over the resist surface changed the polarity thereof to make the resist surface (the surface of the resist layer 56) hydrophilic (corresponding to FIG. 28E). In the resist layer 56, light-exposed parts are removed by the development process to form a resist pattern 56a.

After the development process, the contact angle of the surface of non-light-exposed parts of the resist layer 56 (that is, a surface 56b of the resist pattern 56a) (which corresponds to above $\theta_1$) was 76.7°, and the contact angle of the surface (the exposed surface) 55a of the intermediate layer 55 exposed by the removal of light-exposed parts of the resist layer 56 (removed by dissolving in the development solution) (which corresponds to above $\theta_2$) was 79.3°, thereby resulting in a state satisfying Expression 1 (that is, the relation of $\theta_2 \geq \theta_1$).

After the development process, for the semiconductor wafer (the semiconductor substrate 41) having such a surface state (the surface state satisfying the relation of $\theta_2 \geq \theta_1$), a rinsing process was provided by pure water for 30 seconds and spin drying was performed, and defects were checked. Then, any defect that was estimated to be caused by development as explained using FIGS. 8 and 9 was not detected. Further, a dimension check and appearance check were performed to complete the formation process of the resist pattern 56a.

After that, using the resist pattern 56a as an etching mask, the intermediate layer 55 was dry-etched by a mixed gas of $CHF_3$, $CF_4$ and $O_2$ to transfer the pattern of the resist pattern 56a to the intermediate layer 55. Further, using the pattern including the resist pattern 56a and the intermediate layer 55 as an etching mask, the lower layer film 51 was dry-etched by a mixed gas of $O_2$, $N_2$ and HBr to transfer the pattern of the resist pattern 56a to the lower layer film 51 (corresponding to FIG. 28F). In the dry etching of the lower layer film 51, the resist pattern 56a and the intermediate layer 55 are removed to be absent. Further, using the pattern of lower layer film 51 (the patterned lower layer film 51) as an etching mask, the silicon nitride film 43, the silicon oxide film 42, and the semiconductor substrate (the silicon substrate) 41 were dry-etched by a mixed gas of Cl, HBr, $SF_6$ and $O_2$. Consequently, in the device region of the semiconductor substrate 41, the trench (the element isolation trench) 47 for performing element isolation of a circuit was formed (corresponding to FIG. 29G).

Figure 29G:
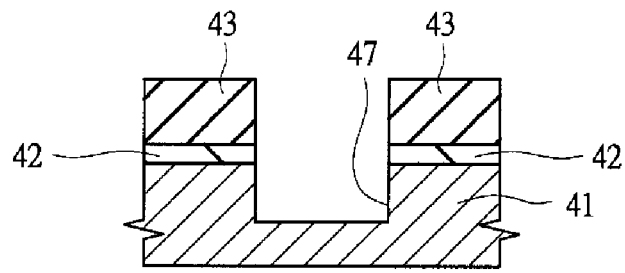
FIGS. 29G to 29J are cross-sectional views showing the manufacturing process of the semiconductor device in Example 4.
Figure 29H:
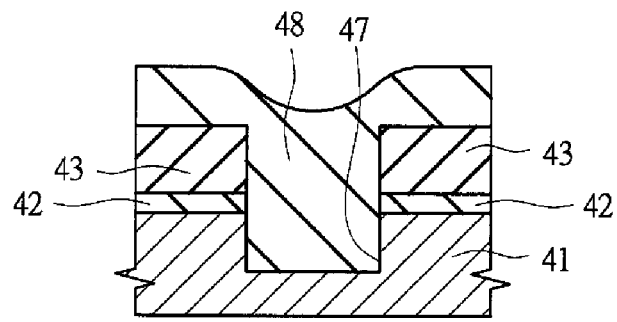

Then, the remaining lower layer film 51 was removed by $O_2$ ashing, a thin thermally-oxidized film was formed over the inside wall of the trench 47 by thermal oxidation, and, after that, over the whole main surface of the semiconductor substrate 41, a silicon oxide film for element isolation 48 being an insulating film was formed so as to be embedded in the trench 47 by a CVD method (corresponding to FIG. 29H).

Figure 29I:
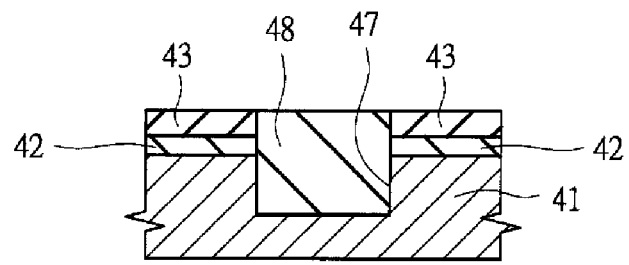
Figure 29J:
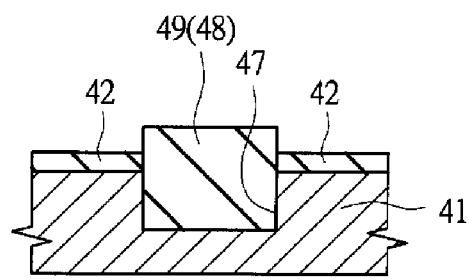

After forming the silicon oxide film for element isolation 48, the silicon oxide film for element isolation 48 was polished by a CMP method using the silicon nitride film 43 as a polishing stopper to remove the silicon oxide film for element isolation 48 outside the trench 47, so that the silicon oxide film for element isolation 48 was left only inside the trench 47 (corresponding to FIG. 29I). After the CMP process, the silicon nitride film 43 was removed by hot phosphoric acid, to complete the formation of a trench type element isolation structure (the element isolation region 49) (corresponding to FIG. 29J). The element isolation region 49 is formed from the silicon oxide film for element isolation 48 remaining inside the trench 47.

Example 5

FIGS. 30 to 32 are cross-sectional views showing the manufacturing process of the semiconductor device in Example 5, and show principal part cross-sectional views in the formation process of a trench type element isolation structure.

Figure 30A:
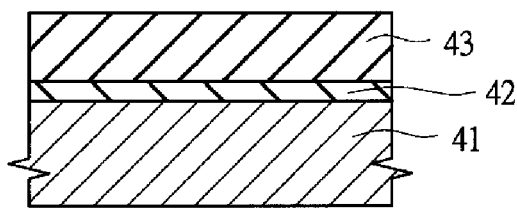
FIGS. 30A to 30C are cross-sectional views showing the manufacturing process of a semiconductor device in Example 5.
Figure 31D:
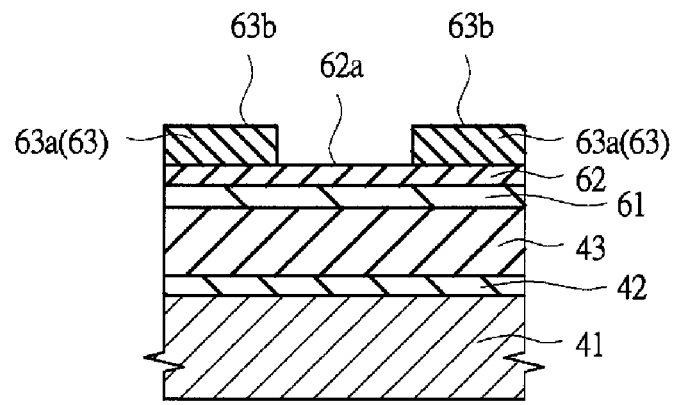
FIGS. 31D to 31F are cross-sectional views showing the manufacturing process of the semiconductor device in Example 5.

In the formation process of a trench type element isolation structure, first, as shown in FIG. 30A, over the semiconductor substrate (the semiconductor wafer) 41, the silicon oxide film 42 and the silicon nitride film 43 are formed and stacked in order from the bottom. After that, a photolithographic technique was used to form a resist pattern over the silicon nitride film 43 as follows. In forming the resist pattern, for the purpose of preventing reflection and improving processability, a hard mask process was used.

Figure 30B:
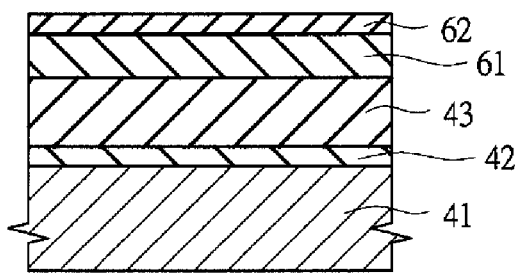

First, as shown in FIG. 30B, over the silicon nitride film 43, an amorphous carbon layer 61 was formed as an inorganic hard mask (a hard mask layer). For forming the amorphous carbon layer 61, a mixed gas of a hydrocarbon compound (for example, propylene ($C_3H_6$), propyne ($C_3H_4$), propane ($C_3H_8$), butane ($C_4H_{10}$), butylene ($C_4H_8$), butadiene ($C_4H_6$) or acetylene ($C_2H_2$), or a compound of these), Ar and He was used, and the amorphous carbon layer 61 was deposited in a thickness of 50 nm by a plasma CVD method.

Next, for the purpose of prevention of the reflection and prevention of the skirting of the resist pattern shape, over the amorphous carbon layer 61, an organic antireflection film (BARC) 62 was formed. The organic antireflection film 62 corresponds to the material film 26 (the film directly below the resist). The organic antireflection film 62 used ARC29A (manufactured by Nissan Chemical Industries, Ltd.) as a base material (a base resin). As a fluororesin to be mixed in the chemical solution for forming the organic antireflection film 62, a homopolymer having a molecular weight of 35,000 obtained by polymerizing a monomer of the structure in FIG. 23 was used. The fluororesin of an amount corresponding to 5.0 mass % of the base resin was mixed to the chemical solution for forming the organic antireflection film 62, the mixed liquid was applied in a film thickness of 80 nm by a spin coat method, and, after that, the base polymer of the organic antireflection film 62 was cross-linked by a heat treatment, thereby forming the organic antireflection film 62. The fluororesin added to the chemical solution for forming the organic antireflection film 62 segregated over the surface (the surface of the applied film, that is, the surface of the organic antireflection film 62) in the spin coat, and, as a result, the contact angle of the surface of the organic antireflection film 62 (corresponding to above $\theta$) was 77.0°, that is, the surface of the intermediate layer 62 showed a high water repellent property.

Figure 30C:
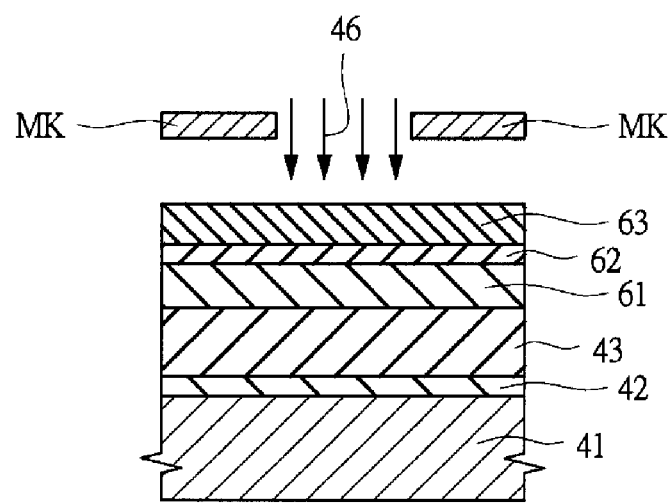

Next, as shown in FIG. 30C, over the organic antireflection film 62, the resist C of the topcoat-less positive resist was applied in a thickness of 150 nm to form a resist layer 63. The resist C used here is the same as the resist C used in Examples 3 and 4, and, therefore, repeated explanation is omitted here. The water repellent additive added to the resist C segregated over the surface (the surface of an applied film, that is, the surface of the resist layer 63) in spin coat (in application by spin coat). As a result, the surface contact angle of the resist layer 63 (corresponding to above $\theta$) formed from the resist C was 850, and the surface of the resist layer 63 showed a high water repellent property. This is a water repellent property sufficiently high for performing liquid immersion exposure at a scan speed of 500 mm/sec.

Next, using a reticle and a reduced projection ArF liquid immersion exposure apparatus, a real image of an integrated circuit pattern over the main surface of the reticle was formed over the resist layer 63 to subject the resist layer 63 to liquid immersion exposure (for example, exposure by ArF light 46 having passed through a photomask MK), thereby transferring the integrated circuit pattern to the resist layer 63 (corresponding to FIG. 30C). Subsequently, the resist layer 63 was subjected to a post exposure bake at 100° C. for 60 seconds.

Subsequently, an alkaline development solution of a tetramethyl ammonium hydroxide (TMAH) aqueous solution (TMAH concentration: 2.38 mass %) was used to perform a development process of the resist layer 63 for 30 seconds. As the result of the development process, in light-exposed parts of the resist layer 63, the resist dissolved in the development solution and the surface of the organic antireflection film 62 was exposed, and, in non-light-exposed parts of the resist layer 63, the water repellent additive having segregated over the resist surface changed the polarity thereof to make the resist surface (the surface of the resist layer 63) hydrophilic (corresponding to FIG. 31D). In the resist layer 63, light-exposed parts are removed by the development process to form a resist pattern 63a.

After the development process, the contact angle of the surface of non-light-exposed parts of the resist layer 63 (that is, a surface 63b of the resist pattern 63a) (which corresponds to above $\theta_1$) was 76.7°, and the contact angle of a surface (an exposed surface) 62a of the organic antireflection film 62 exposed by the removal of light-exposed parts of the resist layer 63 (removed by dissolving in the development solution) (which corresponds to above $\theta_2$) was 77.0°, thereby resulting in a state satisfying Expression 1 (that is, the relation of $\theta_2 \geq \theta_1$).

After the development process, for the semiconductor wafer (the semiconductor substrate 41) having such a surface state (the surface state satisfying the relation of $\theta_2 \geq \theta_1$), a rinsing process was provided by pure water for 30 seconds and spin drying was performed, and defects were checked. Then, any defect that was estimated to be caused by development as explained using FIGS. 8 and 9 was not detected. Further, a dimension check and appearance check were performed to complete the formation process of the resist pattern 63a.

Figure 31E:
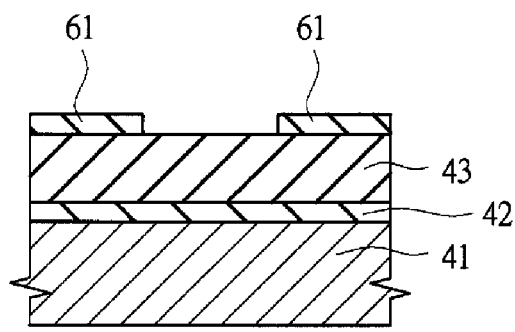
Figure 31F:
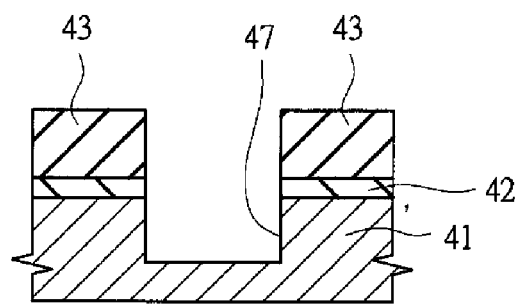

After that, using the resist pattern 63a as an etching mask, the organic antireflection film 62 and the amorphous carbon layer 61 were dry-etched by a mixed gas of $O_2$, $N_2$ and HBr to transfer the pattern of the resist pattern 63a to the amorphous carbon layer 61 (corresponding to FIG. 31E). The resist pattern 63a and the organic antireflection film 62 are removed to be absent in the dry etching of the amorphous carbon layer 61, either that, or the resist pattern 63a and the organic antireflection film 62 are removed after the dry etching of the amorphous carbon layer 61. Further, using the pattern by the amorphous carbon layer 61 as an etching mask, the silicon nitride film 43, the silicon oxide film 42, and the semiconductor substrate (the silicon substrate) 41 were dry-etched by a mixed gas of Cl, HBr, $SF_6$ and $O_2$. Consequently, in the device region of the semiconductor substrate 41, a trench (an element isolation trench) 47 for performing element isolation of a circuit was formed (corresponding to FIG. 31F).

Figure 32G:
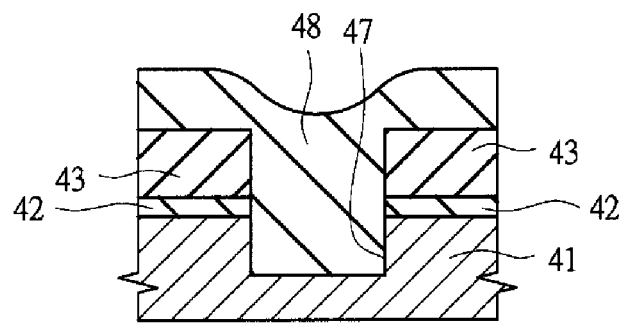
FIGS. 32G to 32I are cross-sectional views showing the manufacturing process of the semiconductor device in Example 5.

Then, the remaining amorphous carbon layer 61 was removed by $O_2$ ashing, a thin thermally-oxidized film was formed over the inside wall of the trench 47 by thermal oxidation, and, after that, over the whole main surface of the semiconductor substrate 41, a silicon oxide film for element isolation 48 being an insulating film was formed so as to be embedded in the trench 47 by a CVD method (corresponding to FIG. 32G).

Figure 32H:
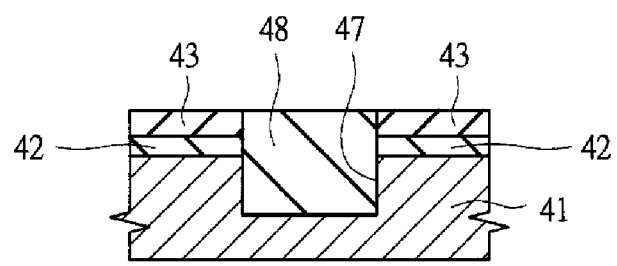
Figure 32I:
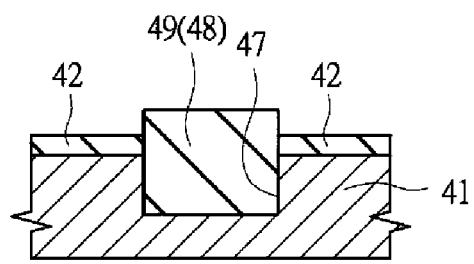

After forming the silicon oxide film for element isolation 48, the silicon oxide film for element isolation 48 was polished by a CMP method using the silicon nitride film 43 as a polishing stopper to remove the silicon oxide film for element isolation 48 outside the trench 47, so that the silicon oxide film for element isolation 48 was left only inside the trench 47 (corresponding to FIG. 32H). After the CMP process, the silicon nitride film 43 was removed by hot phosphoric acid, to complete the formation of a trench type element isolation structure (an element isolation region 49) (corresponding to FIG. 32I). The element isolation region 49 is formed from the silicon oxide film for element isolation 48 remaining inside the trench 47.

Figure 33:
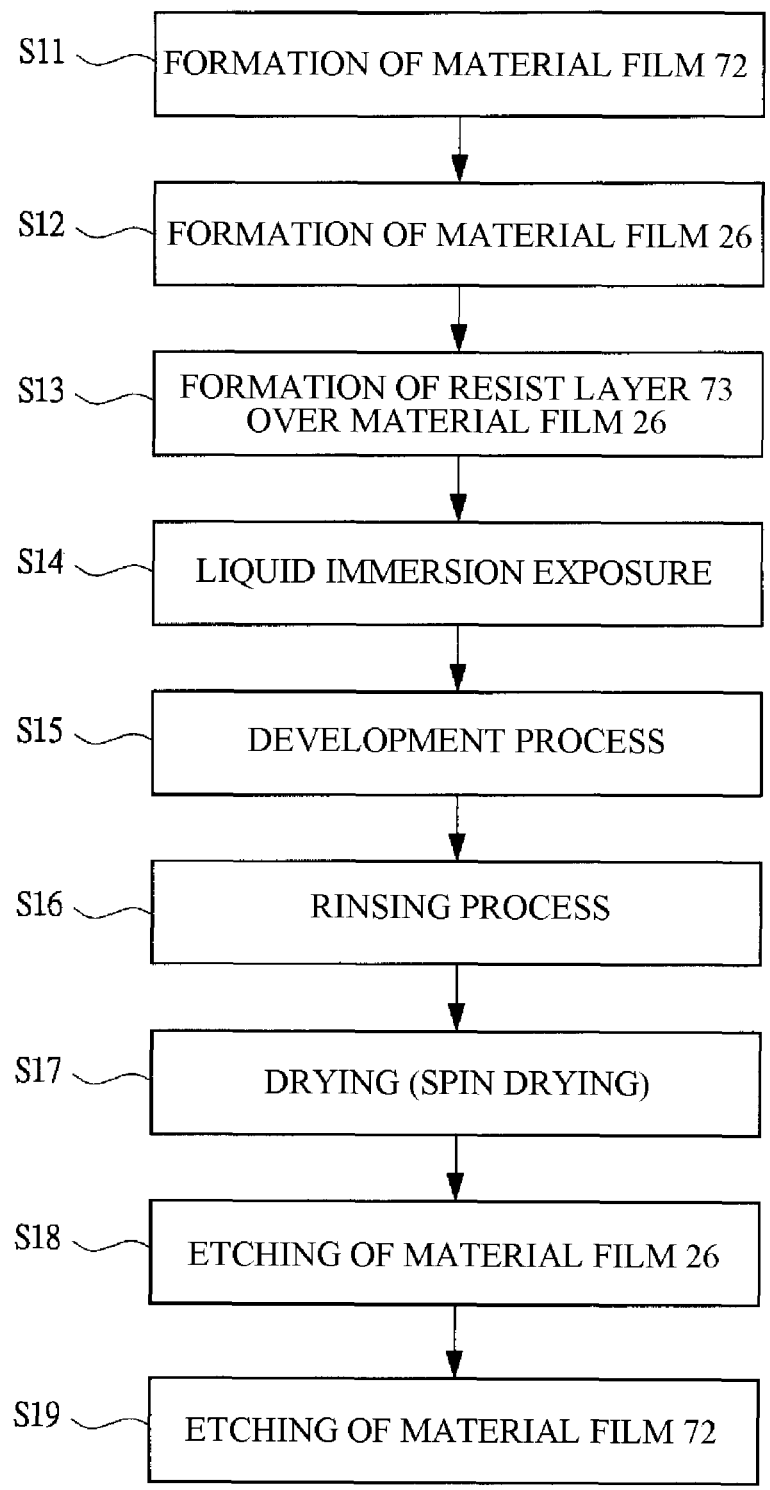
FIG. 33 is a process flow chart of the semiconductor device of the embodiment.

FIG. 33 is a process flow chart of the semiconductor devices of the preset invention grasping inclusively Examples 1 to 5, and FIGS. 34 to 38 are principal part cross-sectional views in the manufacturing process of semiconductor devices of the embodiments grasping inclusively Examples 1 to 5. FIG. 39 is a table showing the relation of contact angles in Examples 1 to 5.

When grasping inclusively Examples 1 to 5, a following process flow is obtained.

Figure 34:
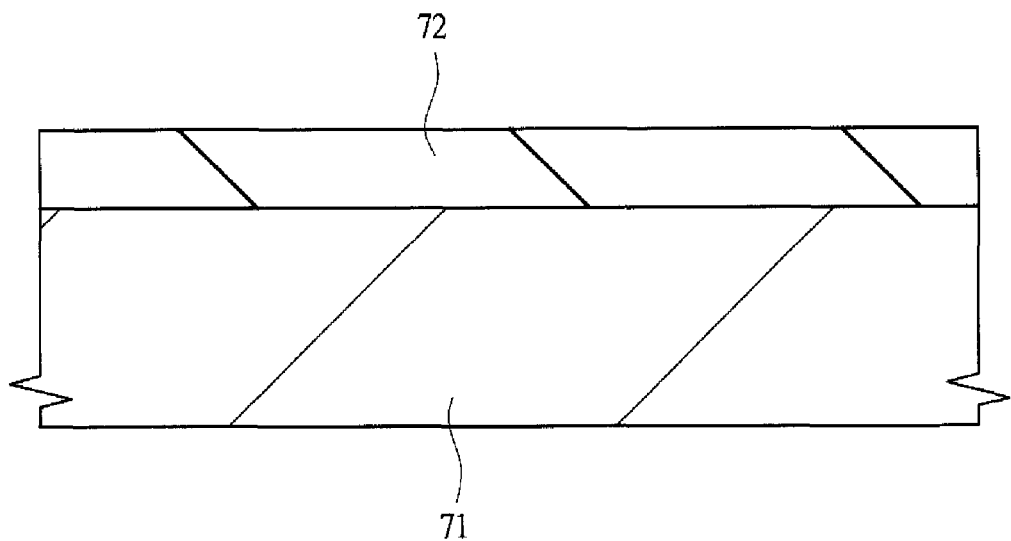
FIG. 34 is a principal part cross-sectional view of the manufacturing process of the semiconductor device of the embodiment.

That is, as shown in FIG. 34, over a semiconductor substrate 71, a material film 72 is formed (Step S11 in FIG. 33). On this occasion, between the semiconductor substrate 71 and the material film 72, another film may have been inserted. The semiconductor substrate 71 corresponds to the semiconductor substrate 41 or the semiconductor wafer SW. The material film 72 corresponds to the film to be processed 1 in FIGS. 4 to 10, to the silicon nitride film 43 in Example 1, to the lower layer film 51 in Example 2, to the lower layer film 51 in Example 3, to the lower layer film 51 in Example 4, and to the amorphous carbon layer 61 in Example 5.

Figure 35:
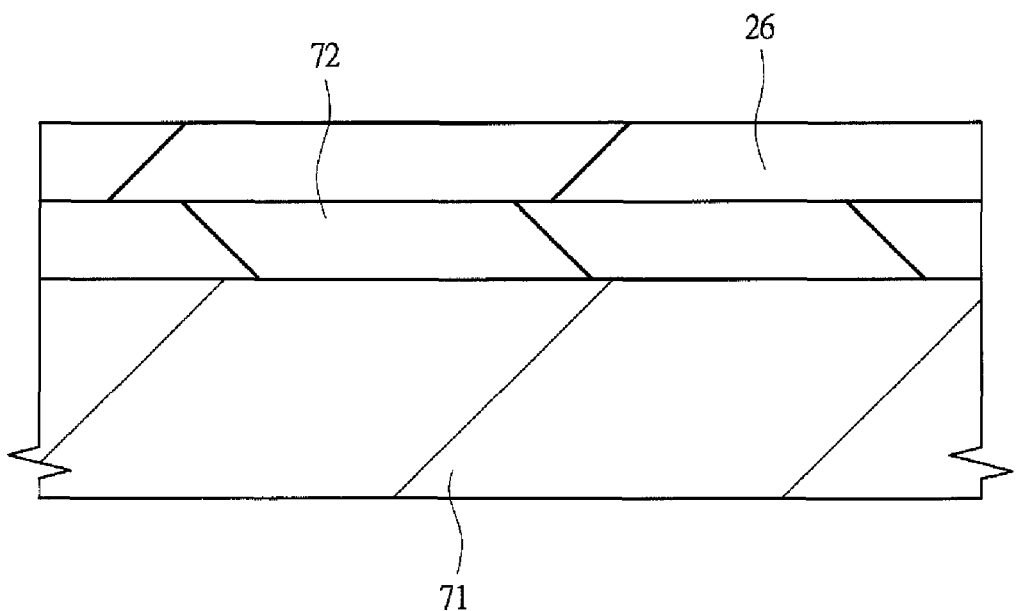
FIG. 35 is a principal part cross-sectional view of the manufacturing process of the semiconductor device following FIG. 34.

Next, as shown in FIG. 35, over the material film 72, the material film (the first material film) 26 is formed (Step S12 in FIG. 33). The material film 26 corresponds to the antireflection film 2 in FIGS. 4 to 10, to the antireflection film 44 in Example 1, to the intermediate layer 52 in Example 2, to the intermediate layer 52 in Example 3, to the intermediate layer 55 in the Example 4, and to the organic antireflection film 62 in Example 5.

Figure 36:
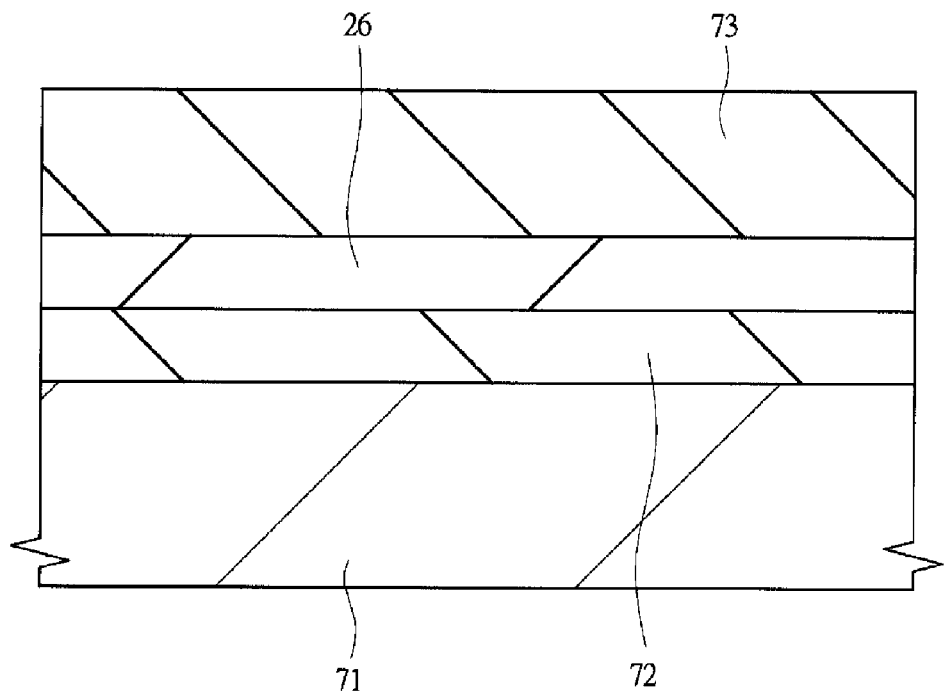
FIG. 36 is a principal part cross-sectional view of the manufacturing process of the semiconductor device following FIG. 35.

Next, as shown in FIG. 36, over the material film 26, a resist layer 73 is formed (Step S13 in FIG. 33). The resist layer 73 corresponds to the resist layer 3 in FIGS. 4 to 10, to the resist layer 45 in Example 1, to the resist layer 53 in Example 2, to the resist layer 54 in Example 3, to the resist layer 56 in Example 4, and to the resist layer 63 in Example 5. The resist layer 73 is formed on the material film 26, while contacting with the material film 26. Therefore, the material film 26 may also be considered as a foundation layer (a foundation film) of the resist layer 73.

Next, the resist layer 73 is subjected to liquid immersion exposure (Step S14 in FIG. 33).

Figure 37:
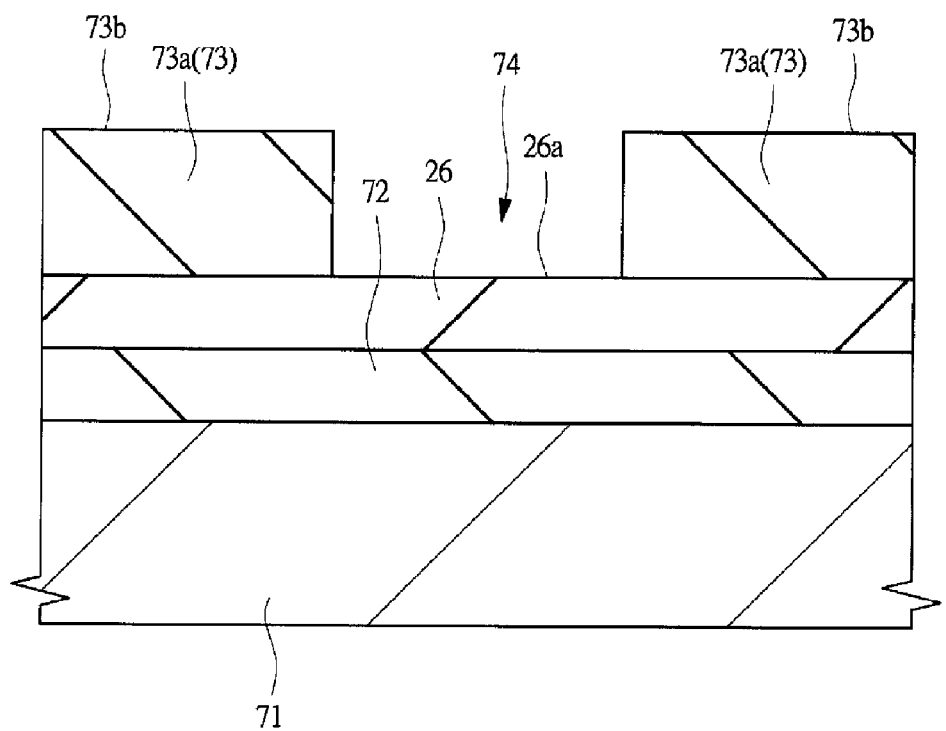
FIG. 37 is a principal part cross-sectional view of the manufacturing process of the semiconductor device following FIG. 36.

Next, the resist layer 73 is subjected to a development process (Step S15 in FIG. 33). In Step S15, as shown in FIG. 37, the material film 26 is exposed in a part from which the resist layer 73 has been removed (dissolved to be removed) by the development process, and the resist layer 73 forms a resist pattern 73a. The resist pattern 73a corresponds to the resist pattern 3a in FIGS. 4 to 10, to the resist pattern 45a in Example 1, to the resist pattern 53a in Example 2, to the resist pattern 54a in Example 3, to the resist pattern 56a in Example 4, and to the resist pattern 63a in Example 5.

The surface of the resist pattern 73a (the resist layer 73) after the development process in Step S15 (the exposed surface, uppermost surface) is a surface 73b, and the surface of the material film 26 exposed from the resist pattern 73a after the development process in Step S15 (the exposed surface) is the surface (the exposed surface) 26a. That is, the surface 26a of the material film 26 is covered with the resist layer 73 before the development process in Step S15 and contacts with the resist layer 73. But, in the development process in Step S15, a part of the resist layer 73 (a light-exposed part in the case of a positive resist, a non-light-exposed part in the case of a negative resist) dissolves in the development solution to be removed, and the surface 26a of the material film 26 is exposed from the part from which the resist layer 73 has been removed (which is called a space part 74). That is, by the development process in Step S15, the surface (the exposed surface) 26a of the material film 26 is exposed from the resist pattern 73a (the resist layer 73).

The surface 73b of the resist pattern 73a (the resist layer 73) corresponds to the surface 3b of the resist pattern 3a (the resist layer 3) in FIG. 10, to the surface 45b of the resist pattern 45a (the resist layer 45) in Example 1, and to the surface 53b of the resist pattern 53a (the resist layer 53) in Example 2. The surface 73b of the resist pattern 73a (the resist layer 73) corresponds to the surface 54b of the resist pattern 54a (the resist layer 54) in Example 3, to the surface 56b of the resist pattern 56a (the resist layer 56) in Example 4, and to the surface 63b of the resist pattern 63a (the resist layer 63) in Example 5. The space part 74 corresponds to the space part 22 in FIGS. 8 to 10.

Next, the semiconductor substrate 71 is subjected to a rinsing process (a rinsing treatment) with a rinse liquid (a rinsing liquid) (Step S16 in FIG. 33). That is, the resist layer 73 (the resist pattern 73a) and the material film 26 exposed from the resist layer 73 (the resist pattern 73a) are subjected to the rinsing process with the rinse liquid. The rinse liquid is led to contact with the surface 73b of the resist pattern 73a and the surface 26a of the material film 26 exposed from the resist pattern 73a. Consequently, the development solution etc. adhering to the semiconductor substrate 71 (the resist pattern 73a and the material film 26 exposed from the resist pattern 73a) are removed. The rinsing process can be performed, for example, by rotating the semiconductor substrate (the semiconductor wafer) 71 arranged (held) over a wafer stage, supplying the rinse liquid to the center of the rotating semiconductor substrate 71 from a nozzle, and making the rinse liquid spread over the whole main surface of the semiconductor substrate 71 by the centrifugal force.

The rinsing process in Step S16 can be performed by the same device as that of the development process in Step S15, or by a different device. When the same device is used, switching of treatment liquids to be supplied to the main surface of the semiconductor substrate 71 is performed so that the development solution is supplied to the main surface of the semiconductor substrate 71 in Step S15 and the rinse liquid is supplied to the main surface of the semiconductor substrate 71 in Step S16. In the case where the rinsing process in Step S16 and the development process in Step S15 are performed in the same device, the development process in Step S15 and the rinsing process in Step S16 can be performed continuously, which can shorten the manufacturing time of the semiconductor device to improve the throughput.

Next, the semiconductor substrate 71 is dried (Step S17 in FIG. 33). On this occasion, spin drying, in which the semiconductor substrate 71 is rotated to be dried, can be performed. In the spin drying treatment, for example, the semiconductor substrate (semiconductor wafer) 71 arranged (held) over a wafer stage can be rotated and subjected to a drying treatment, which can be performed by the same device as that of the rinsing process in Step S16, or by a different device. In the case where the rinsing process in Step S16 and the drying treatment in Step S17 are performed in the same device, the rinsing process in Step S16 and the drying treatment in Step S17 can be performed continuously, which can shorten the manufacturing time of the semiconductor device to improve the throughput. Further, in the case where the development process in Step S15, the rinsing process in Step S16 and the drying treatment in Step S17 are performed in the same device, the development process in Step S15, the rinsing process in Step S16 and the drying treatment in Step S17 can be performed continuously, which can further shorten the manufacturing time of the semiconductor device to further improve the throughput.

Figure 38:
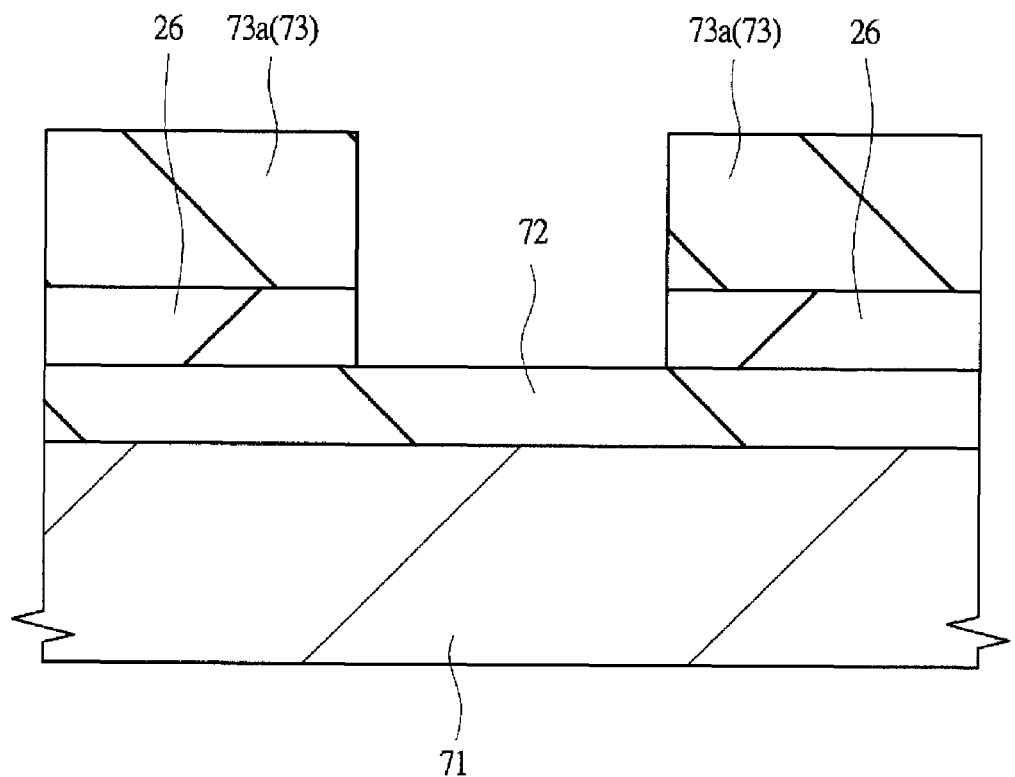
FIG. 38 is a principal part cross-sectional view of the manufacturing process of the semiconductor device following FIG. 37.

Next, as shown in FIG. 38, using the resist pattern 73a as an etching mask, the material film 26 is etched (dry-etched) (Step S18 in FIG. 33). After that, further, using the resist pattern 73a (or a stacked pattern of the resist pattern 73a and the material film 26) as an etching mask, the material film 72 is etched (dry-etched) (Step S19 in FIG. 33). In Step S19, there is such a case where not only the material film 72 but also a layer lying below the material film 72 is etched (corresponding to Example 1). Further, there is also such a case where, after Step S19, a layer lying below the material film 72 is etched using the material film 72 as an etching mask (corresponding to Examples 2 to 5).

One of the principal characteristics of the embodiment is that, when performing the rinsing process in Step S16 after performing the development process in Step S15, the water repellent property of the surface (the exposed surface) 26a of the material film 26 exposed from the resist pattern 73a (the resist layer 73) is not lower than the water repellent property of the surface 73b of the resist pattern 73a (the resist layer 73). The magnitude relation of these water repellent properties is maintained upon the drying treatment in Step S17 after the rinsing process in Step S16, and, when performing the drying treatment in Step S17, the water repellent property of the surface (the exposed surface) 26a of the material film 26 exposed from the resist pattern 73a (the resist layer 73) is not lower than the water repellent property of the surface 73b of the resist pattern 73a (the resist layer 73). Incidentally, that "the water repellent property of the surface 26a is not lower than the water repellent property of the surface 73b" means that "the water repellent property of the surface 26a is the same as the water repellent property of the surface 73b, or the water repellent property of the surface 26a is higher (greater) than the water repellent property of the surface 73b."

The degree of the water repellent property is represented by the contact angle of a droplet with a solid surface, and the higher the water repellent property the greater the contact angle θ. Therefore, the magnitude relation between water repellent properties of the surface (the exposed surface) 26a of the material film 26 exposed from the resist pattern 73a and the surface 73b of the resist pattern 73a is represented by $\theta_2 \geq \theta_1$, which is the relation in Expression 1. Incidentally, when no particular reference is made, the water repellent property is a water repellent property relative to the rinse liquid used in Step S16, and, when no particular reference is made, the contact angle is a contact angle of the rinse liquid used in Step S16 (when the droplet 31 in FIG. 11 is formed from the same kind of liquid as the rinse liquid).

Here, $\theta_1$ is the contact angle of the rinse liquid with the surface 73b of the resist pattern 73a (the resist layer 73). $\theta_2$ is the contact angle of the rinse liquid with the surface (the exposed surface) 26a of the material film 26 exposed from the resist pattern 73a (the resist layer 73) Incidentally, the rinse liquid referred to here is the same rinse liquid as that used for the rinsing process in Step S16. When pure water is used as the rinse liquid in Step S16, $\theta_1$ is the contact angle of pure water with the surface 73b of the resist pattern 73a (the resist layer 73), and $\theta_2$ is the contact angle of pure water with the surface (the exposed surface) 26a of the material film 26 exposed from the resist pattern 73a (the resist layer 73).

The contact angles $\theta_2$, $\theta_1$ can be obtained by observing a droplet of the rinse liquid adhered to the surface 73b of the resist pattern 73a or the surface 26a of the material film 26 in the rinsing process in Step S16 after the rinsing process in Step S16. Moreover, the water repellent properties of the surface 73b of the resist pattern 73a and the surface 26a of the material film 26 do not change even when the drying treatment in Step S17 is performed. Therefore, the contact angles $\theta_2$, $\theta_1$ may also be obtained by arranging a droplet of the rinse liquid same as that used in the rinsing process in Step S16 on the surface 73b of the resist pattern 73a and the surface 26a of the material film 26 before or after the drying treatment in Step S17 and observing the same.

As the result of the fact that the water repellent property of the surface (the exposed surface) 26a of the material film 26 exposed from the resist pattern 73a (the resist layer 73) is not lower than the water repellent property of the surface 73b of the resist pattern 73a (the resist layer 73) when performing the rinsing process in Step S16 after performing the development process in Step S15, as described above, such defects as explained based on FIGS. 8 and 9 can be suppressed or prevented. When representing this by another expression, as the result of the fact that the contact angle $\theta_2$ of the rinse liquid with the surface (the exposed surface) 26a of the material film 26 exposed from the resist pattern 73a (the resist layer 73) is not less than the contact angle $\theta_1$ of the rinse liquid with the surface 73b of the resist pattern 73a (the resist layer 73) (that is, $\theta_2 \geq \theta_1$) when performing the rinsing process in Step S16 after performing the development process in Step S15, as described above, such defects as explained based on FIGS. 8 and 9 can be suppressed or prevented.

Further, it is more preferable that the water repellent property of the surface (the exposed surface) 26a of the material film 26 exposed from the resist pattern 73a (the resist layer 73) is greater than the water repellent property of the surface 73b of the resist pattern 73a (that is, $\theta_2 > \theta_1$) when performing the rinsing process in Step S16 after performing the development process in Step S15, and, consequently, such defects as explained based on FIGS. 8 and 9 can be suppressed or prevented more adequately. Accordingly, the manufacturing yield of the semiconductor device can be improved more adequately.

Further, the relation of $\theta_2 \geq \theta_1$ (more preferably $\theta_2 > \theta_1$) is satisfied when performing the rinsing process in Step S16 after performing the development process in Step S15 and is also maintained after the finish of the rinsing process in Step S16, and the relation of $\theta_2 \geq \theta_1$ (more preferably $\theta_2 > \theta_1$) is satisfied also in the drying treatment in Step S17. Accordingly, when performing the drying treatment in Step S17 after performing the rinsing process in Step S16, the water repellent property of the surface (the exposed surface) 26a of the material film 26 exposed from the resist pattern 73a is not lower than the water repellent property of the surface 73b of the resist pattern 73a (that is, $\theta_2 \geq \theta_1$), and, more preferably, is greater than the water repellent property of the surface 73b of the resist pattern 73a (that is, $\theta_2 > \theta_1$). Consequently, in the drying treatment in Step S17, the rinse liquid does not lie stable (is not held) in the space part 74 (corresponding to the space part 22) and is likely to move outside the space part 74. Further, even in the case where the space part 74 exists when the droplet of the rinse liquid is moving toward the periphery of the semiconductor wafer over the semiconductor wafer, the droplet is hardly trapped by the space part 74. Therefore, the generation of defects (defects as explained based on FIGS. 8 and 9) caused by the drying of the rinse liquid in the space part 74 of the resist pattern 73a (corresponding to the space part 22) can adequately be suppressed or prevented. Accordingly, the manufacturing yield of the semiconductor device can be improved.

As to the drying treatment in Step S17, spin drying, in which the semiconductor substrate (semiconductor wafer) 71 is rotated, is preferably performed. Consequently, since the spin drying is performed in a state where the relation of $\theta_2 \geq \theta_1$ (more preferably $\theta_2 > \theta_1$) is satisfied, with the centrifugal force of the spin drying, the rinse liquid moves from the space part 74 (corresponding to the space part 22) to the outside of the space part 74, which enables the defects as explained based on FIGS. 8 and 9 to be suppressed or prevented further adequately. Accordingly, the manufacturing yield of the semiconductor device can be improved further adequately.

FIG. 39 is a table representing collectively the relation between contact angles of the material film 26 and the resist layer 73, before the liquid immersion exposure in Step S14 and after the development process in Step S15.

The table in FIG. 39 shows the magnitude relation between $\theta_1$, $\theta_2$ and $\theta_3$. As described above, $\theta_1$ is the contact angle of the rinse liquid with the surface 73b of the resist pattern 73a (the resist layer 73), and $\theta_2$ is the contact angle of the rinse liquid with the surface (the exposed surface) 26a of the material film 26 exposed from the resist pattern 73a (the resist layer 73). $\theta_3$ is the contact angle of the rinse liquid with the surface 73b of the resist layer 73 when performing the liquid immersion exposure in Step S14. Incidentally, the rinse liquid here is the same rinse liquid as that used in the rinsing process in Step S16, and, when pure water is used as a rinse liquid in Step S16, $\theta_3$ is the contact angle of pure water with the surface of the resist layer 73.

The contact angle $\theta_3$ may be obtained by arranging a droplet of the same rinse liquid as that used in the rinsing process in Step S16 on the surface of the resist layer 73 and observing the same, before the performance of the liquid immersion exposure in Step S14.

In Example 2, as is known from the table in FIG. 39, in both cases of before the liquid immersion exposure in Step S14 and after the development process in Step S15 (that is, when performing the rinsing process in Step S16 and the drying treatment in Step S17), the contact angle $\theta_2$ of the surface of the material film 26 was not lower than contact angles $\theta_1$, $\theta_3$ of the surface of the resist layer 73 (that is, $\theta_2 \geq \theta_1$ and $\theta_2 \geq \theta_3$). That is, in both cases of before the liquid immersion exposure in Step S14 and after the development process in Step S15 (that is, when performing the rinsing process in Step S16 and the drying treatment in Step S17), the water repellent property of the surface of the material, film 26 was not lower than the water repellent property of the surface of the resist layer 73. In Example 2, after the development process in Step S15 (that is, when performing the rinsing process in Step S16 and the drying treatment in Step S17), the water repellent property of the surface of the material film 26 exposed from the resist pattern 73a is not lower than the water repellent property of the surface of the resist pattern 73a (the resist layer 73) (that is, $\theta_2 \geq \theta_1$), which, as described above, can suppress or prevent defects as explained based on FIGS. 8 and 9.

Meanwhile, in Examples 1 and 3 to 5, as is known from the table in FIG. 39, before the liquid immersion exposure in Step S14, the contact angle $\theta_3$ of the surface of the resist layer 73 is greater than the contact angle $\theta_2$ of the surface of the material film 26 (that is, $\theta_3 > \theta_2$). That is, before the liquid immersion exposure in Step S14, the water repellent property of the surface of the resist layer 73 is higher (greater) than the water repellent property of the surface of the material film 26. And, after the development process in Step S15 (that is, when performing the rinsing process in Step S16 and the drying treatment in Step S17), the contact angle $\theta_2$ of the surface of the material film 26 exposed from the resist pattern 73a is not lower than the contact angle $\theta_1$ of the surface of the resist pattern 73a (that is, $\theta_2 \geq \theta_1$). That is, after the development process in Step S15 (that is, when performing the rinsing process in Step S16 and the drying treatment in Step S17), the water repellent property of the surface 26a of the material film 26 exposed from the resist pattern 73a is not lower than the water repellent property of the surface 73b of the resist pattern 73a. In this case, since $\theta_2 \geq \theta_1$ after the development process in Step S15 (that is, when performing the rinsing process in Step S16 and the drying treatment in Step S17), an effect of suppressing or preventing defects as explained based on FIGS. 8 and 9 can be obtained, and, since $\theta_3 > \theta_2$ before the liquid immersion exposure in Step S14, an effect below can additionally be obtained.

That is, in the liquid immersion exposure in Step S14, as explained referring to FIG. 1, a higher water repellent property of the resist layer 73 is more preferable. On the other hand, preferably the water repellent property of the material film 26 is not made too high, in order to make the formation of the resist layer 73 easy over the material film 26. And, in order to suppress or prevent defects as explained based on FIGS. 8 and 9, as described above, it is necessary to make the water repellent property of the surface of the material film 26 exposed from the resist pattern 73a become not lower than the water repellent property of the surface of the resist pattern 73a (that is, results in $\theta_2 \geq \theta_1$) after the development process in Step S15 (that is, when performing the rinsing process in Step S16 and the drying treatment in Step S17).

Consequently, when designing so that both a high water repellent property of the surface of the resist layer 73 in the liquid immersion exposure in Step S14 and the relation of $\theta_2 \geq \theta_1$ after the development process in Step S15 are to be satisfied, the surface of the resist layer 73 is set to have a water repellent property higher than that of the surface of the material film 26 so that the relation of $\theta_3 > \theta_2$ will be satisfied before the liquid immersion exposure in Step S14. And, it is designed so that the water repellent property of the surface of the resist layer 73 is not higher than the water repellent property of the surface of the material film 26 to satisfy the relation of $\theta_2 \geq \theta_1$ after the development process in Step S15 (that is, when performing the rinsing process in Step S16 and the drying treatment in Step S17). In order to realize this, it is necessary that such a high water repellent property of the surface of the resist layer 73 as satisfied the relation of $\theta_3 > \theta_2$ in the liquid immersion exposure in Step S14 has been lowered to a water repellent property that satisfies the relation of $\theta_2 \geq \theta_1$ after the development process in Step S15. Specific techniques thereof are different between Example 1 and Examples 3 to 5.

That is, in Example 1, over the surface of the resist layer 45 (corresponding to the resist layer 73), a topcoat layer having a high water repellent property (a water repellent property higher than that of the surface of the resist layer 45 before the formation of the topcoat layer) is formed, and the topcoat layer enhances the water repellent property of the surface of the resist layer 45 (in this case, the topcoat layer configures the surface of the resist layer 45) to enable the relation of $\theta_3 > \theta_2$ to be satisfied before the liquid immersion exposure in Step S14 (upon the liquid immersion exposure in Step S14). Then, when performing the development process in Step S15 after the liquid immersion exposure in Step S14, the topcoat layer over the surface of the resist layer 45 dissolves in the development solution and is removed from the surface of the resist layer 45. Therefore, the water repellent property (the contact angle) of the surface of the resist layer 45 (the resist pattern 45a) lowers (that is, results in $\theta_3 > \theta_2$). Consequently, it is possible to make the relation of $\theta_2 \geq \theta_1$ be satisfied after the development process in Step S15 (that is, when performing the rinsing process in Step S16 and the drying treatment in Step S17).

That is, in Example 1, the resist layer 73 (corresponding to the resist layer 45) is formed in Step S13, the topcoat layer (the topcoat layer having a water repellent property higher than that of the surface of the resist layer 73 before the formation of the topcoat layer) is formed over the surface of the resist layer 73, and, after that, the liquid immersion exposure is performed in Step S14. In the liquid immersion exposure in Step S14, the topcoat layer having a high water repellent property configures the surface of the resist layer 73, and, in the development process in Step S15, the topcoat layer is removed from the surface of the resist layer 73 by the development solution to lower the water repellent property of the surface of the resist layer 73. Consequently, before the liquid immersion exposure in Step S14, the water repellent property of the surface of the resist layer 73 formed from the topcoat layer was higher than the water repellent property of the surface of the material film 26 (that is, $\theta_3 > \theta_2$). But, after the development process in Step S15, the water repellent property of the surface 73b of the resist pattern 73a is not higher than the water repellent property of the surface 26a of the material film 26 exposed from the resist pattern 73a (that is, $\theta_2 \geq \theta_1$).

In Example 3, it is so configured that the water repellent additive is made to segregate over the surface of the resist layer 54 in forming the resist layer 54 (corresponding to the resist layer 73), which enhances the water repellent property of the surface of the resist layer 54 to satisfy the relation of $\theta_3 > \theta_2$ before the liquid immersion exposure in Step S14 (in the liquid immersion exposure in Step S14). Then, when performing the development process in Step S15 after the liquid immersion exposure in Step S14, the water repellent additive segregated over the surface of the resist layer 54 changes the polarity thereof to make the surface of the resist layer 54 (the resist pattern 54a) hydrophilic, thereby lowering the water repellent property (the contact angle) (that is, results in $\theta_3 > \theta_1$). That is, by the contact with the development solution in the development process in Step S15, the water repellent property of the surface of the resist layer 54 (the resist layer 73) lowers (that is, results in $\theta_3 > \theta_1$). Consequently, it is possible to make the relation of $\theta_2 \geq \theta_1$ be satisfied after the development process in Step S15 (that is, when performing the rinsing process in Step S16 and the drying treatment in Step S17). That is, before the liquid immersion exposure in Step S14, the water repellent property of the surface of the resist layer 73 over which the water repellent additive had segregated was higher than the water repellent property of the surface of the material film 26 (that is, $\theta_3 > \theta_2$), but, after the development process in Step S15, the water repellent property of the surface 73b of the resist pattern 73a is not higher than the water repellent property of the surface 26a of the material film 26 exposed from the resist pattern 73a (that is, $\theta_2 \geq \theta_1$). The same can be said for Examples 4 and 5 (but, in the case of Example 4, resist layer 54 is replaced by the resist layer 56, and, in the case of Example 5, the resist layer 54 is replaced by the resist layer 63).

As described above, it is designed so that the water repellent property of the resist layer 73 is enhanced to satisfy the relation of $\theta_3 > \theta_2$ before the liquid immersion exposure in Step S14 (in the liquid immersion exposure in Step S14), and that the water repellent property of the surface of the resist layer 73 is lowered as compared with that before the liquid immersion exposure in Step S14 (that is, set to be $\theta_3 > \theta_1$) after the development process in Step S15 (that is, when performing the rinsing process in Step S16 and the drying treatment in Step S17) to satisfy the relation of $\theta_2 \geq \theta_1$. Consequently, it is possible to make the liquid immersion exposure in Step S14 be performed more adequately and, at the same time, to suppress or prevent defects as explained based on FIGS. 8 and 9, thereby improving the manufacturing yield of the semiconductor device.

Further, as is also known from FIG. 17, for the purpose of making the resist layer 73 be formed easily, the contact angle $\theta_2$ of the surface of the material film 26 is preferably set to be not greater than 80° (that is, $\theta_2 \geq 80°$), more preferably set to be not greater than 78° (that is, $\theta_2 \geq 78°$).

The rinse liquid used in the rinsing process in Step S16 is preferably pure water, but, in some cases, a liquid obtained by adding a surfactant to pure water may be used.

It is possible to form the material film 26 having a fluororesin segregated over the surface thereof, by setting an organic film containing carbon (C) as a main component or an organic film containing carbon (C) and silicon (Si) as main components as the material film 26, incorporating a fluororesin in the chemical solution for forming the material film 26 in Step S12, and applying the chemical solution over the semiconductor substrate (the semiconductor wafer) 71. Consequently, it is possible to enhance the water repellent property of the surface of the material film 26, thereby making it easy to satisfy the relation of $\theta_2 \geq \theta_1$ after the development process in Step S15 (that is, when performing the rinsing process in Step S16 and the drying treatment in Step S17). The fluororesin contained in the material film 26 is preferably insoluble in the development solution used in the development process in Step S15. Consequently, a high water repellent property of the surface of the material film 26 is maintained to make it easier to satisfy the relation of $\theta_2 \geq \theta_1$ after the development process in Step S15 (that is, when performing the rinsing process in Step S16 and the drying treatment in Step S17). The fluororesin contained in the material film 26 is preferably a resin obtained by polymerizing a monomer formed from a monomer represented by Formula 1.

Further, it is also possible to enhance the water repellent property of the surface of the material film 26 by a treatment with a chemical solution of a water repellent agent containing a water repellent agent and a solvent, after forming the material film 26 in Step S12 and before forming the resist layer 73 in Step S13. Consequently, it is possible to enhance the water repellent property of the surface of the material film 26, thereby making it easy to satisfy the relation of $\theta_2 \geq \theta_1$ after the development process in Step S15 (that is, when performing the rinsing process in Step S16 and the drying treatment in Step S17). As the water repellent agent to be used on this occasion, more preferable is the use of one containing at least any one among a fluorine-based water repellent agent, a silicone-based water repellent agent, a fluorine-silicone-based water repellent agent, a silane coupling agent, a silylating agent, an alkylating agent and an acylating agent.

Hereinbefore, Examples are shown while referring to an STI process formation method as an example, but, needless to say, the present invention is applicable to a lithographic process in another process (preferably a process of forming an opening such as a hole or a trench) in the same manner, to a process using or not using a topcoat process or a topcoat-less resist, independently of an exposure light source.

Next, as an example of a manufacturing process of a semiconductor device to which the embodiment is applied, here a manufacturing process of a semiconductor device having a MISFET (a Metal Insulator Semiconductor Field Effect Transistor) will be explained while referring to FIGS. 40 to 52.

FIGS. 40 to 52 are principal part cross-sectional views in a manufacturing process of the semiconductor device of the embodiment.

Figure 40:
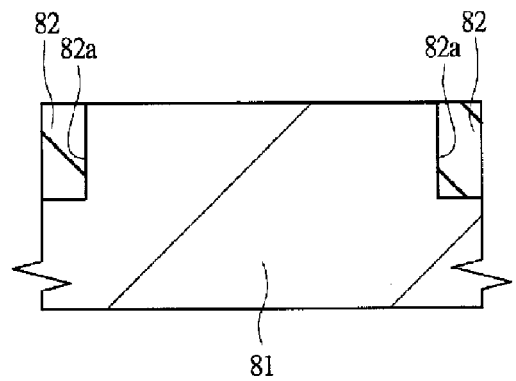
FIG. 40 is a principal part cross-sectional view of the manufacturing process of a semiconductor device that is an embodiment of the present invention.

First, as shown in FIG. 40, a semiconductor substrate (a semiconductor wafer) 81 including, for example, a p-type single crystalline silicon having a specific resistance of 1 to 10 Ωcm etc. is prepared. Then, over the main surface of the semiconductor substrate 81, an element isolation region 82 is formed. The element isolation region 82 includes an insulator such as silicon oxide and is formed by an STI (Shallow Trench Isolation) process. The element isolation region 82 is formed from an insulating film embedded in a trench (an element isolation trench) 82a formed in the semiconductor substrate 81. The trench 82a corresponds to the trench 47 in Examples 1 to 5, and the element isolation region 82 corresponds to the element isolation region 49 in Examples 1 to 5. The trench 82a and the element isolation region 82 can be formed in a manner as Examples 1 to 5.

Figure 41:
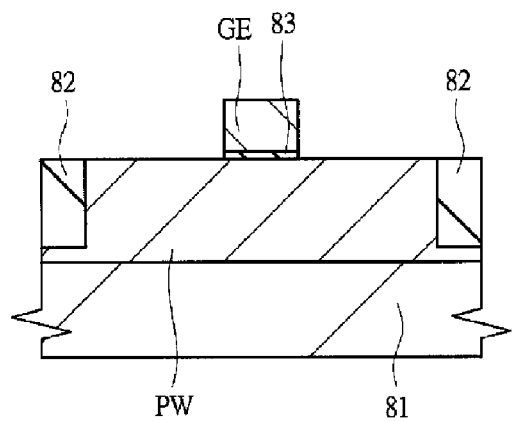
FIG. 41 is a principal part cross-sectional view in the manufacturing process of the semiconductor device following FIG. 40.

Next, as shown in FIG. 41, a p-type well (a well region) PW is formed from the main surface of the semiconductor substrate 81 over a prescribed depth. The p-type well PW can be formed, for example, by ion-implanting such a p-type impurity as boron (B) into the semiconductor substrate 81 in an n-channel type MISFET formation-scheduled region, etc. An ion implantation for adjusting a threshold value is also performed.

Next, by wet etching, for example, using an aqueous hydrogen fluoride (HF) solution, the surface of the semiconductor substrate 81 is made clean (cleaned), and, after that, a gate insulating film 83 is formed over the surface of the semiconductor substrate 81 (that is, the surface of the p-type well PW). The gate insulating film 83 includes, for example, a thin silicon oxide film etc., and can be formed, for example, by a thermal oxidation method. As the gate insulating film 83, in place of a silicon oxide film, a silicon nitride oxide film etc. may be formed.

Next, over the semiconductor substrate 81 (that is, over the gate insulating film 83 of the p-type well PW), a conductor film (for example, a doped polysilicon film) for forming a gate electrode is formed, and the conductor film is patterned using a lithographic method and a dry etching method to form a gate electrode GE.

Figure 42:
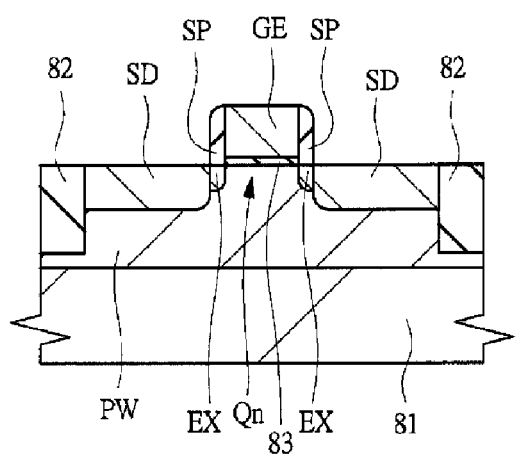
FIG. 42 is a principal part cross-sectional view in the manufacturing process of the semiconductor device following FIG. 41.

Next, as shown in FIG. 42, such an n-type impurity as phosphorus (P) or arsenic (As) is ion-planted into regions on both sides of the gate electrode GE of the semiconductor substrate 81 (the p-type well PW) to form (a pair of) n⁻-type semiconductor regions (extension regions, source/drain extension regions) EX. In the ion implantation for forming the n⁻-type semiconductor region EX, since ions are implanted into the semiconductor substrate 81 (the p-type well PW) using the gate electrode GE as a mask (an ion implantation-preventing mask), no ion is implanted into the region directly below the gate electrode GE in the p-type well PW by shielding by the gate electrode GE.

Next, over a side wall of the gate electrode GE, as a side wall insulating film (an insulating film), a sidewall spacer (a sidewall, side wall spacer, side wall insulating film) SP including, for example, silicon oxide, silicon nitride or a stacked film of these insulating films is formed. The sidewall spacer SP can be formed, for example, by depositing a silicon oxide film, a silicon nitride film or a stacked film thereof over the semiconductor substrate 81 so as to cover the gate electrode GE, and anisotropically etching the silicon oxide film, the silicon nitride film or the stacked film thereof by an RIE (Reactive Ion Etching) method etc.

Next, such an n-type impurity as phosphorous (P) or arsenic (As) is ion-implanted into regions on both sides of the gate electrode GE and the sidewall spacer SP of the semiconductor substrate 81 (the p-type well PW) to form an n⁺-type semiconductor region SD (source, drain). In the ion implantation for forming the n⁺-type semiconductor region SD, since ions are implanted into the semiconductor substrate 81 (the p-type well PW) using the gate electrode GE and the sidewall spacer SP over the side wall thereof as a mask (an ion implantation-preventing mask), no ion is implanted into regions directly below the gate electrode GE and the sidewall spacer SP in the p-type well PW by shielding by the gate electrode GE and the sidewall spacer SP. Consequently, the n⁻-type semiconductor region EX is formed to be aligned (self-aligned) with the gate electrode GE, and the n⁺-type semiconductor region SD is formed to be aligned (self-aligned) with the sidewall spacer SP over the side wall of the gate electrode GE.

Next, an annealing treatment (activation annealing, heat treatment) for activating impurities having been introduced by ion implantations until now is performed.

As described above, for the p-type well PW of the semiconductor substrate 81, an n-channel type MISFET (a Metal Insulator Semiconductor Field Effect Transistor) Qn is formed as a field effect transistor to give the structure in FIG. 5. Although a case where an n-channel type MISFET is formed is explained, it is also possible, while reversing the conductivity type, to form a p-channel type MISFET.

Further, it is also possible to form both an n-channel type MISFET and a p-channel type MISFET.

The n⁺-type semiconductor region SD has a higher impurity concentration and a deeper junction depth as compared with the n⁻-type semiconductor region EX. Consequently, an n-type semiconductor region (an impurity-diffused layer) functioning as a source or a drain of an n-channel type MISFET Qn is formed by the n⁺-type semiconductor region SD and the n⁻-type semiconductor region EX. Accordingly, the source/drain region of the n-channel type MISFET Qn has an LDD (Lightly doped Drain) structure.

Figure 43:
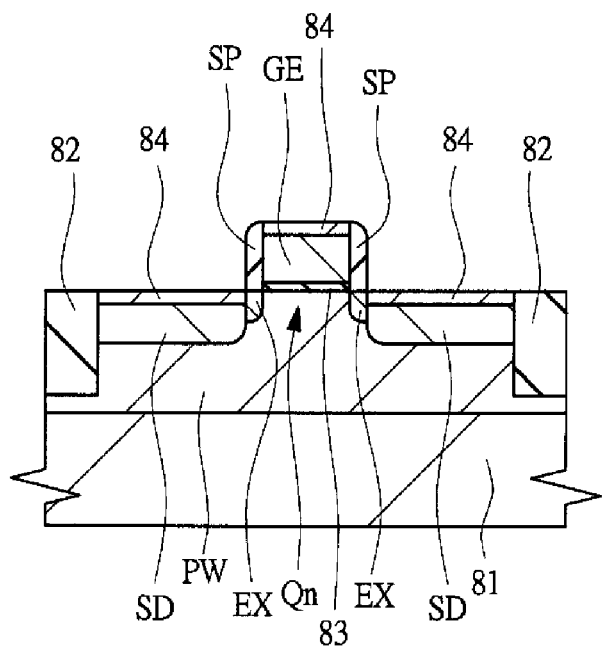
FIG. 43 is a principal part cross-sectional view in the manufacturing process of the semiconductor device following FIG. 42.

Next, as shown in FIG. 43, over the surface (a surface layer part, upper layer part) of the gate electrode GE and the n⁺-type semiconductor region SD, a metal silicide layer 84 of a low resistivity is formed by a salicide (Self Aligned Silicide) technology.

Figure 44:
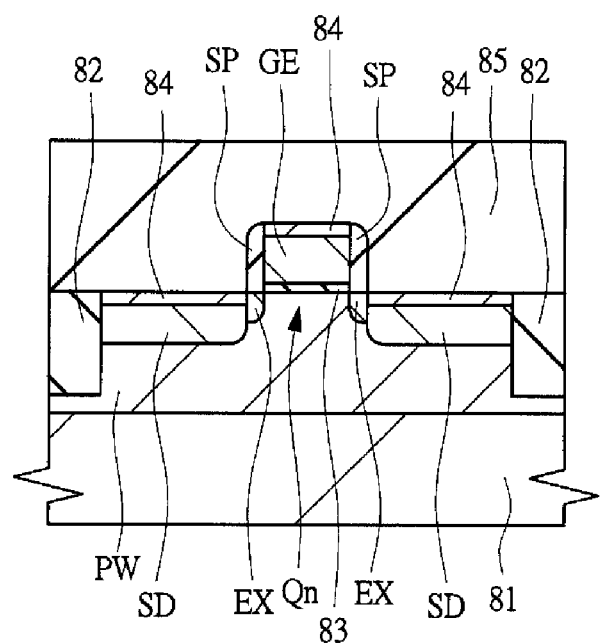
FIG. 44 is a principal part cross-sectional view in the manufacturing process of the semiconductor device following FIG. 43.

For example, by exposing the surface (the upper surface) of the gate electrode GE and the n⁺-type semiconductor region SD, depositing, for example, a metal film such as a cobalt (Co) film or a nickel (Ni) film and subjecting the film to a heat treatment, as shown in FIG. 44, the metal silicide layer 84 can be formed over each of surfaces (surface layer parts, upper layer parts) of the gate electrode GE and the n⁺-type semiconductor region SD. Consequently, the diffusion resistance, contact resistance etc. of the n⁺-type semiconductor region SD can be made low. After that, an unreacted metal film is removed.

Next, as shown in FIG. 44, over the main surface of the semiconductor substrate 81, an insulating film (an interlayer insulating film) 85 is formed. That is, so as to cover the gate electrode GE and the sidewall spacer SP, the insulating film 85 is formed over the semiconductor substrate 81 including over the metal silicide layer 84. The insulating film 85 includes, for example, a single film of a silicon oxide film, a stacked film of a silicon nitride film and a silicon oxide film thicker than the silicon nitride film, or the like. After that, the surface (the upper surface) of the insulating film 85 is polished by a CMP method, or the like to flatten the upper surface of the insulating film 85. Even when irregular shapes are formed for the surface of the insulating film 85 caused by foundation steps, the polishing of the insulating film 85 by a CMP method can give an interlayer insulating film having a flattened surface.

Next, a contact hole CNT is formed by the technique explained in Examples 1 to 5 or FIGS. 33 to 39. The formation process of the contact hole CNT will be explained while referring to FIGS. 45 to 47, and, here, a case where the technique in Example 1 is applied is explained.

Figure 45:
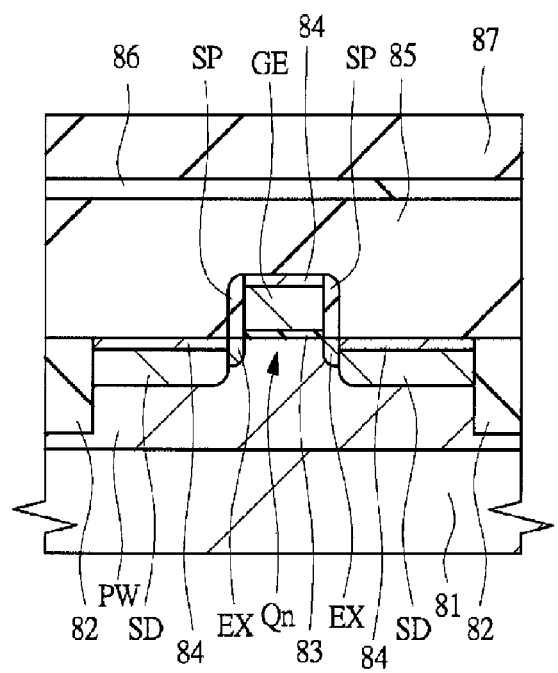
FIG. 45 is a principal part cross-sectional view in the manufacturing process of the semiconductor device following FIG. 44.

First, as shown in FIG. 45, over the insulating film 85, an antireflection film 86 is formed in the same manner as the antireflection film 44 in Example 1, and, after that, over the antireflection film 86, a resist layer (a photoresist layer) 87 is formed in the same manner as the resist layer 45 in Example 1. Since a topcoat layer (a topcoat layer having a water repellent property higher than that of the surface of the resist layer 87 before the formation of the topcoat layer) is also formed over the surface of the resist layer 87, as is the case for the resist layer 45, the water repellent property of the surface of the resist layer 87 is higher than the water repellent property of the antireflection film 86. Incidentally, in this case, the insulating film 85 corresponds to the material film 72 in FIGS. 33 to 38, the antireflection film 86 corresponds to the material film 26 in FIGS. 33 to 38, and the resist layer 87 corresponds to the resist layer 73 in FIGS. 33 to 38.

Figure 46:
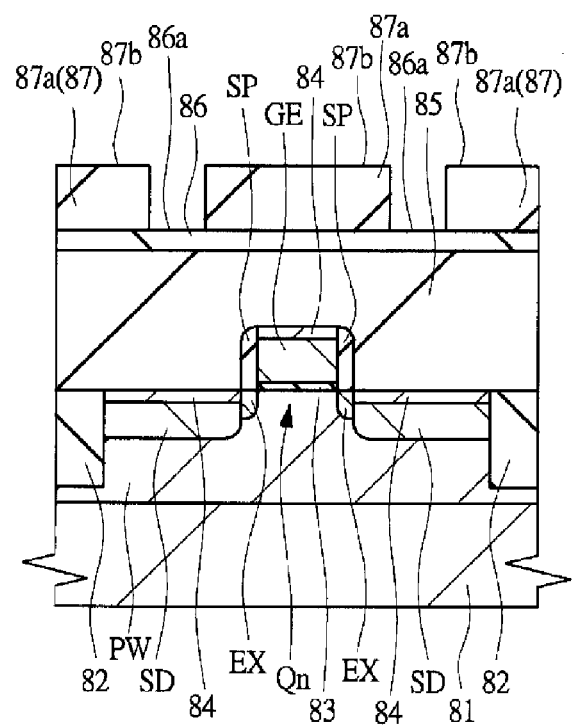
FIG. 46 is a principal part cross-sectional view in the manufacturing process of the semiconductor device following FIG. 45.

Next, as shown in FIG. 46, the resist layer 87 is subjected to liquid immersion exposure, to a development process, and further to a rinsing process and drying treatment (spin drying), in the same manner as Example 1. Consequently, the resist layer 87 is formed into a resist pattern 87a. After the development process (when performing a rinsing process and drying treatment), the water repellent property of a surface 87b of the resist layer 87 (the resist pattern 87a) is not higher than the water repellent property of the surface 86a of the antireflection film 86 exposed from the resist layer 87 (the resist pattern 87a). This is, mainly, because the topcoat layer formed over the surface of the resist layer 87 has been dissolved and removed in the development solution. The magnitude relation between water repellent properties enables defects as explained based on FIGS. 8 and 9 to be suppressed or prevented.

Figure 47:
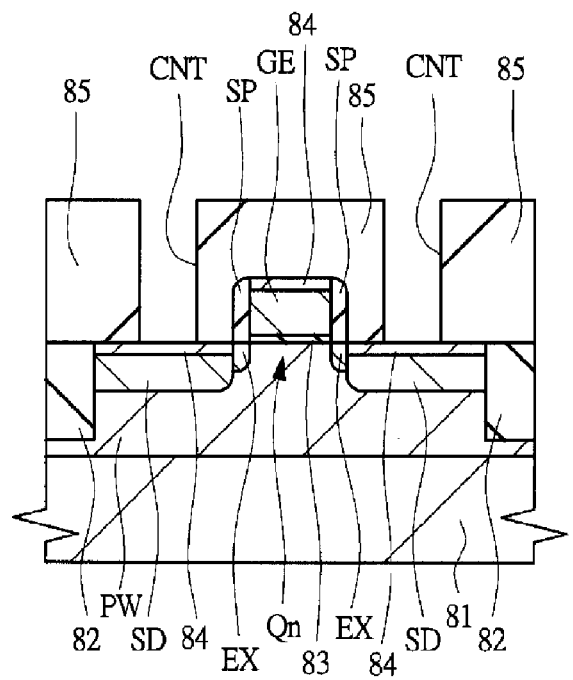
FIG. 47 is a principal part cross-sectional view in the manufacturing process of the semiconductor device following FIG. 46.

Next, in the same manner as Example 1, by dry-etching the antireflection film 86 using the resist pattern 87a as an etching mask, and, further, dry-etching the insulating film 85 using the resist pattern 87a (or the stacked pattern of the resist pattern 87a and the antireflection film 86) as an etching mask, as shown in FIG. 47, a contact hole (a through hole, hole) CNT is formed in the insulating film 85. After that, remaining resist pattern 87a and antireflection film 86 are removed by ashing or the like. The contact hole CNT corresponds to the trench 47 in Examples 1 to 5, and the insulating film 85 corresponds to a combination of the semiconductor substrate 41, the silicon oxide film 42 and the silicon nitride film 43 in a part where the trench 47 is formed in Examples 1 to 5.

When applying Example 2 to the formation process of the contact hole CNT, in place of the antireflection film 86 and the resist layer 87, the lower layer film 51, the intermediate layer 52 and the resist layer 53 are formed over the insulating film 85 in the same manner as Example 2, and, continuously, the same processes as those in Example 2 are performed to form the contact hole CNT corresponding to the trench 47. When applying Example 3 to the formation process of the contact hole CNT, in place of the antireflection film 86 and the resist layer 87, the lower layer film 51, the intermediate layer 52 and the resist layer 54 are formed over the insulating film 85 in the same manner as Example 3, and, continuously, the same processes as those in Example 3 are performed to form the contact hole CNT corresponding to the trench 47. When applying Example 4 to the formation process of the contact hole CNT, in place of the antireflection film 86 and the resist layer 87, the lower layer film 51, the intermediate layer 55 and the resist layer 56 are formed over the insulating film 85 in the same manner as Example 4, and, continuously, the same processes as those in Example 4 are performed to form the contact hole CNT corresponding to the trench 47. When applying Example to the formation process of the contact hole CNT, in place of the antireflection film 86 and the resist layer 87, the amorphous carbon layer 61, the organic antireflection film 62 and the resist layer 63 are formed over the insulating film 85 in the same manner as Example 5, and, continuously, the same processes as those in Example 5 are performed to form the contact hole CNT corresponding to the trench 47.

At the bottom part of the contact hole CNT, a part of the main surface of the semiconductor substrate 81, for example, a part of the metal silicide layer 84 over the surface of the $n^+$-type semiconductor region SD, a part of the metal silicide layer 84 over the surface of the gate electrode GE, etc. are exposed.

Figure 48:
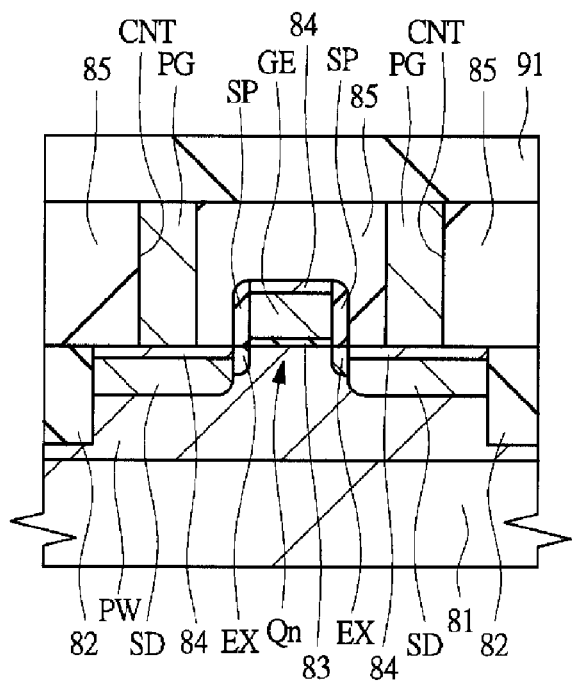
FIG. 48 is a principal part cross-sectional view in the manufacturing process of the semiconductor device following FIG. 47.

Next, as shown in FIG. 48, in the contact hole CNT, a conductive plug (a conductor part for connection) PG including tungsten (W) or the like is formed. In order to form the plug PG, for example, over the insulating film 85 including the inside of the contact hole CNT (over the bottom part and the side wall), a barrier conductor film (for example, a titanium film, a titanium nitride film, or a stacked film thereof) is formed by a plasma CVD method or the like. Then, a main conductor film including a tungsten film or the like is formed over the barrier conductor film so as to be embedded in the contact hole CNT by a CVD method or the like, and the plug PG can be formed by removing an unnecessary main conductor film and barrier conductor film over the insulating film 85 by a CMP method, an etch back method or the like. For simplifying the drawing, the plug PG is shown while integrating the main conductor film and the barrier conductor film. The plug PG contacts at the bottom thereof with the metal silicide layer 84 over the surface of the gate electrode GE, the $n^+$-type semiconductor region SD, or the like to be connected electrically.

Next, over the insulating film 85 in which the plug PG is embedded, an insulating film 91 is formed. The insulating film 91 may also be formed from a stacked film of a plurality of insulating films.

Next, by a single damascene method, a wiring M1 being a first layer wiring is formed. In order to form the wiring M1 by a damascene method, formation of a trench (a wiring trench) TR for the wiring M1 is necessary. The trench TR is formed by the technique explained in Examples 1 to 5 or FIGS. 33 to 39. The formation process of the trench TR will be explained with reference to FIGS. 49 to 51. Here, a case to which the technique in Example 1 is applied is explained.

Figure 49:
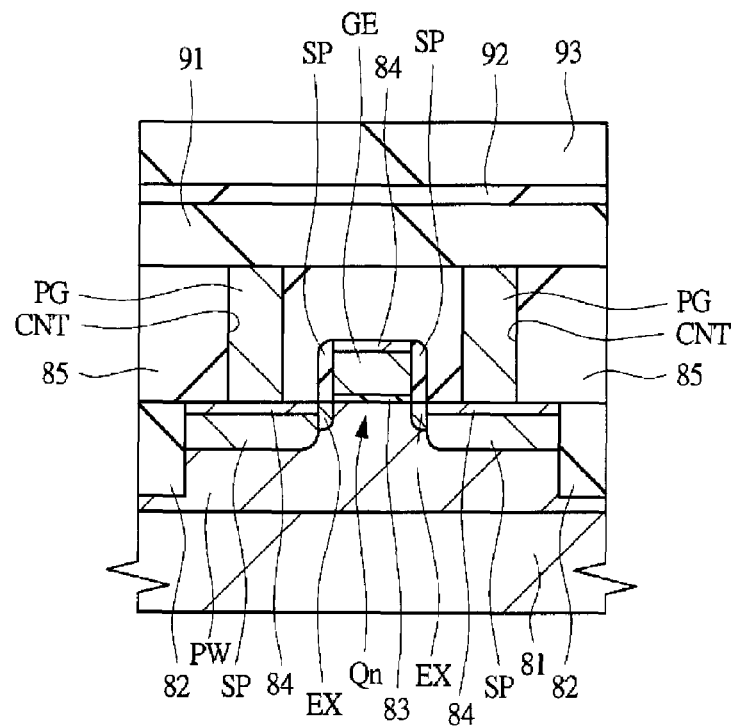
FIG. 49 is a principal part cross-sectional view in the manufacturing process of the semiconductor device following FIG. 48.

First, as shown in FIG. 49, over the insulating film 91, an antireflection film 92 is formed in the same manner as the antireflection film 44 in Example 1, and, after that, over the antireflection film 92, a resist layer (a photoresist layer) 93 is formed in the same manner as the resist layer 45 in Example 1. As is the case for the resist layer 45, since a topcoat layer (a topcoat layer having a water repellent property higher than that of the surface of the resist layer 93 before the formation of the topcoat layer) is formed over the surface of the resist layer 93, the water repellent property of the surface of the resist layer 93 is higher than the water repellent property of the antireflection film 92. Incidentally, in this case, the insulating film 91 corresponds to the material film 72 in FIGS. 33 to 38, the antireflection film 92 corresponds to the material film 26 in FIGS. 33 to 38, and the resist layer 93 corresponds to the resist layer 73 in FIGS. 33 to 38.

Figure 50:
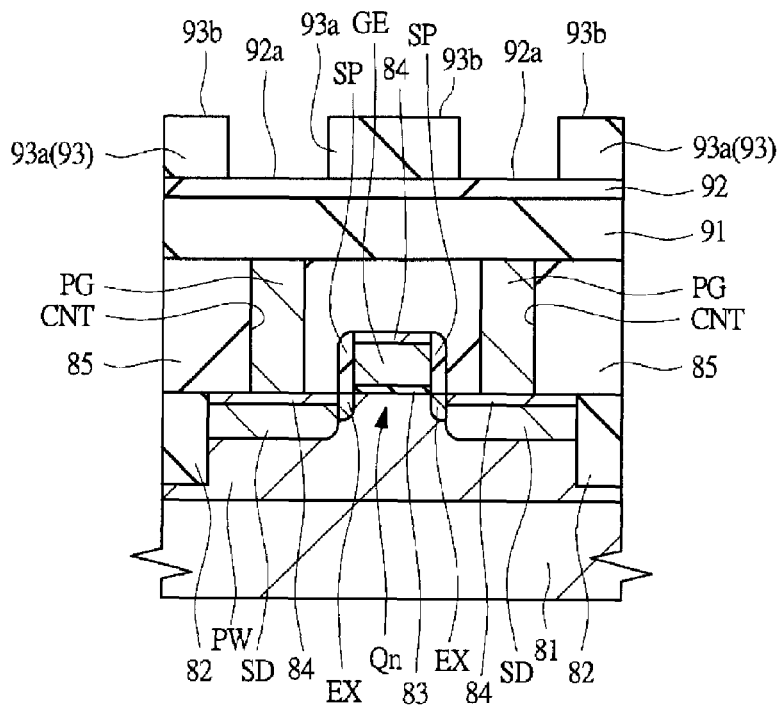
FIG. 50 is a principal part cross-sectional view in the manufacturing process of the semiconductor device following FIG. 49.

Next, as shown in FIG. 50, in the same manner as Example 1, the resist layer 93 is subjected to liquid immersion exposure, to a development process and, further, to a rinsing process and drying treatment (spin drying). Consequently, the resist layer 93 is formed into the resist pattern 93a. After the development process (when performing the rinsing process and drying treatment), the water repellent property of the surface 93b of the resist layer 93 (the resist pattern 93a) is not higher than the water repellent property of the surface 92a of the antireflection film 92 exposed from the resist layer 93 (the resist pattern 93a). This is mainly because the topcoat layer formed over the surface of the resist layer 93 has been dissolved and removed in the development solution. The magnitude relation of water repellent properties makes it possible to suppress or prevent defects as explained based on FIGS. 8 and 9.

Figure 51:
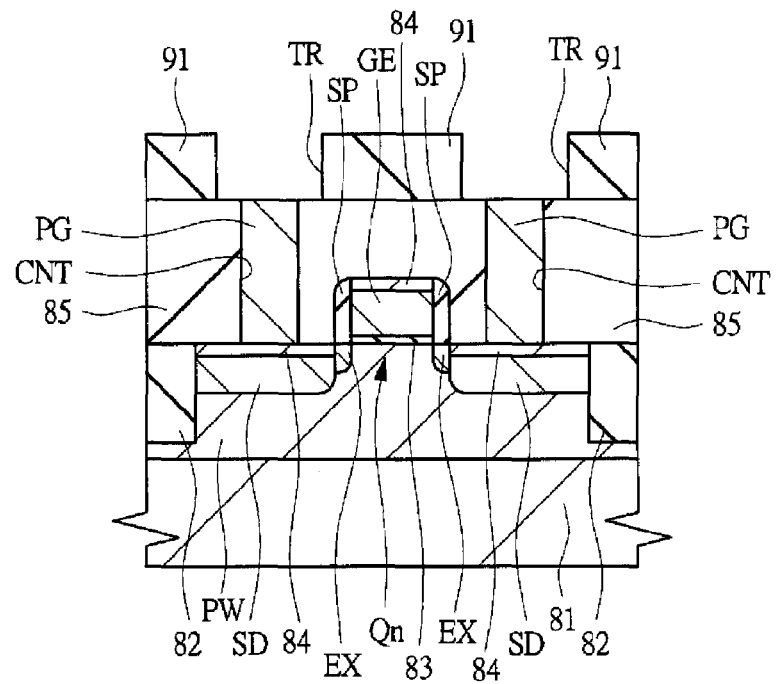
FIG. 51 is a principal part cross-sectional view in the manufacturing process of the semiconductor device following FIG. 50.

Next, in the same manner as Example 1, the antireflection film 92 is dry-etched using the resist pattern 93a as an etching mask, and, further, the insulating film 91 is dry-etched using the resist pattern 93a (or a stacked pattern of the resist pattern 93a and the antireflection film 92) as an etching mask to form, as shown in FIG. 51, the trench TR in the insulating film 91. After that, a remaining resist pattern 93a and antireflection film 92 are removed by ashing etc. The trench TR corresponds to the trench 47 in Examples 1 to 5, and the insulating film 91 corresponds to a combination of the semiconductor substrate 41, the silicon oxide film 42 and the silicon nitride film 43 in a part where the trench 47 is formed in Examples 1 to 5.

When applying Example 2 to the formation process of the trench TR, in place of the antireflection film 92 and the resist layer 93, in the same manner as Example 2, the lower layer film 51, the intermediate layer 52 and the resist layer 53 are formed over the insulating film 91, and, continuously, the same processes as the Example 2 are performed to form the trench TR corresponding to the trench 47. When applying Example 3 to the formation process of the trench TR, in place of the antireflection film 92 and the resist layer 93, in the same manner as Example 3, the lower layer film 51, the intermediate layer 52 and the resist layer 54 are formed over the insulating film 91, and, continuously, the same processes as the Example 3 are performed to form the trench TR corresponding to the trench 47. When applying Example 4 to the formation process of the trench TR, in place of the antireflection film 92 and the resist layer 93, in the same manner as Example 4, the lower layer film 51, the intermediate layer 55 and the resist layer 56 are formed over the insulating film 91, and, continuously, the same processes as the Example 4 are performed to form the trench TR corresponding to the trench 47. When applying Example to the formation process of the trench TR, in place of the antireflection film 86 and the resist layer 87, in the same manner as Example 5, the amorphous carbon layer 61, the organic antireflection film 62 and the resist layer 63 are formed over the insulating film 91, and, continuously, the same processes as the Example 5 are performed to form the trench TR corresponding to the trench 47.

Figure 52:
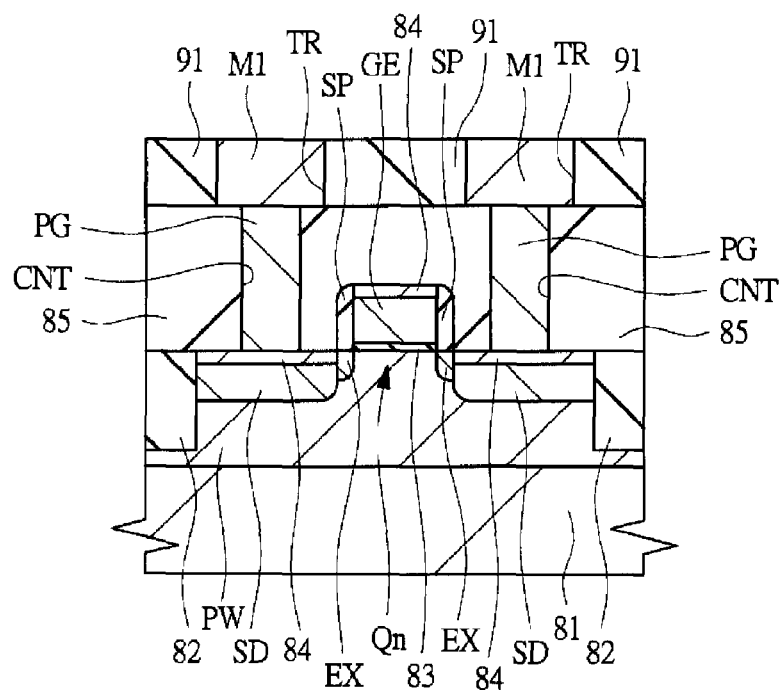
FIG. 52 is a principal part cross-sectional view in the manufacturing process of the semiconductor device following FIG. 51.

After forming the trench TR, over the insulating film 91 including over the bottom part and the side wall of the trench TR, a barrier conductor film (for example, a titanium nitride film, a tantalum film, a tantalum nitride film or the like) is formed. Subsequently, over the barrier conductor film a seed layer of copper is formed by a CVD method, a sputtering method or the like, and, further, a copper plated film is formed over the seed layer using an electrolytic plating method or the like to be embedded inside the wiring trench. Then, a main conductor film (the copper plated film and the seed layer) and the barrier conductor film in regions other than the trench TR are removed by a CMP method to form, as shown in FIG. 52, the first layer wiring M1 that is embedded in the trench TR and has copper as a main conductive material. For simplifying the drawing, in the wiring M1, the barrier conductor film, the seed layer and the copper plated film are shown integrally.

The wiring M1 is electrically connected with the gate electrode GE, the $n^+$-type semiconductor region SD or the like via the plug PG. After that, a second layer wiring is formed by a dual damascene method, but, here, the illustration and explanation thereof are omitted.

As described above, the semiconductor device of the embodiment is manufactured.

Hereinbefore, the invention accomplished by the present inventor has been explained based on embodiments thereof, but, needless to say, the present invention is not limited to afore-mentioned embodiments, but is changeable variously in the range that does not deviate from the purport thereof.

The present invention is effective when being applied to semiconductor devices and manufacturing technologies thereof.

What is claimed is:

1. A manufacturing method of a semiconductor device, comprising the steps of:
    (a) providing a semiconductor substrate;
    (b) forming a first material film over the semiconductor substrate;
    (c) forming a resist layer over the first material film;
    (d) subjecting the resist layer to liquid immersion exposure;
    (e) after the step (d), subjecting the resist layer to a development process;
    (f) after the step (e), subjecting the semiconductor substrate to a rinsing process with a rinse liquid;
    (g) after the step (f), rotating the semiconductor substrate to dry the semiconductor substrate; and
    (h) after the step (g), etching the first material film using the resist layer as an etching mask,
    wherein in the step (e), the first material film is exposed from a part from which the resist layer has been removed by the development process,
    when performing the step (f), a water repellent property of a surface of the first material film exposed from the resist layer is not lower than a water repellent property of the surface of the resist layer, and
    wherein the first material film is an organic film containing carbon as a main component or an organic film containing carbon and silicon as main components, and, in the step (b), a chemical solution for forming the first material film contains a fluororesin and the first material film in which the fluororesin has segregated over the surface is formed by applying the chemical solution to the semiconductor substrate.

2. The manufacturing method of a semiconductor device according to claim 1,
    wherein, when performing the step (g), the water repellent property of the surface of the first material film exposed from the resist layer is not lower than the water repellent property of the surface of the resist layer.

3. The manufacturing method of a semiconductor device according to claim 2,
    wherein, when denoting a contact angle of the rinse liquid with the surface of the resist layer by $\theta_1$ and a contact angle of the rinse liquid with the surface of the first material film exposed from the resist layer by $\theta_2$, the $\theta_2$ is not smaller than the $\theta_1$ when performing the step (f).

4. The manufacturing method of a semiconductor device according to claim 3,
    wherein the $\theta_2$ is greater than the $\theta_1$.

5. The manufacturing method of a semiconductor device according to claim 4,
    wherein, when denoting a contact angle of the rinse liquid with the surface of the resist layer by $\theta_3$ when performing the step (d), the $\theta_3$ is greater than the $\theta_1$.

6. The manufacturing method of a semiconductor device according to claim 5,
    wherein the $\theta_3$ is greater than the $\theta_2$.

7. The manufacturing method of a semiconductor device according to claim 6,
    wherein the $\theta_2$ is not greater than $80°$.

8. The manufacturing method of a semiconductor device according to claim 7,
    wherein the rinse liquid is pure water.

9. The manufacturing method of a semiconductor device according to claim 8,
    wherein, in the step (e), the water repellent property of the surface of the resist layer is lowered by contact with a development solution.

10. The manufacturing method of a semiconductor device according to claim 8, further comprising the step of (c1) after the step (c) and before the step (d), forming a topcoat layer over the surface of the resist layer,
    wherein, in the step (d), the topcoat layer constitutes the surface of the resist layer, and, in the step (e), the topcoat layer is removed from the surface of the resist layer by a development solution.

11. The manufacturing method of a semiconductor device according to claim 1,
    wherein the fluororesin is a resin obtained by polymerizing a monomer formed from a monomer represented by $$CH_2=C(X)COOYR_f \qquad \text{(Formula 1)}$$

where X in the Formula 1 is a hydrogen atom, a fluorine atom, a C1-20 linear or branched alkyl group, a $C_{1-20}$ linear or branched fluoroalkyl group or a $CFX_1X_2$ group, Y in the Formula 1 is a direct bond or a C1-10 divalent organic group not containing a fluorine atom, $R_f$ in the Formula 1 is a C4-6 linear or branched fluoroalkyl group, and the $X_1$ and $X_2$ are a hydrogen atom or a fluorine atom.

12. The manufacturing method of a semiconductor device according to claim 11,
    wherein the fluororesin contained in the first material film is insoluble in the development solution used in the step (e).

* * * * *